(12) United States Patent
Chu et al.

(10) Patent No.: US 9,831,387 B2
(45) Date of Patent: Nov. 28, 2017

(54) LIGHT ENGINE ARRAY

(71) Applicant: HIPHOTON CO., LTD., Hsinchu (TW)

(72) Inventors: Chen-Fu Chu, Hsinchu (TW); Chen-Hsien Chu, Hsinchu (TW)

(73) Assignee: Hiphoton Co., Ltd., Hsinchu (TW)

( * ) Notice: Subject to any disclaimer, the term of this patent is extended or adjusted under 35 U.S.C. 154(b) by 231 days.

(21) Appl. No.: 14/738,490

(22) Filed: Jun. 12, 2015

(65) Prior Publication Data

US 2015/0362165 A1 Dec. 17, 2015

Related U.S. Application Data

(60) Provisional application No. 62/012,281, filed on Jun. 14, 2014, provisional application No. 62/013,503, filed on Jun. 17, 2014, provisional application No. 62/077,329, filed on Nov. 10, 2014.

(51) Int. Cl.

| H01L 33/32 | (2010.01) |
|---|---|
| H01L 25/075 | (2006.01) |
| H01L 27/15 | (2006.01) |
| H01L 33/62 | (2010.01) |
| H01L 33/00 | (2010.01) |
| H01L 33/50 | (2010.01) |

(52) U.S. Cl.
CPC .......... *H01L 33/32* (2013.01); *H01L 25/0753* (2013.01); *H01L 27/156* (2013.01); *H01L 33/0079* (2013.01); *H01L 33/504* (2013.01); *H01L 33/508* (2013.01); *H01L 33/62* (2013.01); *H01L 2224/8192* (2013.01)

(58) Field of Classification Search
CPC ..... H01L 33/32; H01L 33/0079; H01L 33/62; H01L 51/5228
See application file for complete search history.

(56) References Cited

U.S. PATENT DOCUMENTS

| 2012/0049214 A1* | 3/2012 | Lowes | H01L 25/0753 257/89 |
| 2012/0146066 A1* | 6/2012 | Tischler | H01L 27/156 257/89 |
| 2013/0334547 A1* | 12/2013 | Yoneda | H01L 33/24 257/89 |
| 2014/0191204 A1* | 7/2014 | Jeong | H01L 27/322 257/40 |
| 2014/0339521 A1* | 11/2014 | Ozawa | H01L 51/5228 257/40 |

* cited by examiner

*Primary Examiner* — Phuc Dang

(74) *Attorney, Agent, or Firm* — Muncy, Geissler, Olds & Lowe, P.C.

(57) ABSTRACT

The invention discloses a light engine array comprises a multiple light engines arranged into an array, multiple dams located on a first surface of the light engines; and the dams combined a dam array.

21 Claims, 45 Drawing Sheets

Flip Chip Type

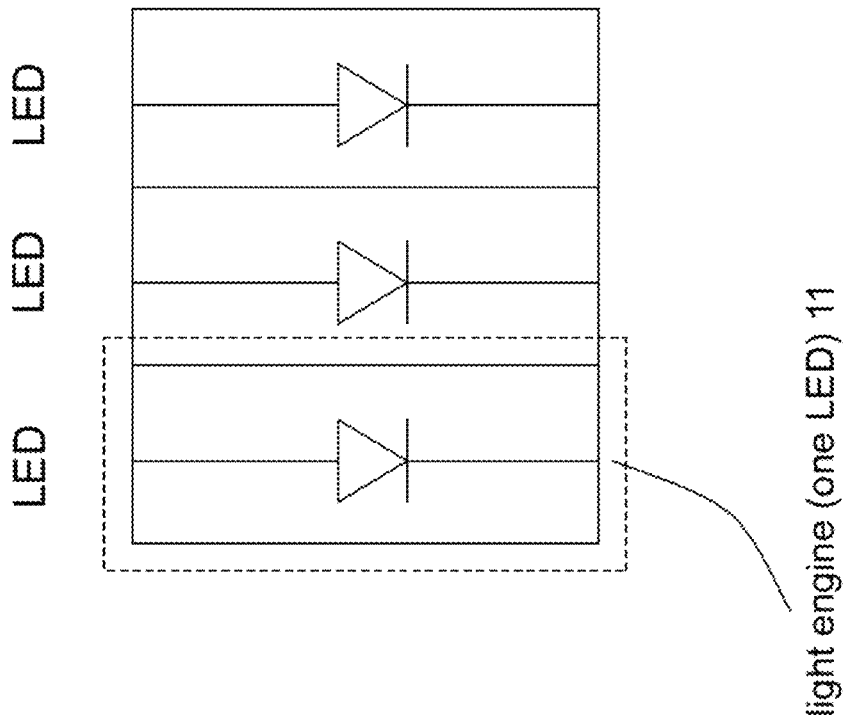

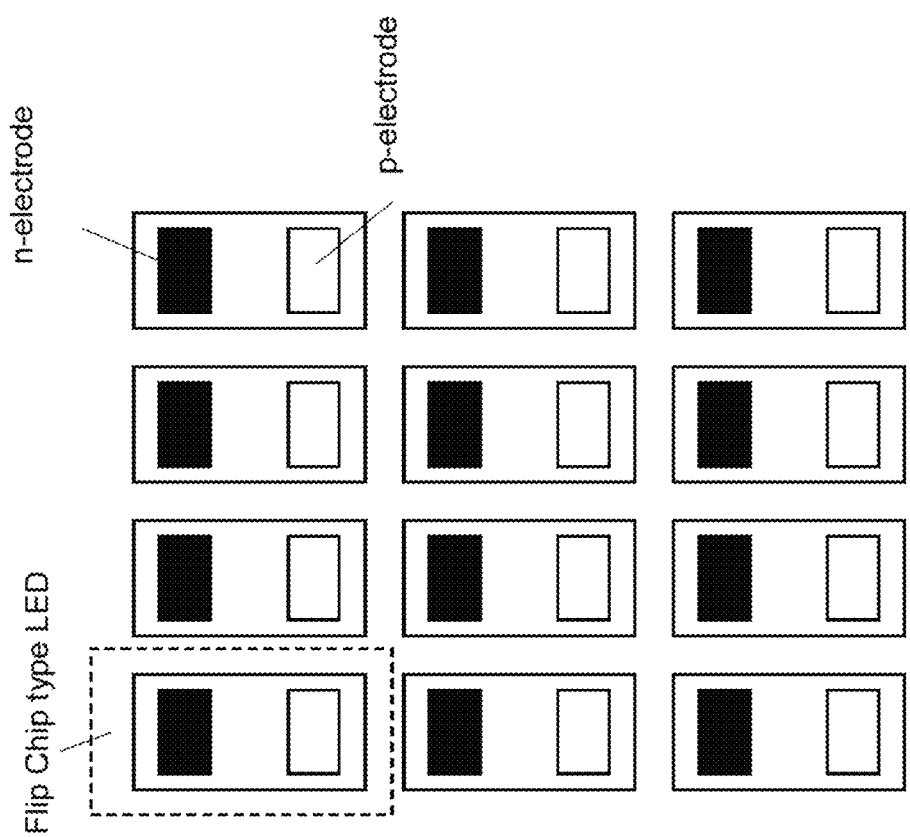

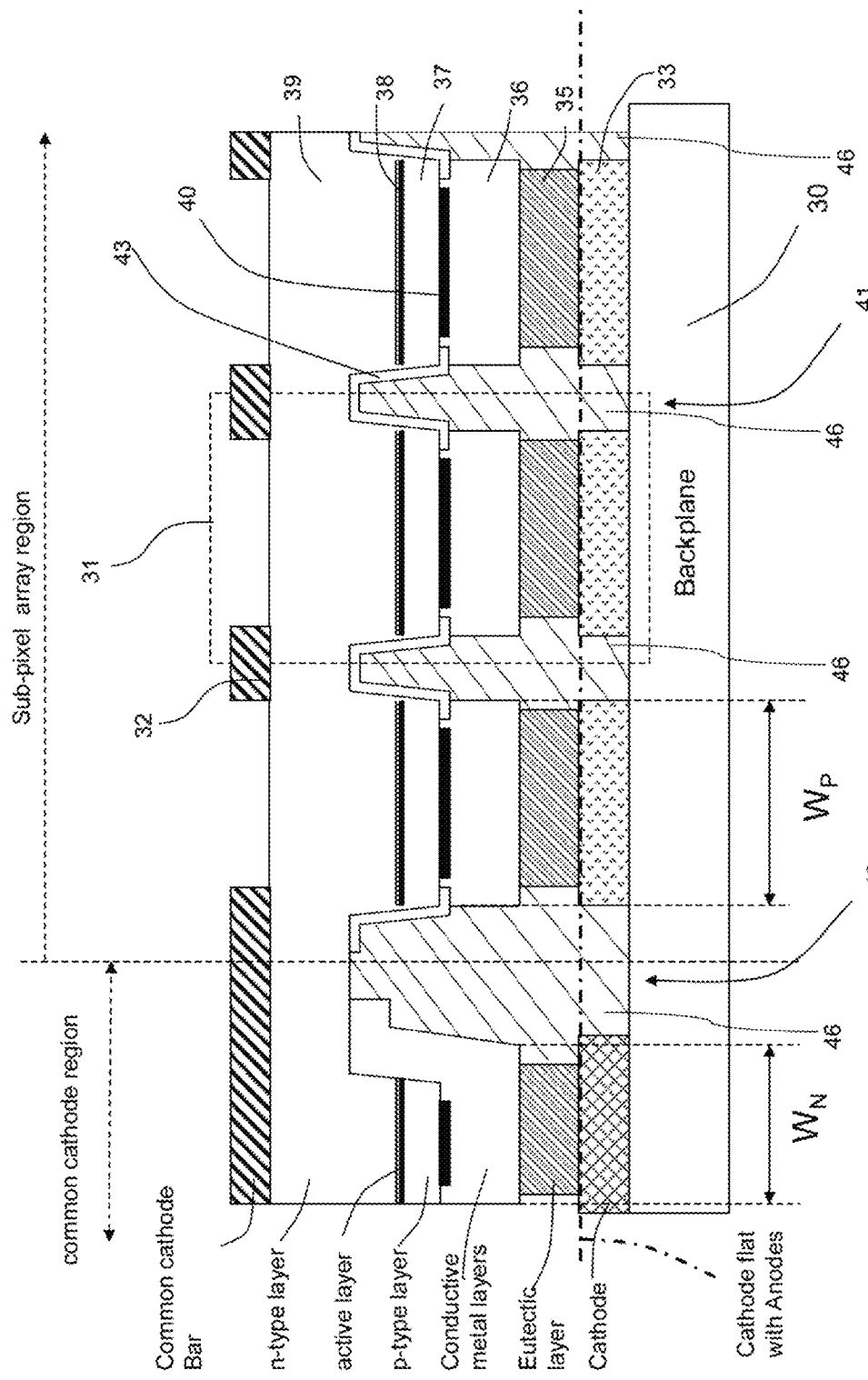

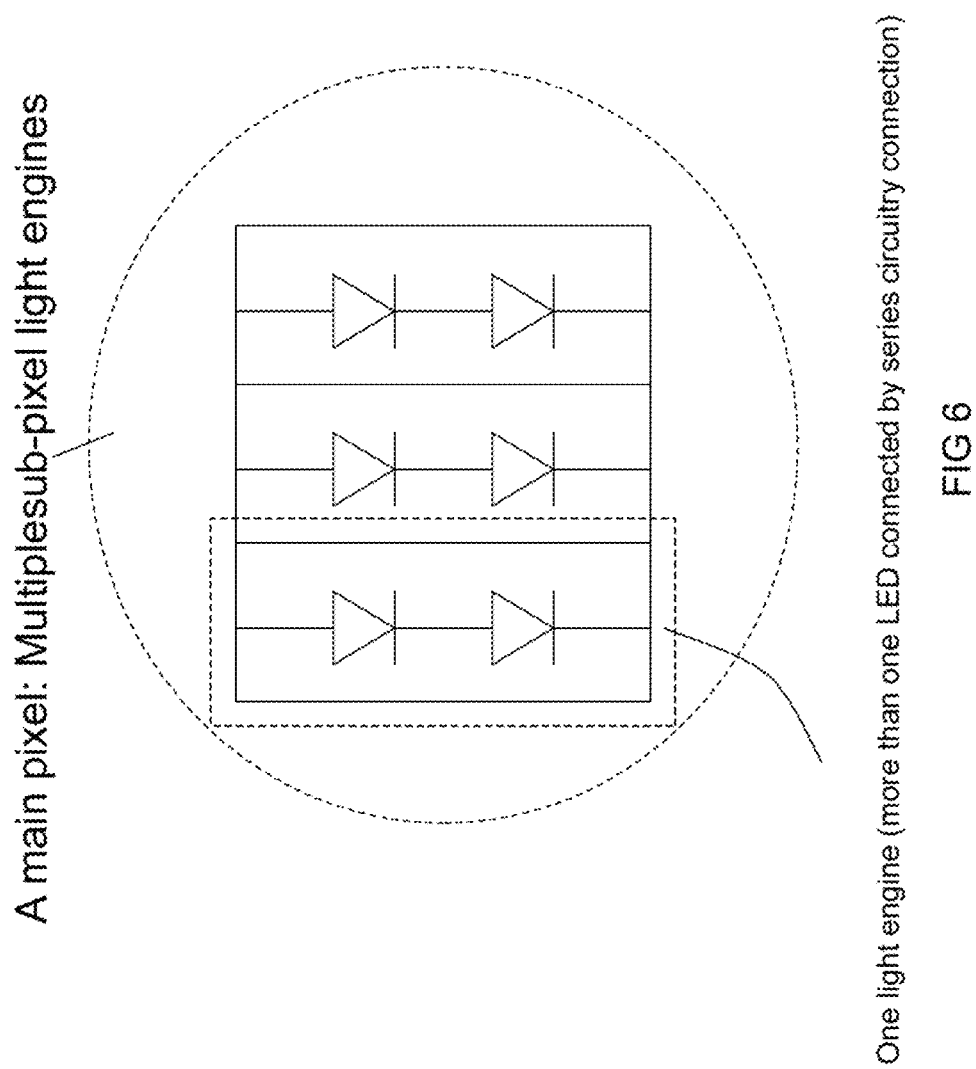

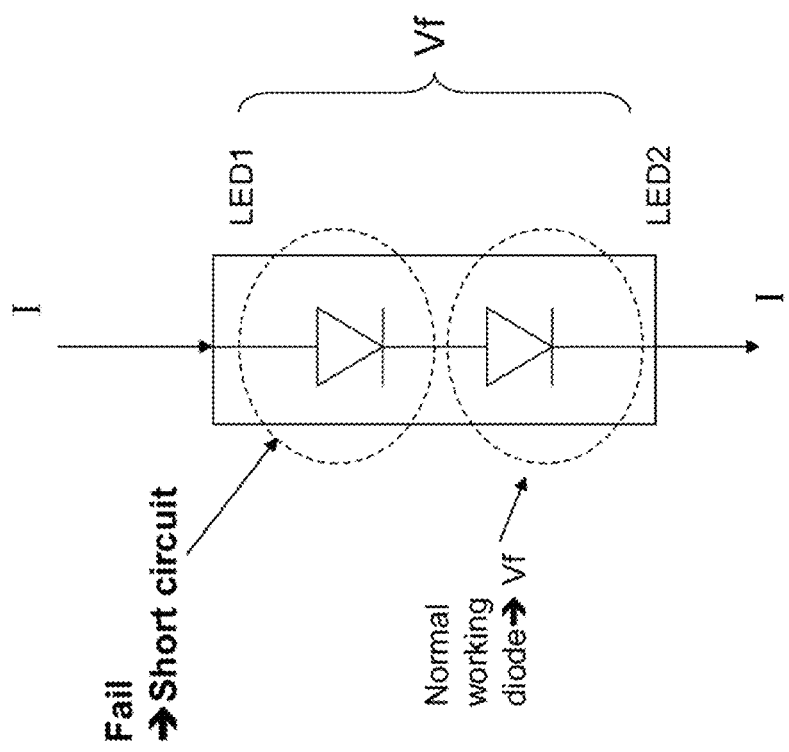

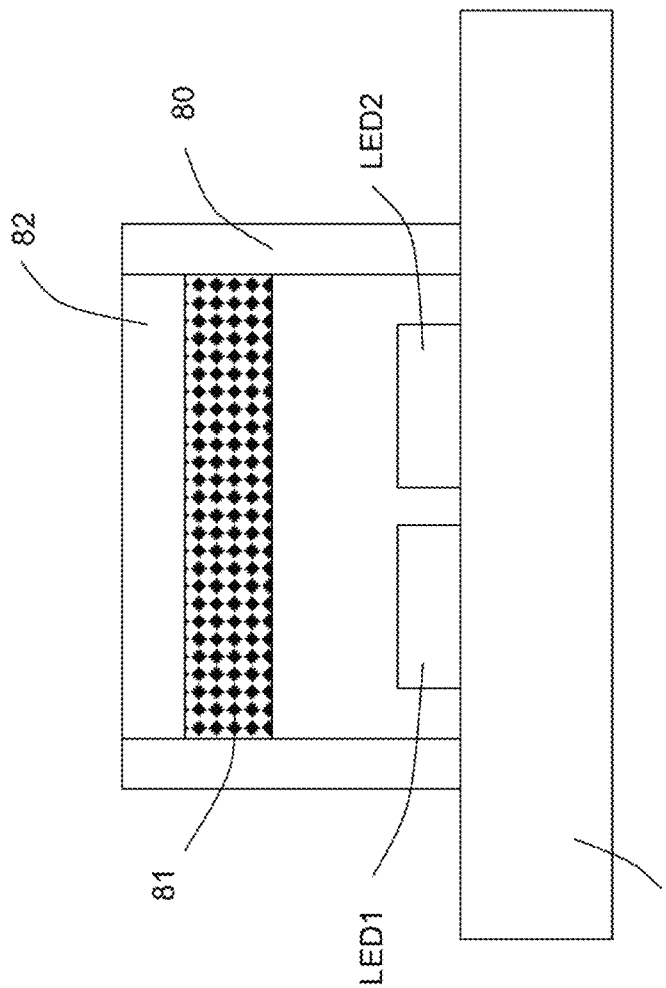

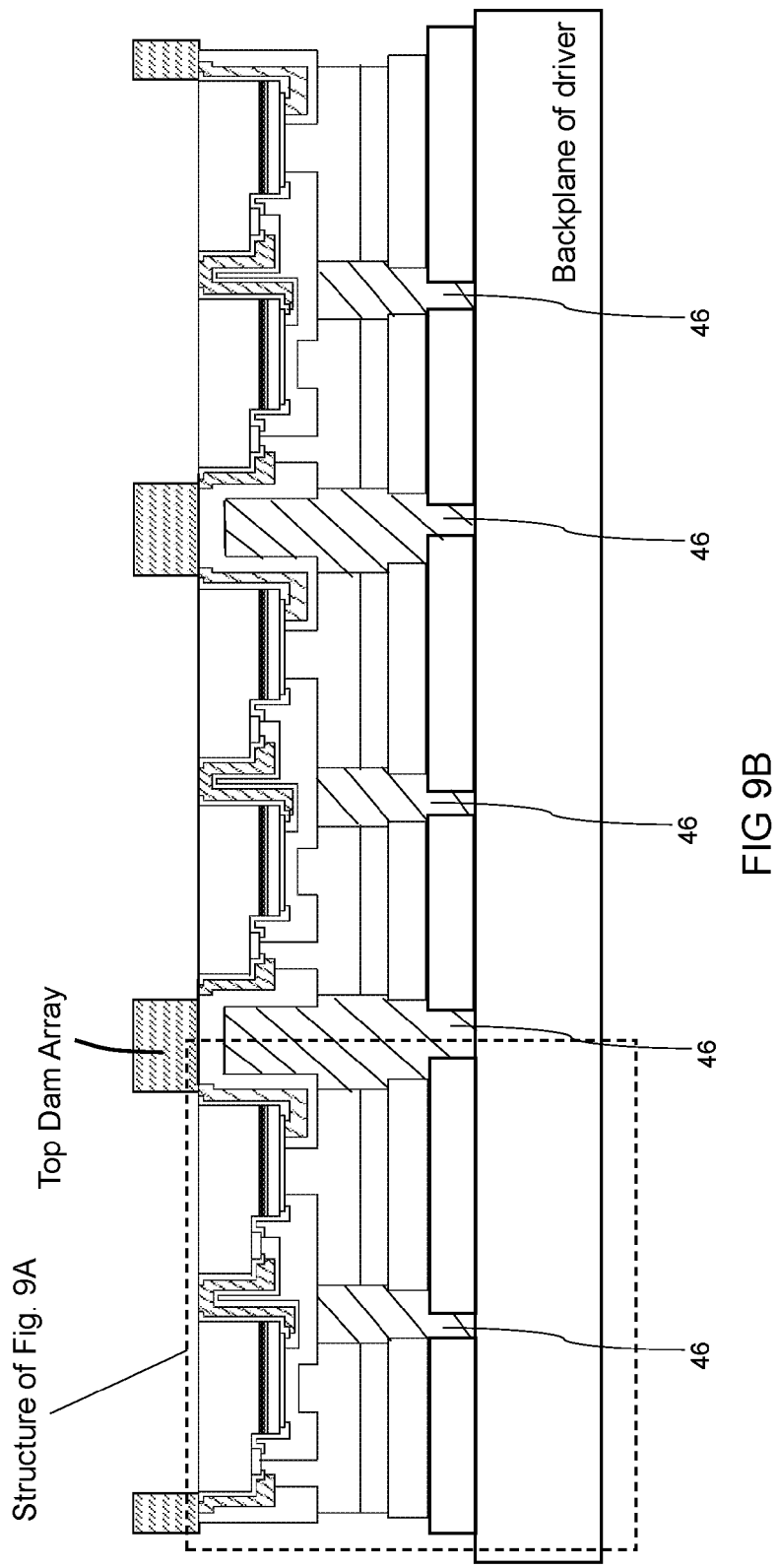

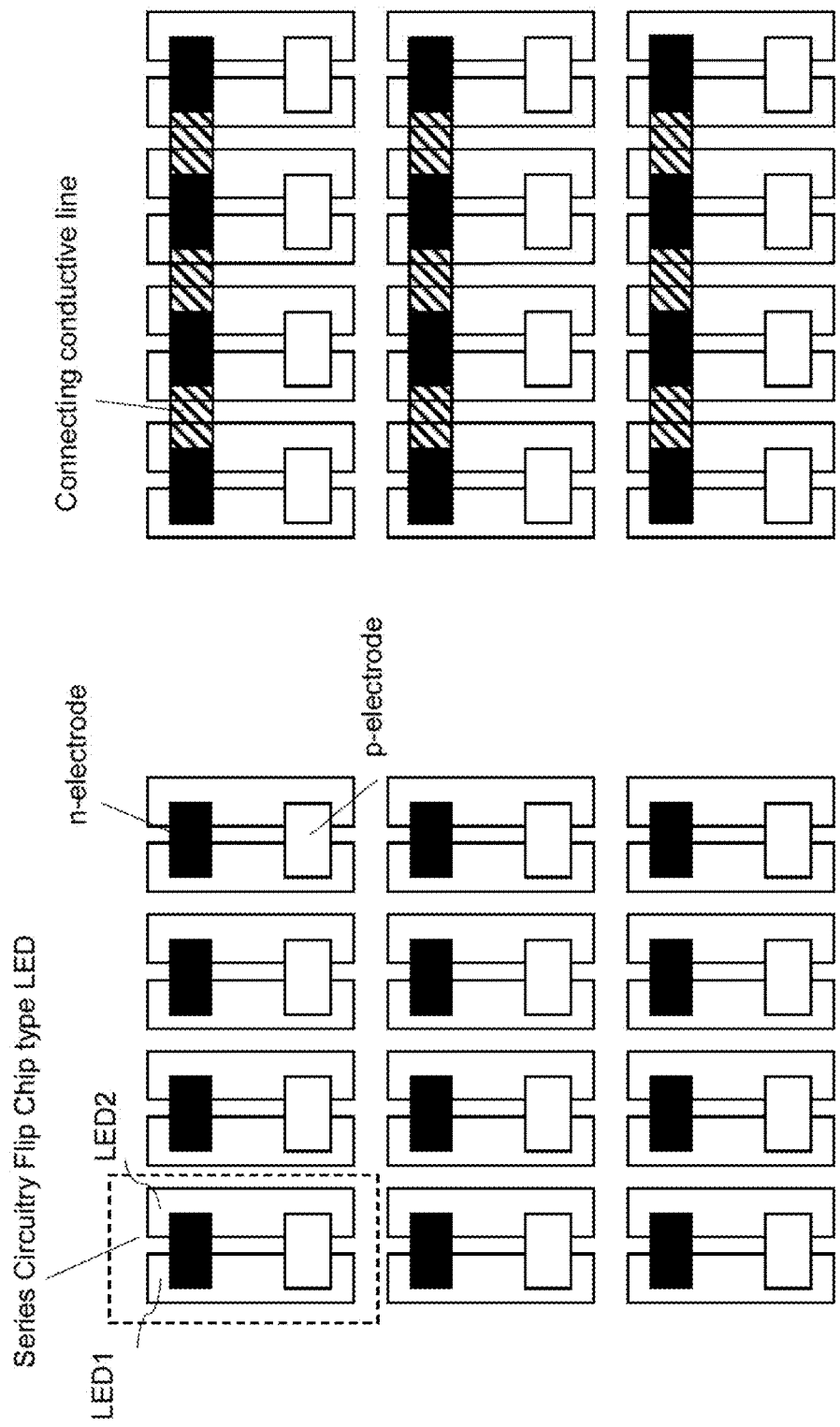

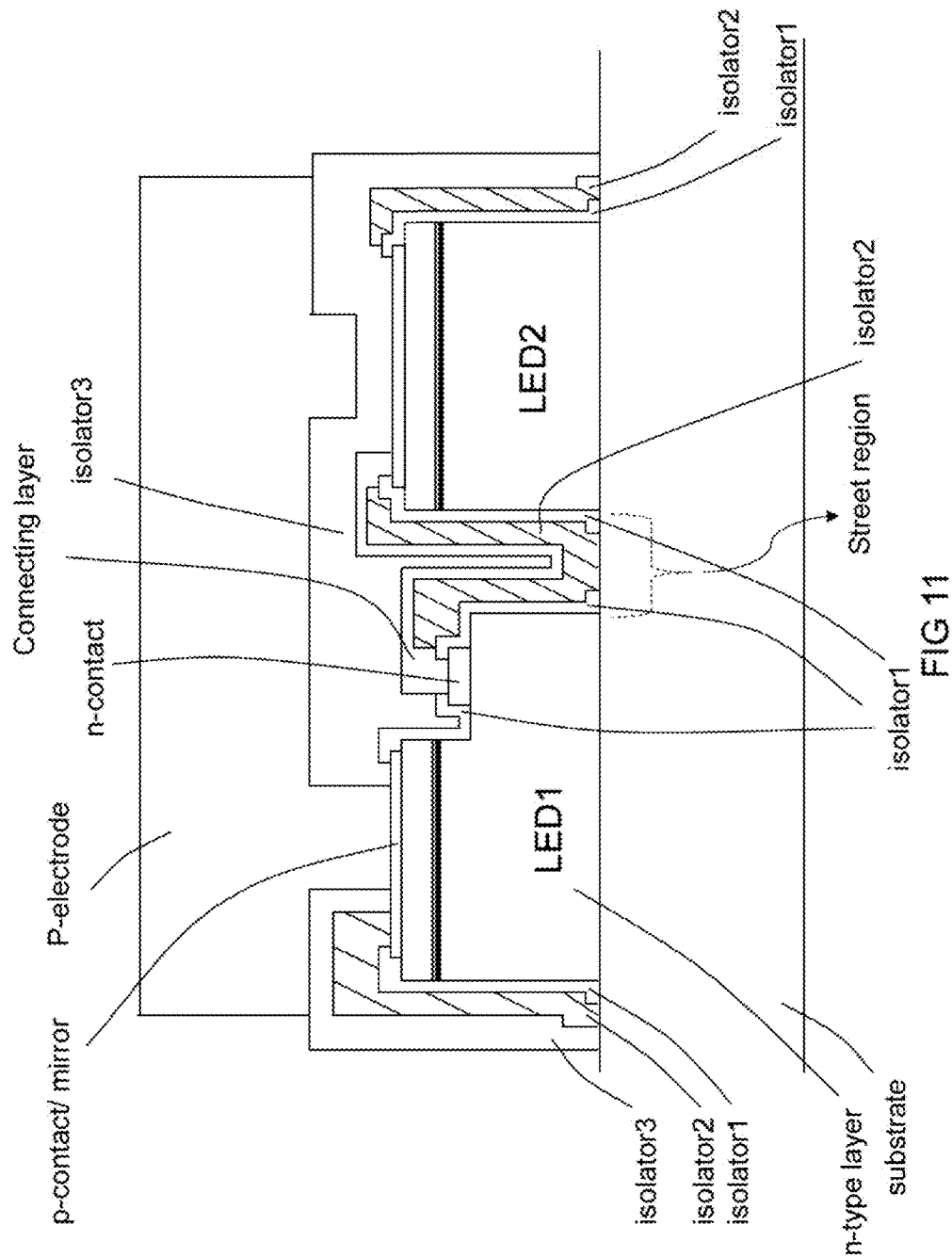

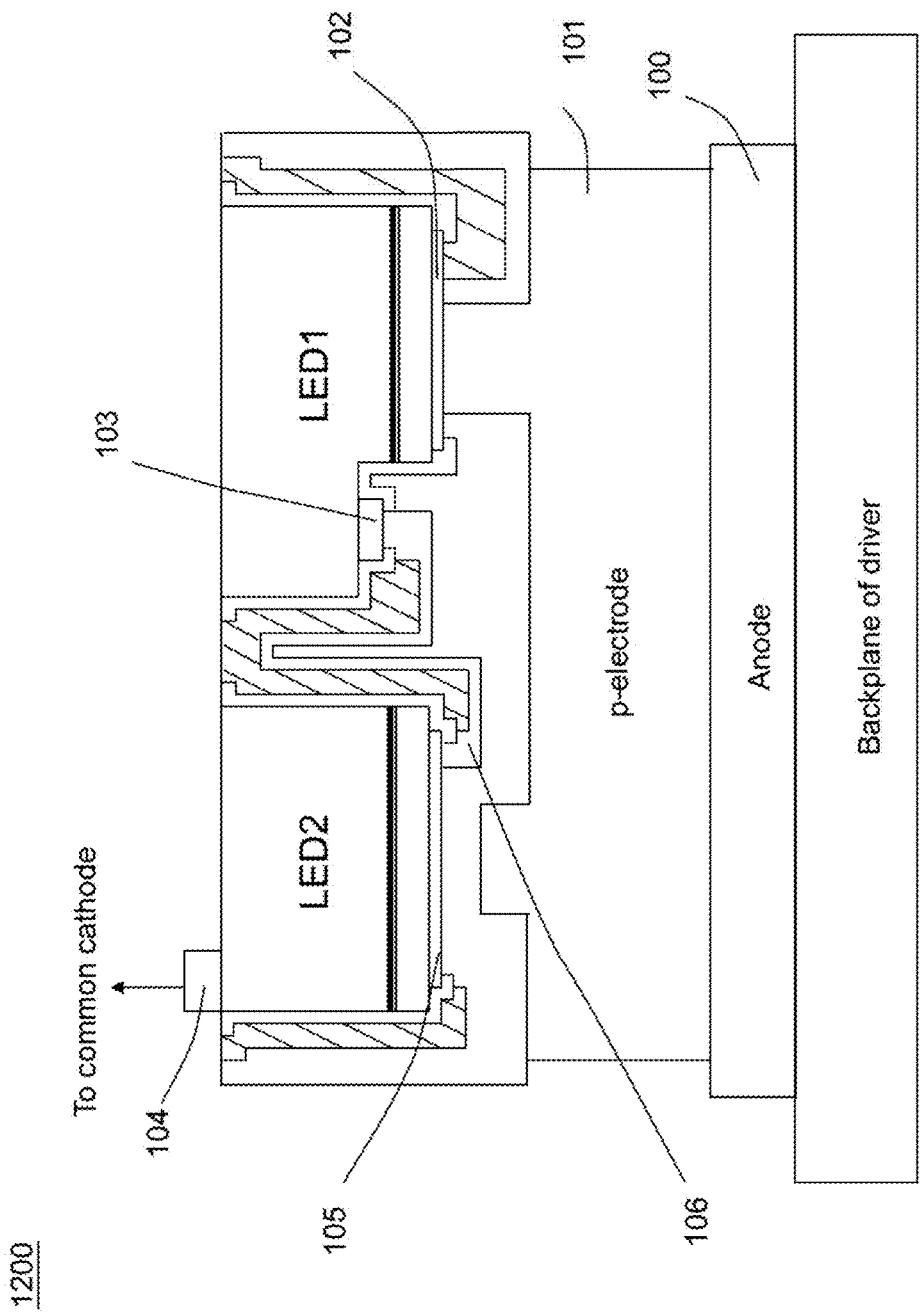

LIGHT ENGINE ARRAY

This application claims benefit of U.S. provisional applications No. 62/012,281 filed on Jun. 14, 2014, No. 62/013,503 filed on Jun. 17, 2014 and No. 62/077,329 filed on Nov. 10, 2014 under 35 U.S.C. §119(e); the entire contents of which are hereby incorporated by reference.

BACKGROUND OF THE INVENTION

Field of the Invention

This invention relates a light engine array in a full color display, data of optical communication, solid state lighting, and more particularly to a light engine array can be used in a vertical type LED or series circuitry flip chip type LED.

Related Art

There are many known display for electronic devices application. Most of the displays are fabricated by organic light emitting diode or liquid crystal display. For micro display, the organic light emitting diode as the micro display are current widely used in many wearable electronic devices such as head mounted display, smart watch, smart band, smart ring.

SUMMARY OF THE INVENTION

The invention discloses a light engine array comprises a multiple light engines arranged into an array; multiple dams located on a first surface of the light engines; and the dams combined a dam array.

BRIEF DESCRIPTION OF THE DRAWINGS

FIG. 1 is a main pixel light engine module containing three or more sub-pixel light engine. Each one sub-pixel light engine has one LED.

FIG. 2C is a backside view of the 3×4 flip chip type LED array. Each LED has individual p-electrode and n-electrode.

FIG. 3 is the vertical type LED as the light engine array having an active matrix on the backplane. The light engine array has a common cathode region and a sub-pixel array region.

FIG. 6 is a main pixel scheme diagram consists of three sub-pixel light engine.

FIG. 7B is one normal working micro LED.

FIG. 8 is one sub-pixel region having the sub-pixel light engine having two micro LEDs, the black matrix, the color conversion layer, and the color filter.

FIG. 9B is a schematic of structure of FIG. 9A.

FIG. 10A is a backside view of the 3×4 series circuitry flip chip type LED. Each series circuitry flip chip type LED has p-electrode and n-electrode.

FIG. 10B is an electrical conductive connection of the n-type electrodes of row LED in FIG. 10A by an electrical conductive line.

FIG. 11 is the vertical type micro nitride LED with two micro nitride LED has series connecting circuitry are fabricated on the epitaxial growth substrate.

FIG. 12 is the vertical type series connecting circuitry micro LED transferred to the vertical type backplane of driver. The epitaxial growth substrate is removed.

DETAILED DESCRIPTION OF THE INVENTION

Semiconductor Light Emitting Array Unit Module

The light engine array could be selected from different types of chip structure such as light emitting diodes (LED), resonant cavity type light emitting diode (RCLED), or vertical cavity surface emitted laser (VCSEL), or laser diode. The light engine composites the epitaxial structure could be formed by direct bandgap compound semiconductor light emitting diode. The emitting wavelength of semiconductor light emitting array unit could be determined by the energy bandgap of direct bandgap semiconductor. Different direct energy bandgap of the semiconductor light emitting material could be selected from III-V compound semiconductor such as $In_xGa_{1-x}N$, GaN, $Al_xGa_{1-x}N$, $In_xGa_{1-x}As$, InGaP, GaAs, GaAsP, InP, $(Al_xGa_{1-x})In_{1-y}P$, GaP.

FIG. 1 shows a main pixel light engine module containing three or more sub-pixel light engine 11. Each one sub-pixel light engine 11 has one LED in light engine array 100. Normally, a main pixel has three sub-pixels: Red (R), Blue (B), and Green (G) to display full color images. In some particular, a main pixel could have R, G, B, and W (white) sub-pixels, the additional white sub-pixel could be designed in a main pixel for saving power consumption purpose. In this invention, the sub-pixel light engine is formed by a same semiconductor light emitting direct bandgap material and that could electrical driving for emissive green, blue or shorter wavelength spectrum. The short wavelength spectrum light of the sub-pixel light engine convert the light to different longer wavelength spectrum light by using a color converting module. The semiconductor light emitting module includes different LED array unit structure comprising a flip chip type LED; a common-cathode flip chip type LED; a vertical type LED; a series circuitry flip chip type LED; a common-cathode series circuitry flip chip type LED; a series circuitry vertical type LED; a redundancy circuitry flip chip type LED; a redundancy circuitry vertical type LED.

Flip Chip Type LED

Figure 2A:
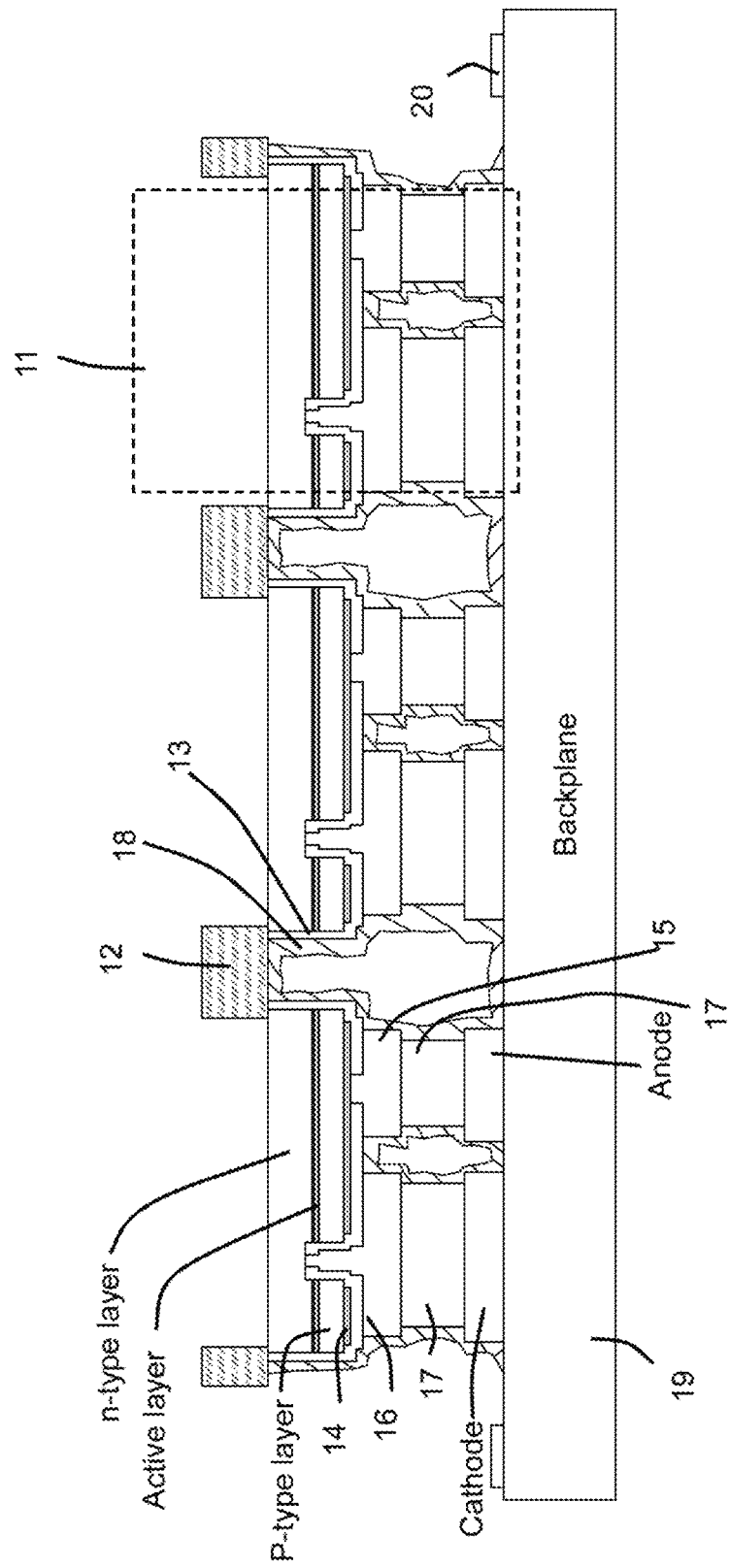
FIG. 2A is a schematic of cross section diagram of the flip chip type LED as the light engine array includes structure of direct bandgap semiconductor epi layers, isolator, reflector, p-electrode, and n-electrode, eutectic (solder) layer, backplane electrodes, polymer, and the backplane. The top dam array formed on the street region of light engine array.
Figure 2B:
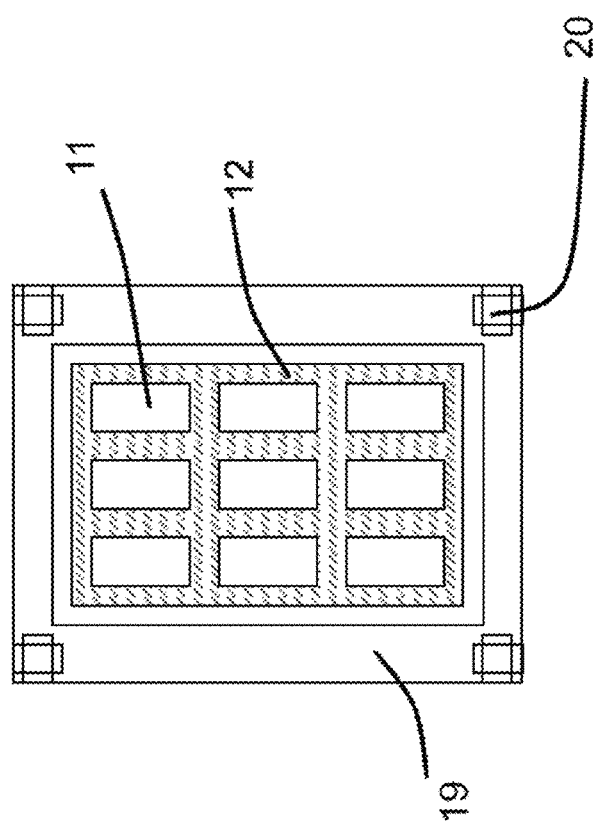
FIG. 2B is a top view schematic diagram of FIG. 2A.

FIG. 2A shows the flip chip type LED as the light engine array includes structure of direct bandgap semiconductor epitaxy layers, isolator 13, reflector 14, p-electrode 15, and n-electrode 16, eutectic (solder) layer 17, backplane electrodes, polymer 18, and the backplane 19. FIG. 2B is a top view schematic diagram of FIG. 2A. The top dam array 12 (also called the second top dam array) could be formed on light engine 11 in the street region. In another option, the above light engine array 100 could be performed as mono color display. The top dam array could be performed as a black matrix to distinguish and separate each sub-pixel light engine 11. The top dam array 12 could also be a structure enhancement frame to protect the light engine 11. In some particular application such as soft flexible mono display, the backplane material could be selected as flexible material such as polyimide, plastics. By connecting the top dam array 12 with the polymer in the street. The edge of each light engine 12 structure could be protected by the frame of top dam array 12.

In the four corners of the light engine array 100, an alignment-key 20 could be designed and deposited on the backplane 19 as the alignment-key 20 of the light engine array 100. The backplane alignment-key could be aligned with the alignment-key 20 of the color spectrum conversion module.

Common-Cathode Flip Chip Type LED

Figure 2D:
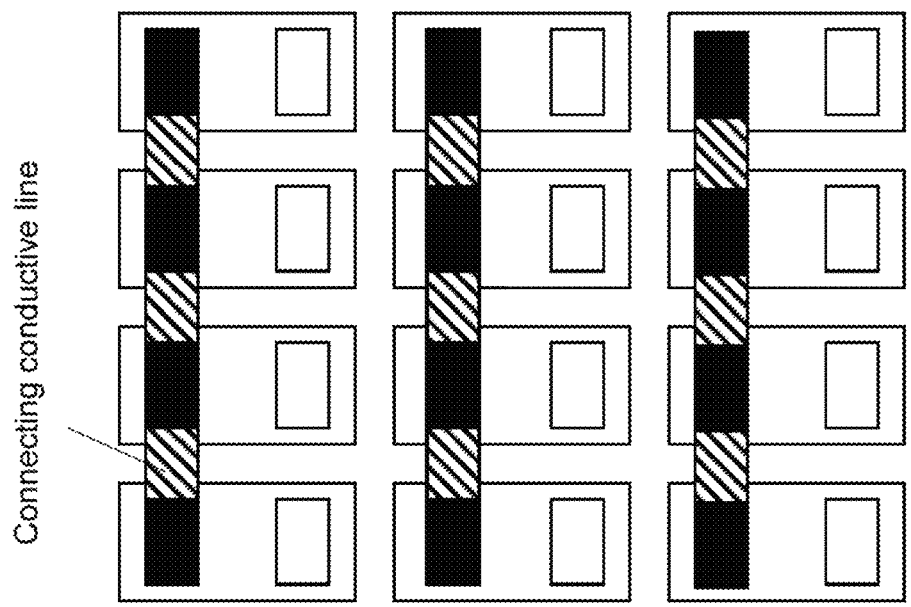
FIG. 2D is the row n-electrodes of FIG. 2A electrical conductive connection together by a connecting conductive line.

In another one embodiment, the n-type electrode of FIG. 2A structure could be designed to form an electrical conductive connection in each column of one array. The purpose of the electrical conductive connection is to form a row common-cathode array to simplify the backplane circuitry design. FIG. 2C shows a backside view of the 3×4 flip chip type light engine array. Each light engine has individual p-electrode and n-electrode. FIG. 2D illustrates all the row n-electrodes of FIG. 2C is conductive connection together by a connecting conductive line.

Vertical Type LED

FIG. 3 shows a light engine array 300 on the backplane 30. Light engine array 300 comprises: multiple light engines 31 arranged into an array, multiple dams 32 located on a first surface of the light engines 31; and the dams 32 combined a dam array.

The common cathode region has a same height level flat with the anode 33 array. The light engine array 300 has a common cathode region. For the cathode part, a common cathode region could be formed to provide the whole n-type of the light engine array 300 conductive connecting to the common cathode. For the anode 33 parts, a sub-pixel array region could be formed to provide an individual light engine 31 as a sub-pixel light engine 11 controlling by each individual anode array unit controller on the backplane 30.

In this embodiment, each light engine 31 comprises: an anode 33 located on a backplane 30; an eutectic layer 35 located on the anode 33; a conductive metal layer 36 located on a same height level; a p-type layer 37 located on the conductive metal layer 36; an active layer 38 located on the p-type layer 37; and a n-type layer 39 located on the active layer 38. Wherein, the conductive metal layer 36 located on the eutectic layer 35; and multiple anodes 33 combines an anode array.

The common cathode region could be arranged to the side of the edge of the light engine 31. In some particular, for uniform current spreading purpose, the common cathode region could be selected to form on the double edge-sides of the light engine array 300, or to form on the whole edge-sides of the light engine array 300.

The sub-pixel array region could be arranged inside the light engine array 300 to display images. The light engine 31 could be controlled to light up only in the sub-pixel array region to display a mono-color image. The light engine array 300 in the sub-pixel array region could be connected with a color conversion module to display full color images.

The light engine array 300 has light emitting diode (LED) epitaxial structure containing n-type layer 39, active layer 38, and p-type layer 37. In the sub-pixel array region, a portion of the reflection layer 40 could be patterning and deposited on the bottom of the p-type layer 37 and having a sidewall of reflection layer 40. Except the portion of the reflection layer 40, the p-type layer 37, the active layer 38, and a portion of the n-type layer 39 could be removed/etched to expose a mesa of n-type layer 39. The exposed n-type mesa layer region could be defined as a street region 41. In the common cathode region, the same reflection layer 40 could be simultaneously deposited on the bottom of a portion of the p-type layer 37 to keep the same height level with the sub-pixel region. Except the reflection layers 40, a trench region could be formed by removing the p-type layer 37, the active layer 38, and a portion of the n-type layer 39. The trench region size 42 could be larger than that of the street region 41 size. Please note that the remained n-type layer in the street region 41 and in the trench region 42 could be formed as a continuous n-electrode conductive layer connecting the common cathode region and the sub-pixel array region. The common cathode for the all of the sub-pixel units in the sub-pixel array region could be formed by connecting the continuous conductive n-type layer 39. In addition, a top flat surface could be formed by the remained continuous n-type layer 39 on the top of the light engine array 300. The top flat surface could be help to simplify the further process steps such as photolithography patterning steps. For the sub-pixel array region, the street region 41 size could be formed to be the same size to separate/isolate each light engine 31 (or called sub-pixel light engine).

An isolation layer 43 could be formed and deposited only in the sub-pixel array region. The isolation layer 43 could be patterned depositing on portion of the bottom p-type layer 37. The isolation layer 43 could be also deposited simultaneously in the street region 41 to cover on the sidewall of the etched p-type layer 37, cover on the sidewall of the etched active layer 38, cover on the sidewall of the etched n-type layer 39, and cover on the exposed n-type layer 39 in the street region 41.

For the semiconductor light emitting as a light engine 31, a conductive metal layers 36 as a p-type electrode metal layers for the light engine 31 could be patterned and forming to cover the reflection layer 40, a portion of the p-type layer 37, and a portion of isolation layer 43 in the sub-pixel array region. In the common cathode region, the conductive metal layers 36 could be patterned simultaneously and forming to the reflection layers 40, the trench sidewall and a portion of exposed n-type layer 39 in the trench region 42. The conductive metal layers 36 as a continuous metal layer could be deposited on the etched p-type layer 37 sidewall, the etched active layer 38 sidewall, the portion etched n-type layer 39 sidewall, and on the portion of exposed n-type layer 39 to form a short circuit structure at the trench region 42. The conductive metal layers 36 in the common cathode region has a width of $W_N$ represent the bar width of common cathode. The conductive metal layers 36 in the sub-pixel region have a width of $W_P$ represent the p-type electrode contact metal layers size. The width of $W_N$ could be designed to be wider than that of the $W_P$. The width of $W_N$ could be greater than 1 μm to provide enough contact area for further process steps. The width of $W_P$ could be scaled from sub-micro to thousand micro meters. The thickness of the conductive metal layers 36 could be formed greater than one third of the epitaxial thickness. After forming the conductive metal layers 36, the height of the conductive metal layers 36 both in common cathode region and the sub-pixel array region could be kept at the same height level.

A eutectic (bonding) layer 35 could be formed in the sub-pixel array region and the common cathode region underneath the conductive metal layers 36. For the sub-pixel array region, the portion of p-type contact electrodes of sub-pixel light engine 31 could be connected with each individually driving anode array unit through eutectic/soldering bonding. Each driving anode 33 could be controlled individually to control the sub-pixel light engine ON/OFF and the operation current size. For the common cathode region, the portion of metal layers within the size of $W_N$ could be connected to the common cathode bar by eutectic/soldering bonding. After forming the eutectic (bonding) layers 35, the height of the eutectic (bonding) layers 35 both in common cathode region and the sub-pixel array region could be kept at the same height level. The backplane cathode and the backplane anode 33 are flat at the same level. The light engine array 300 could be bonded by eutectic (bonding) layers 35 at the same height to the backplane module.

Now referring to FIG. 3, a dam array could be formed on top surface of the n-type layer 39. For the sub-pixel array region, the dam array could be patterned with the street region 41 and trench region 42 to form a mesh on the top n-type layer 39 surface. The dam array could be formed to conduct the electrical cathode uniform spreading to the n-type layer 39. For the common cathode region, the short circuit structure could be formed by the conductive metal layers 36. The cathode property could be transfer through the short circuit structure and then passing through the remaining n-type layer 39 to the top n-type layer 39 surface. The cathode property could be distributed to the entire n-type layer 39 by the dam array. The electrical properties of cathode could be transferred conductive to the dam array and spreading to the n-type layer 39. Please note that the dam array could be only formed as a mesh aligning to the street region 41 and the trench region 42.

A polymer 46 could be selective to fill with or cover the trench region 42 and street region 41. The polymer could enhance the array 300 more robust for additional process. The polymer fill in the street region could be purposed to be as a function of another black matrix array underneath of the n-type layer 39 to absorb/stop the light escaping from the edge of each light engine 31 and prevent the crosstalk effect. The polymer underneath of the exposed n-type layer 39 in the street region 41 and in the trench region 42 could connect all individual sub-pixel light engine 31 together forming a robust structure for the semiconductor light emitting array unit module or light engine array.

Figure 4:
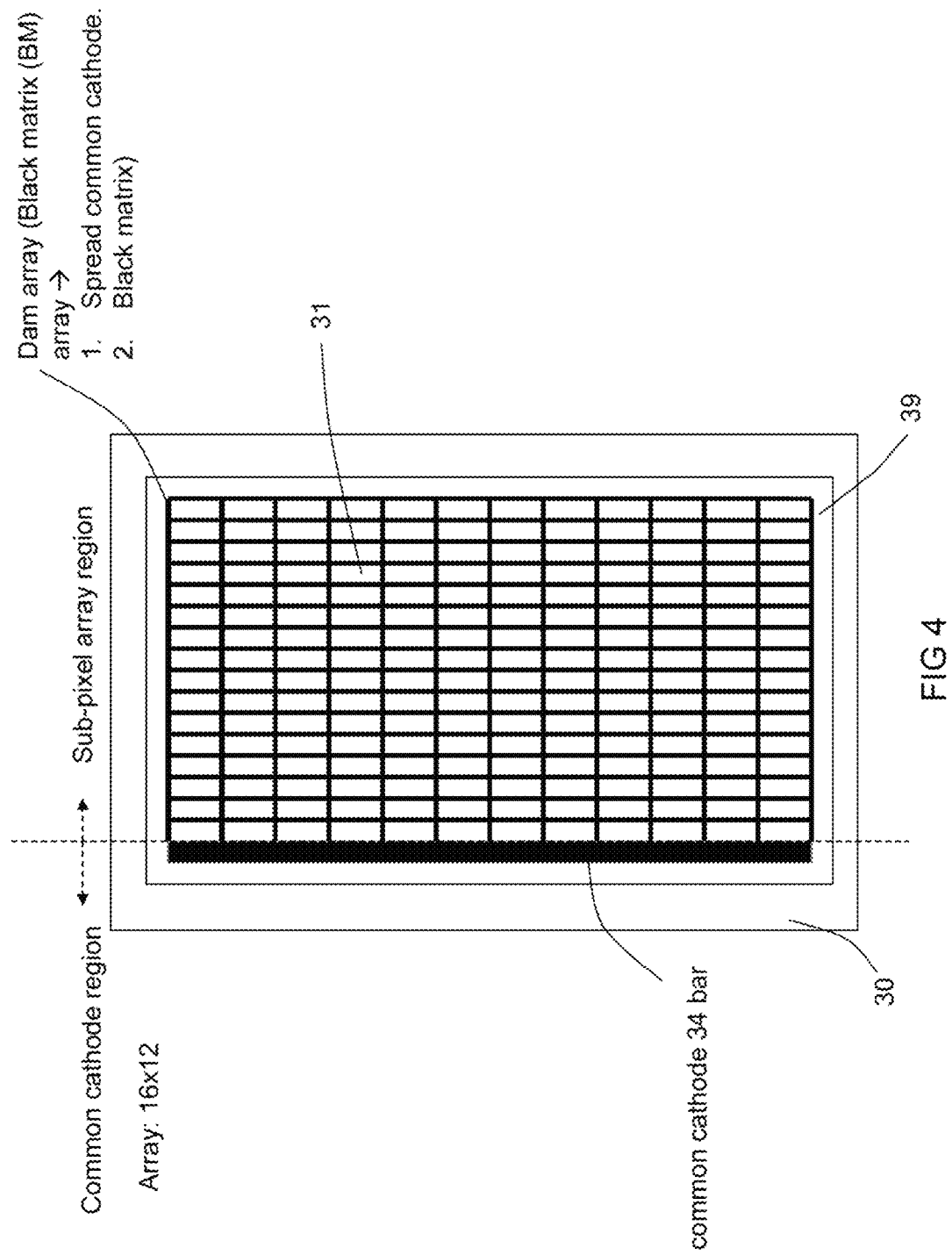
FIG. 4 is an example of 16×12 display matrix, showing the dam array could be deposited on semiconductor n-type layer top surface to form a mesh patterning in the sub-pixel array region, and a cathode bar in the common cathode region.

FIG. 4 shows an example of 16×12 display matrix array. On top of the n-type layer 39, the dam array could be deposited to form a mesh patterning in the sub-pixel array region, and a common cathode bar in the common cathode region.

In the sub-pixel region, the dam array could play a role of black matrix (BM) array function for the light engine array 300. The dam array could be formed and aligned with the bottom street of light engine 31. The dam array as the black matrix array could help to stop the light escaping to the neighbor adjacent sub-pixel unit region to prevent the crosstalk effect. The dam array as the black matrix array could be patterned through depositing metal layers. The dam array of black matrix array could be patterned by plating thick metal layers. In addition, the dam array forming in the sub-pixel region could also play another role of uniform spreading common cathode mesh to the entire n-type layer 39 of light engine 31.

In the common cathode region, the dam array could be formed as a conductive bar with a wider width than that of the width of mesh. The wider dam as a conductive bar could be formed in the edge side of the top surface of n-type layer 39. The wider dam as a conductive bar could be high speed conductive to deliver the cathode current property to the connecting mesh. The connecting mesh could link the n-electrode of the entire sub-pixel light engine to form a common cathode structure for the semiconductor light emitting array munit module. FIG. 4 only shows the dam 32 as a conductive bar formed on the edge side of top surface of n-type layer 39. In other embodiments not shown in here, the dam as a conductive bar could be selected to form on the double edge sides of the n-type layer 39 or on the four edge sides of the n-type layer 39. The dam array as a black matrix could be deposited on top n-type layer surface to form an ohmic contact metallization layers to reduce the resistance for uniform cathode distribution.

Figure 5:
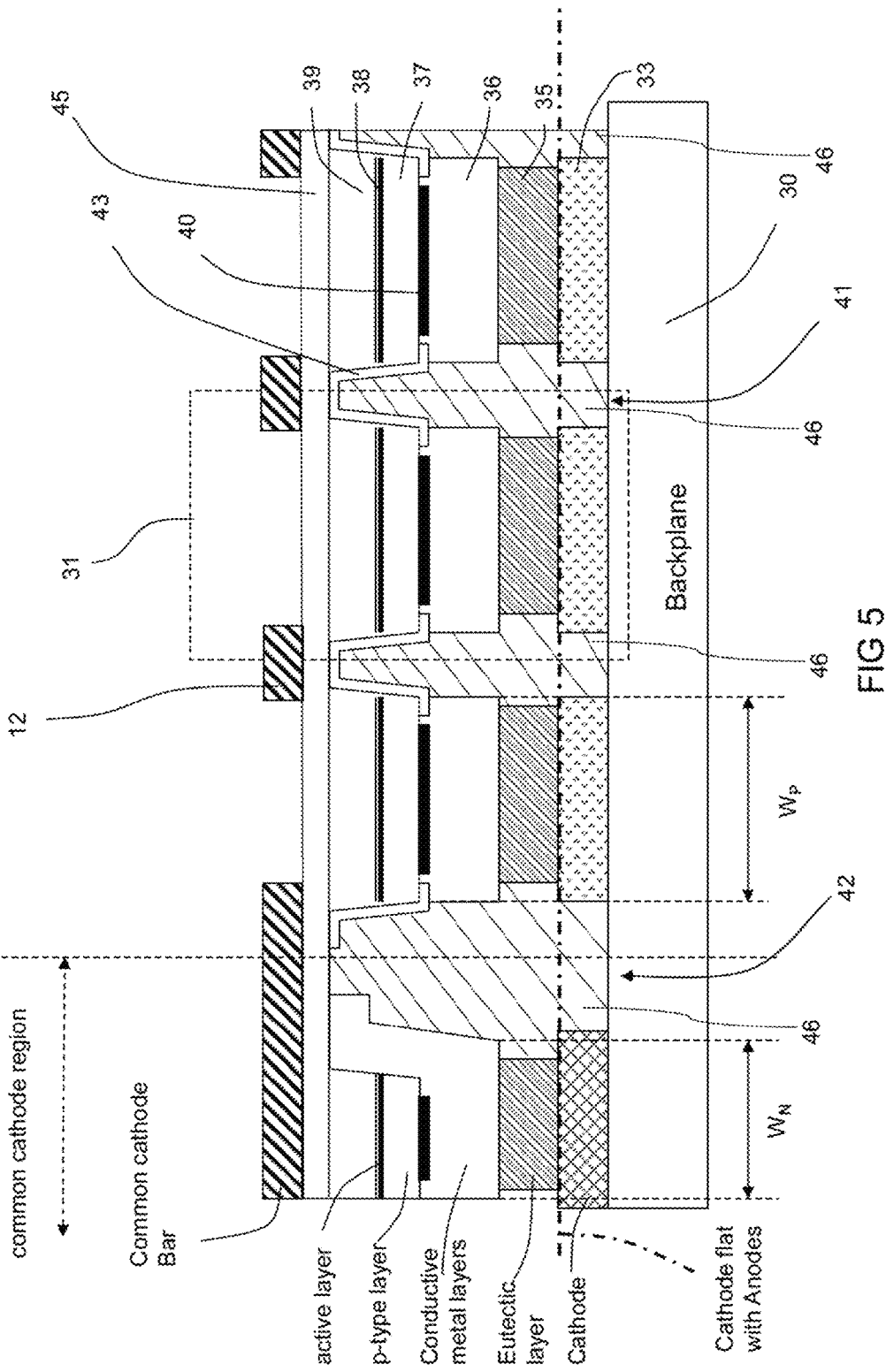
FIG. 5 is similar to FIG. 3, the op n-type layer is proportion removed to expose the street isolation layer. Additional transparent contact layer as the common cathode layer forming on top of the n-type layer, and the dam array as a black matrix on top of the TCL.

In another one embodiment, FIG. 5 shows the top n-type layer and the polymer 46 are proportion removed to expose the street isolation layer and the polymer 46. In the light engine array 500, additional transparent contact layer 45 (TCL) could be formed on top of the n-type layer 39 to be the common cathode layer, and the dam array as a black matrix could be deposited on top of the TCL 45.

The reflector underneath the p-type semiconductor layer could be formed by high reflectivity metal layers such as Ni/Ag, Ni/Al, Ag alloyed, and Al alloyed metallization. In some particular purpose, the reflection layer 40 could be formed by a semi-transparent contact such as ITO to make the contact to p-type semiconductor layer and spread the current. After the semi-transparent contact forming, a distributed Bragg reflector (DBR) layers could be deposited to reflect the high compact and directional light beam. For the high gamut of display requirement, the emitting light spectrum width of sub-pixel light engine could be narrowed by the DBR structure. The conductive metal layers 36 as electrodes could be deposited underneath of the light engine by selecting metal layers. The conductive metal layers 36 could be formed by selecting the metals from Ni, Cu, Al, Au, Ti, and its alloy. A eutectic metal layer 35 or solder metal layers could be deposited underneath of the electrodes of the light engine. The eutectic (bonding) layers 36 as a connecting layer could be selected from AuSn, CuSn, Sn, CuSn Ag, Indium, SnBi, or any suitable soldering metallization.

The backplane 30 could be hard material such as glass, sapphire, Si wafer, or any suitable semiconductor wafer. The backplane 30 could be flexible material such as polyimide, plastic, thin glass. The data-lines and scan-lines of the backplane could be formned by active matrix (AM) driving mode to control the images display as commonly used display backplanes. A cathodes bar could be formed on the edge side of the backplane for connecting the common n-type electrode cathode bar of the light engine array 500. An anode array unit could be formed on the backplane 30 into the sub-pixel region to provide the anode array units individually connecting to the p-type electrode of the light engine 31. Please note that, the light engine 31 could be the sub-pixel light engine array unit. Each sub-pixel light engine array unit could be switched on and off by the anode array unit of the backplane 30. For common cathode module, the scan-lines and data-lines could be integrated to the backplane underneath of the anode array unit. The scan-line could be integrated underneath of the anode array unit to command the sub-pixel light engine turn on or turn off. The data-line could be integrated underneath of the anode array unit to provide different current size for the sub-pixel light engine. A tunable intensity gray level could be formed in a sub-pixel by different driving current size.

The data-lines and scan-lines could be active mode driving mode and fabricated by Metal-Oxide-Semiconductor Field-Effect Transistor (MOSFET), Complementary Metal-Oxide-Semiconductor (CMOS), Thin-Film Transistor (TFT), Low Temperature Poly-silicon (LTPS), Indium Gallium Zinc Oxide (IGZO) methods to achieve.

By using IC technologies, a matrix of CMOS array module could be formed on the backplane. Each CMOS array unit could be integrated circuit design to connect with data line and scan line. Each sub-pixel light engine array turn-on or turn-off could be switched by each CMOS array unit. By using a commonly used two transistors and one capacity controlling circuit to each CMOS array unit, each sub-pixel contrast ratio, each sub-pixel brightness, each sub-pixel switch speed, each sub-pixel gray level could be programmed, adjusted, tuning. Each CMOS array unit could be controlled by image display control IC.

The backplane 30 could be flexible material such as polyimide, plastic, thin glass. The commonly active matrix (AM) driving methods such as MOSFET, CMOS, TFT (Thin-Film Transistor), LTPS (low temperature poly-silicon), and IGZO (indium gallium zinc oxide) could be formed on the flexible material. In another embodiment, passive matrix driving methods such as stacking circuit with cathodes, and anodes could be formed by using 3D stacking circuit, flexible printed circuit film, Flexible Panel Circuit (FPC), Chip On Film (COF) fabrication technology on the flexible material.

For the common cathode type active matrix semiconductor light emitting array unit module, referring to FIG. 3 and FIG. 5 structure, a polymer layer 46 could only cover to the bottom exposed n-type layer 39 surface, the edges of the single light engine 31 and the top surface of the driver in the street region 41 and trench region 42. The polymer 46 is a covering layer covers on the sidewall of the isolation layer 43 of the edge of the single light engine 31. The polymer 46 is a covering layer covers on the sidewalls of conductive metal layers 36, the sidewall of the eutectic (bonding) layer 35, and the sidewall of the electrodes (cathode, and anode) of the driver. Please note that, an Air Gap could be formed in the street region 41, and in the trench region 42. The polymer 46 covering in the street region could be purposed to be as a function of another black matrix array underneath of the n-type layer 39 to absorb/stop the light escaping from the edge of each light engine 31 and prevent the crosstalk effect. The polymer 46 underneath of the exposed n-type layer 39 in the street region 41 and in the trench region 42 could connect all individual sub-pixel light engine 31 together forming a robust structure for the semiconductor light emitting array unit module or light engine array.

The polymer could be patterned and filled. The polymer could be cured by thermal curing, UV curing, or IR curing after photolithography patterning or filling. The polymer could be selected from the hard materials, such as gels, glues, sol-gels, epoxy, silicone, polyimide, phenyl-silicone; photo-sensitive resister, UV cure able glues, and thermal cure able glues. The polymer could be also selected from the stretch materials, such as gels, glues, epoxy, polyimide, parylene, silicone, methyl-silicone, cohesive gels, silicone gels, PMMA, photosensitive resister, UV or thermal cure able glues.

The polymer could be selected by dyeing the hard materials, such as gels, glues, sol-gels, epoxy, silicone, polyimide, phenyl-silicone; photo-sensitive resister, UV cure able glues, and thermal cure able glues. The polymer could be also selected by dyeing the stretch materials, such as gels, glues, epoxy, polyimide, parylene, silicone, methyl-silicone, cohesive gels, silicone gels, PMMA, photosensitive resister, UV or thermal cure able glues.

Series Circuitry Flip Chip Type LED

FIG. 6 shows a main pixel scheme diagram consists of three sub-pixel light engines. Each sub-pixel light engine has series connection circuitry of two LED units (LED1 and LED2). Please note that each sub-pixel light engine could be formed by using multiple series connection circuitry LED units, not limited to two LED units.

Figure 7A:
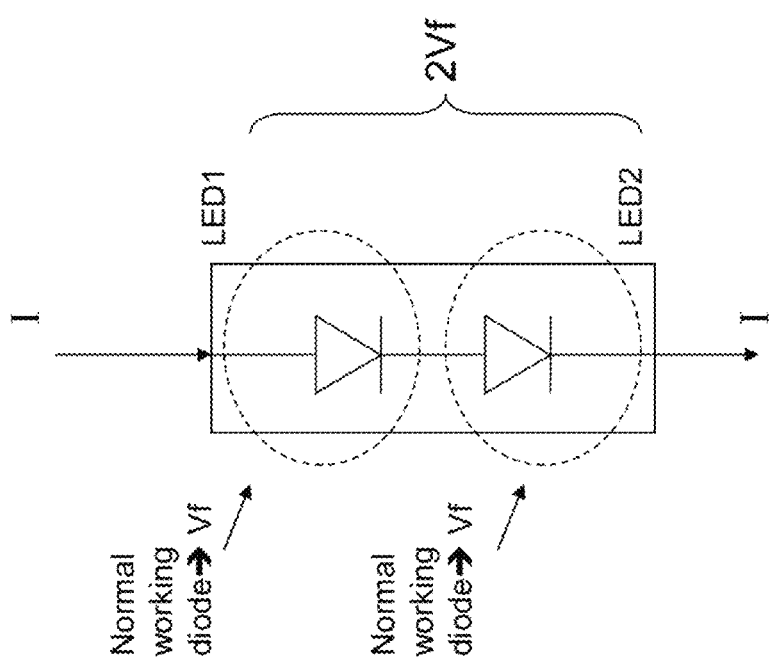
FIG. 7A is two normal working micro LED.

FIG. 7A shows the one sub-pixel light engine consisting two normal working LED with series connecting circuitry. The operating voltage of each normal working LED is Vf. In FIG. 7 A structure, the across voltage of each sub-pixel light engine is 2Vf. FIG. 7B shows the one sub-pixel light engine consisting series circuitry connecting of two LED units (LED1 and LED2), but one of the micro LED unit (LED1) is fail. Normally, the failure LED unit mode is short circuit. Thus, the across voltage of each sub-pixel light engine is Vf.

In one embodiment of current driving mode, the driver IC is designed to input a current of I into the one sub-pixel light engine. For the FIG. 7A structure, the sub-pixel light engine module has current I, and the across voltage 2Vf. The two micro LED units (LED1 and LED2) can be both lit up. For the FIG. 7B structure, the sub-pixel light engine module has current I, and the across voltage Vf. Only one micro LED can be lit up (LED2). The current model operating is commonly used in passive matrix driving mode of display application.

In another one embodiment of voltage driving mode, the driver IC is designed to control the across voltage of 2Vf (or>2Vf) with variable current input. For the FIG. 7A structure, both LED units LED1 and LED2 can be lit up within the sub-pixel light engine. The brightness of the two LED units (LED1 and LED2) can be variable by adjusting the control current of driver IC. For the FIG. 7B structure, only LED unit LED2 can be lit up within the sub-pixel light engine. The across voltage to LED unit LED2 is 2Vf (or>2Vf), but the normal working LED unit LED2 is not damaged. The brightness of LED unit LED2 can be variable by adjusting the control current of the driver IC. The voltage model operating is commonly used in active matrix driving mode of display application.

For example to convert the sub-pixel light engine emissive light to other wavelength light spectrum, FIG. 8 gives an example of one sub-pixel region having the sub-pixel light engine 800 (two LED units LED1 and LED 2), the black matrix 80 (multiple dams), the color conversion layer 81, and the color filter 82. The light generated from the LED units LED1 and LED 2, and get focus in one sub-pixel region because of the black matrix 80. When the light hit the color conversion layer 81, the light can be scattering in the color conversion layer 81 and then converted to the full color spectrum light. Then the full color spectrum light can be selected to emit the target color by the color filter 82. Normally, the two LED units LED1 and LED2 are normal working and can be both lit up as shown in FIG. 7A structure. However, sometimes the LED wafer has defects, or particles randomly distributed in the LED wafer. After fabricating the LED array units on a LED wafer. Some of the LED is failure due to the defects or particles. In the case of FIG. 7B structure, for example, the LED1 is failure. However, the LED2 is still working normal. Thus the light can be generated from the sub-pixel light engine array unit of the LED unit LED2, and the light still can get focus in one sub-pixel region. When the light hit the color conversion layer 81, the light can be scattering to the color conversion layer 81. The light can be uniform distributed in the color conversion layer 81 because of scattering, and converting to the full color spectrum light. The full color spectrum light will then be selected to the target color by passing through the color filter 82.

The series connecting circuitry design of semiconductor light emitting array units for the sub-pixel light engine could be useful to prevent the randomly failure LED array unit caused by the epitaxial defects or particles. Please note that the numbers of the LED connecting together in series circuitry design in one sub-pixel region is not limited to be two series LED units LED1 and LED2. Multiple LED units and LED1 and LED2 having the series circuitry connecting could be formed in one sub-pixel light engine.

Once one or more LED is failure within a sub-pixel light engine, other LED units can be played as the supporting LED units in one sub-pixel light engine region because almost all the failure mode of the LED is short circuit. In this invention, the design of the series circuitry connecting of the semiconductor light emitting array units in one sub-pixel light engine region is very powerful and useful methods to rescue the yield of the LED array especially for the display application. The yield issues of the epitaxial defects and particles in the LED wafers can be simplified and reduced. Normally, the epitaxial defect or particle size can be ranged from sub-micro meter scale size to tens micro meter scale. The design and layout of the semiconductor light emitting array units can be optimized to the scale range for different display applications. For a very high resolution display application, the highest quality of the LED epitaxial wafer with only few micro meter defect or particle size should be taken into consideration for that purpose.

Figure 9A:
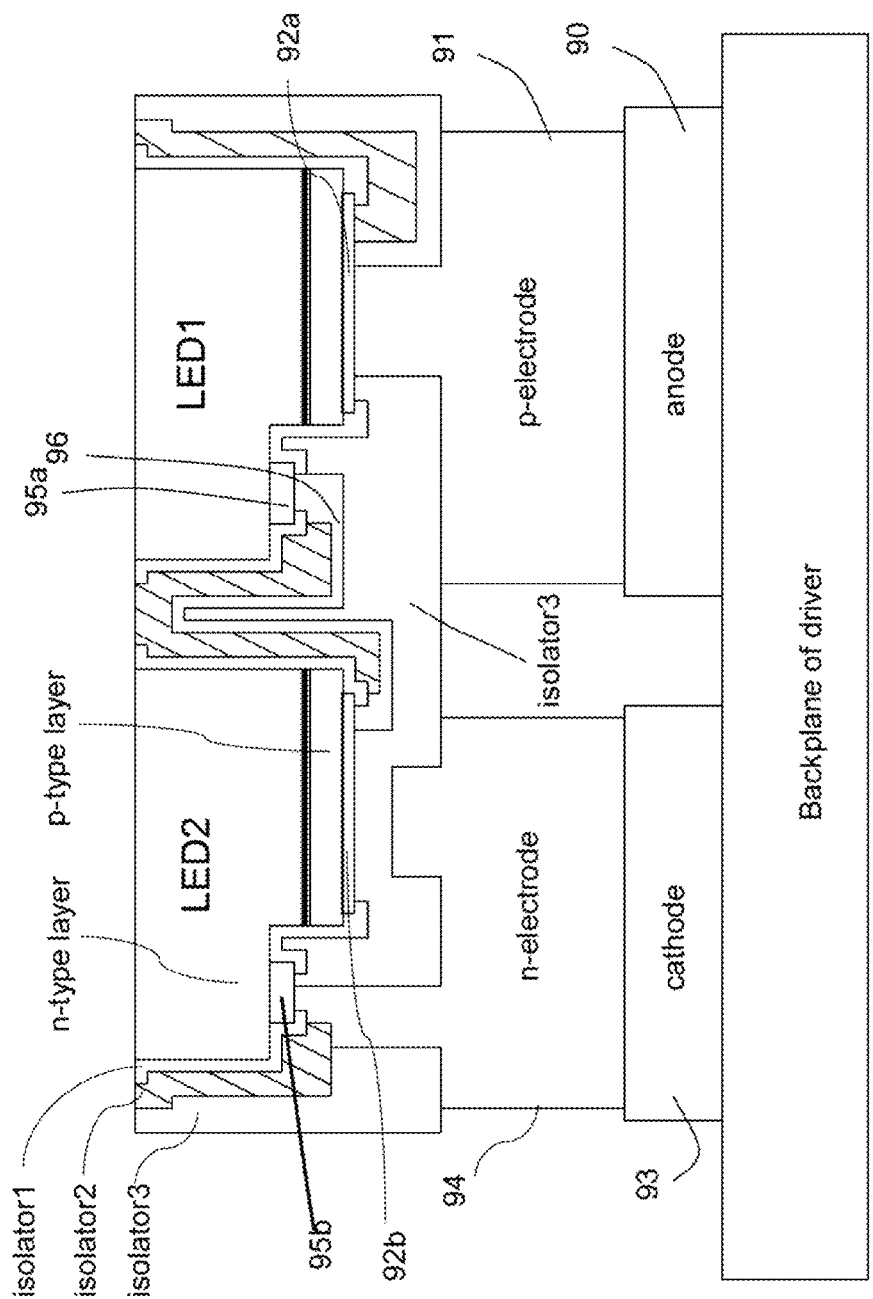
FIG. 9A is a schematic of one sub pixel light engine of the flip chip type LED.

In one embodiment of the series circuitry connecting design of the semiconductor light emitting array units. FIG. 9A shows one sub pixel light engine of the flip chip type LED. Two LED units having series connecting circuitry is first fabricated on the epitaxial growth substrate.

In this embodiment, light engine 900 comprises: an anode 90; a p-electrode 91 located on the anode 90; a p-contact 92a located on the p-electrode 91 and contacted the p-electrode 91; the LED unit LED1 located on the p-contact 92a; the LED unit LED1 located on n-contact 95a; a cathode 93; a n-electrode 94 located on the cathode 93; a n-contact 95 located on the n-electrode 94 and contacted the n-electrode; the LED unit LED2 located on the n-contact 95b; and a connecting layer 96 connected the n-contact 95a and the p-contact 92b.

For the flip chip type LED units LED1 and LED2, a mirror and p contacts 92a and 92b can be fabricated on a portion of the top of the p-type layer, then a mesa portion of p-type layer and active layer was removed to exposed the n-type layer. The n-contact 95b could be formed on the exposed n-type layer to form ohmic contact. An isolation layer (isolator 1) is patterning and forming on the edge of the LED units (LED1 and LED2), and covering a portion of the mirror, mesa side wall, and the portion of the n-contact 95b. Another optionally isolation layer (isolator 2) is patterning to covering on top of the first isolation layer (isolator 1) to enhance the structure of the isolators. Now, please note that a connecting layer 96 is patterned and depositing on top of the isolation layers and electrical conductive connecting the n-contact 95a of LED1 to p-contact 92b (mirror) of LED2. Another one isolation layer (isolator 3) is patterning and covering to the entire sub-pixel region, but exposing the portion of the p-contact region of LED1 and the portion of the n-contact 95b of LED2. A metal layers is then patterning and depositing to the top of the p-contact 92a of LED1, and n-contact 95b of LED2 to form the p-electrode 91 and n-electrode 94 for the series connecting circuitry of the LED units LED1 and LED2 in a sub-pixel region.

Please note that the FIG. 9A structure is the scheme diagram cross sectional structure for two series circuitry LED units forming within one sub-pixel region as the sub-pixel light engine array unit. The sub-pixel light engine array unit can be formed by using multiple series circuitry LED units. Please refer to FIG. 9A, for multiple LED units, in a case of three series circuitry LED units, the series circuitry connecting of FIG. 9A structure can be repeat to form from the second LED unit to the third LED unit. The isolation layer of isolator 3 can be patterned to expose the p-contact of LED1, and the n-contact of the third LED units. For further more multiple series circuitry LED units connection, the similar repeat structure could be formed.

The isolators can be selected from dielectric material such as $Si_3N_4$, $SiO_2$, $Al_2O_3$. The isolators can be also selected from the polymer. The polymer could be selected from the hard materials, such as gels, glues, sol-gels, epoxy, silicone, polyimide, phenyl-silicone; photo-sensitive resister, UV cure able glues, and thermal cure able glues. The polymer could be also selected from the stretch materials, such as gels, glues, epoxy, polyimide, parylene, silicone, methyl-silicone, cohesive gels, silicone gels, PMMA, photosensitive resister, UV or thermal cure able glues.

FIG. 9B illustrates another one embodiment of light engine array. Each light engine is the series circuitry connecting LED of FIG. 9A structure located on a backplane of driver. A polymer 46 could be selected to fill with or cover in the street region and in the region between p electrode and n electrode of each one light engine unit. The epitaxial growth substrate is removed. Thus, a series circuitry connecting of semiconductor light emitting array unit module is formed on a backplane of the driver in a sub-pixel region to be a sub-pixel light engine array unit.

Common-Cathode Series Circuitry Flip Chip Type LED

In another one embodiment, the n-type electrode of FIG. 9B structure could be designed to form an electrical conductive connection in each column of one array. The purpose of the electrical conductive connection is to form a column common cathode array to simplify the backplane circuitry design. FIG. 10A shows a backside view of the 3×4 series circuitry flip chip type LED array units. Each series circuitry flip chip type LED array unit has two series circuitry connection LEDs and form a single p-electrode and a single n-electrode. FIG. 10B illustrates all the row n-electrodes of FIG. 10A is conductive connection together by a connecting conductive line.

Series Circuitry Vertical Type LED

In this embodiment of the series circuitry connecting design of the semiconductor light emitting engine array. FIG. 11 shows the series circuitry vertical type LED. Two LED units LED1 and LED2 having series circuitry connecting are fabricated on the epitaxial growth substrate. For LED unit LED1, a mirror and p-type contact can be fabricated on a portion of the top of the p-type layer, then a mesa portion of p-type layer and active layer was removed to exposed the n-type layer. The n-type contact metal could be formed on the exposed n-type layer as ohmic contact. For LED unit LED2, a mirror of the p-contact can be formed on a portion of the top of the p-type Layer. An isolation of the second one LED unit (LED2) can be formed by dry etching to remove the epitaxial layer layers in the street region. An isolation layer (isolator 1) is patterning and forming on the edge and covering a portion of the mirror for the LED1 and LED2. For the LED1, the isolator 1 could be covering to the mesa side wall, and the portion of the n-contact. Another optionally isolation layer (isolator 2) is patterning to covering on top of the first isolation layer (isolator 1) to enhance the structure of the isolators. Now, please note that a connecting metal layer is patterned and depositing on top of the isolation layers and electrical conductive connecting the n-contact of LED1 to p-contact (mirror) of LED2. Another one isolation layer (isolator 3) is patterning and covering to the entire sub-pixel region, but exposing the portion of the p-contact region of LED1. A metal layers is then patterning and depositing to the entire LED1 and LED2 region to form a metal layers as the p-electrode for the series circuitry connecting of LED units in a sub-pixel region.

Now referring to FIG. 12, FIG. 12 illustrates the vertical type series circuitry connecting LED units transferred to a backplane of driver. The epitaxial growth substrate is removed. FIG. 12 shows one light engine of light engine array 1200. In this embodiment, each light engine of light engine array 1200 comprises an anode 100; a p-electrode 101 located on the anode 100; a p-contact 102 located on the p-electrode 101 and contacted the p-electrode 101; the first LED unit LED1 located on a n-contact 103 and the first p-contact 102; a cathode (not shown in FIG. 12); a n-electrode 104 connected to the cathode and located on LED unit LED2; the LED unit LED2 located on the p-contact 105; and a connecting layer 106 connected the n-contact 103 and the second p-contact 105. Wherein, the light engine array 1200 uses the common cathode.

After removing the epitaxial growth substrate, an n-electrode 104 can be formed on top of the n-type layer of the LED unit LED2. The n-type electrode 104 of LED unit LED2 could be electrical conductive to a common cathode line of the backplane driver by depositing a metal layer or a transparent conductive layer. Thus a series circuitry connecting of the vertical type LED can be formed within one sub-pixel light region to be one sub-pixel light engine. Please note that the numbers of vertical type series connecting circuitry LED unit is not limited to be only two LED units. For series circuitry multiple LED units, the vertical type series circuitry connecting of the LED units can be also formed. In a case of three series circuitry LED units, now referring to FIG. 11, LED unit LED1 structure could be formed again to be the second LED, the only difference is the final LED unit (the third LED). The structure of the final LED unit can be formed as structure of the LED unit LED2 of FIG. 11. After transferring the vertical type series circuitry connecting LED units to a backplane of the driver and removing the epitaxial growth substrate, the n-type electrode could be only formed on the n-type layer of the final LED. The n-electrode 104 of the final LED unit will then electrical conductive connecting to the common cathode line of the backplane of driver.

In this invention, the series circuitry connection structure is the key role to provide the supporting LED units in one sub-pixel region to confirm that each sub-pixel unit region can be lit up. For the LED, the failure mode of LED is almost 99.9% become short circuitry.

In another one particular embodiment, now referring to the structure of FIG. 6, FIG. 9A, and FIG. 11, in each sub-pixel region, the series circuitry connection of LED units could be formed by using self-illuminating LED such as red, green, or blue LED. The series circuitry connection of blue LED unit could be formed on the epitaxial growth substrate, and then transferred to the backplane of the driver in the blue sub-pixel region. A series circuitry connection of Green LED unit could be formed on the epitaxial growth substrate, and then transferred to the backplane of the driver in the green sub-pixel region. A series circuitry connection of Red LED unit could be formed on the epitaxial growth substrate, and then transferred to the backplane of the driver in the Red sub-pixel region. In one main pixel, three RGB sub-pixel has self-illuminating individual RGB LED limits to display full color. No need additional color conversion module on top of the sub-pixel light engine to convert the light into the target color.

The defects and particles are always nature formed when epitaxial growing the LED structures and that will damage the normal optoelectronic function of the LED limits. In LED epitaxy growth technology, several high quality recipe of epitaxy growing condition could help to grow low particle density and narrow the pits defect size epitaxy layer by controlling the 2D to 3D growing time and temperature. For the application of this invention, low particle density and narrow the pits defect size epitaxy condition increase the producing yield.

Redundancy Circuitry Flip Chip Type LED

Figure 13:
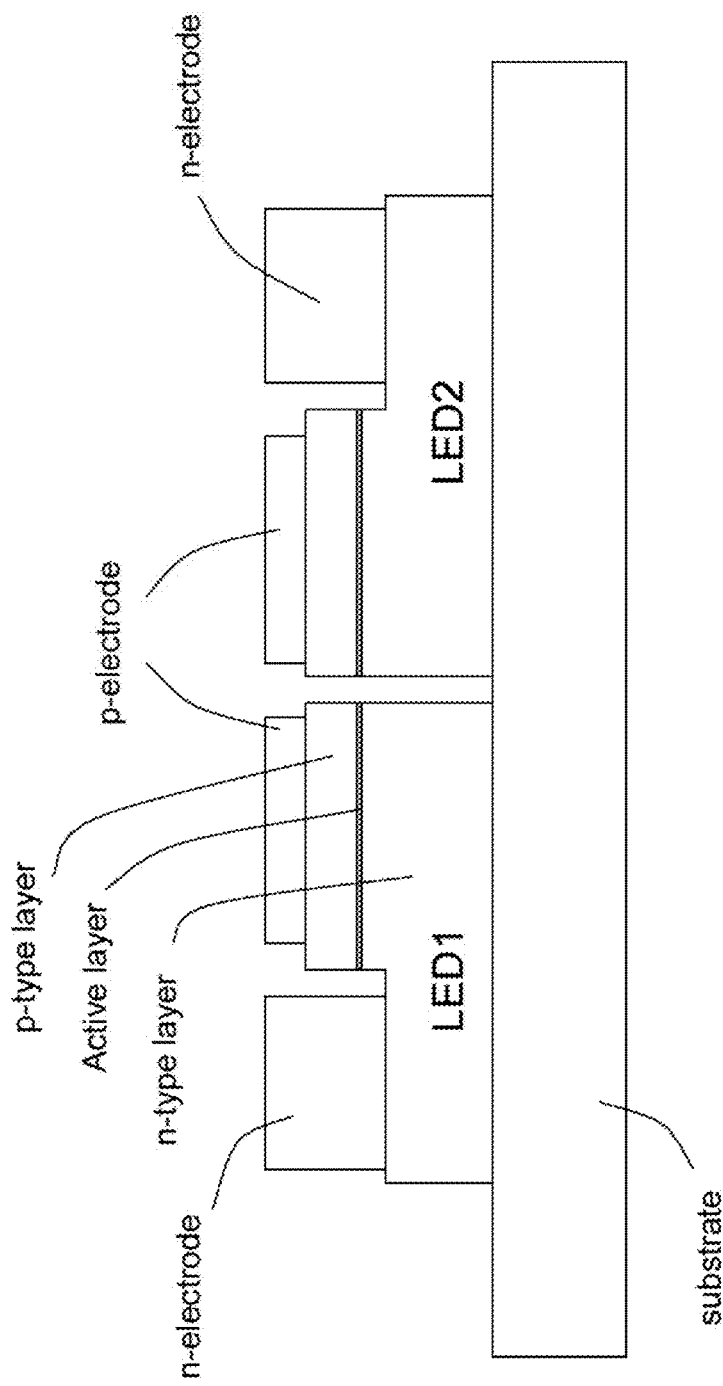
FIG. 13 is the flip chip type micro LED structure for one sub-pixel light engine. The LED1 structure compared to the LED2 structure is mirrored to the LED1 structure.

Another method to increase high yield of the LED units as sub-pixel light engine is to provide the redundancy LED unit within one sub-pixel region. In one embodiment of providing the redundancy circuitry design of backplane. FIG. 13 shows the redundancy circuitry flip chip type LED structure for one sub-pixel light engine. A p-electrode with mirror and p-contact is formed on top of the p-type layer. A mesa dry etching is portion etched to remove the p-type layer, and active layer and expose the n-type layer for n-electrode contact. Please note that the LED units LED1 and LED2 have different mesa sides in FIG. 13 structure. The LED unit LED1 structure compared to the LED unit LED2 structure is mirrored to the LED1 structure.

Figure 14:
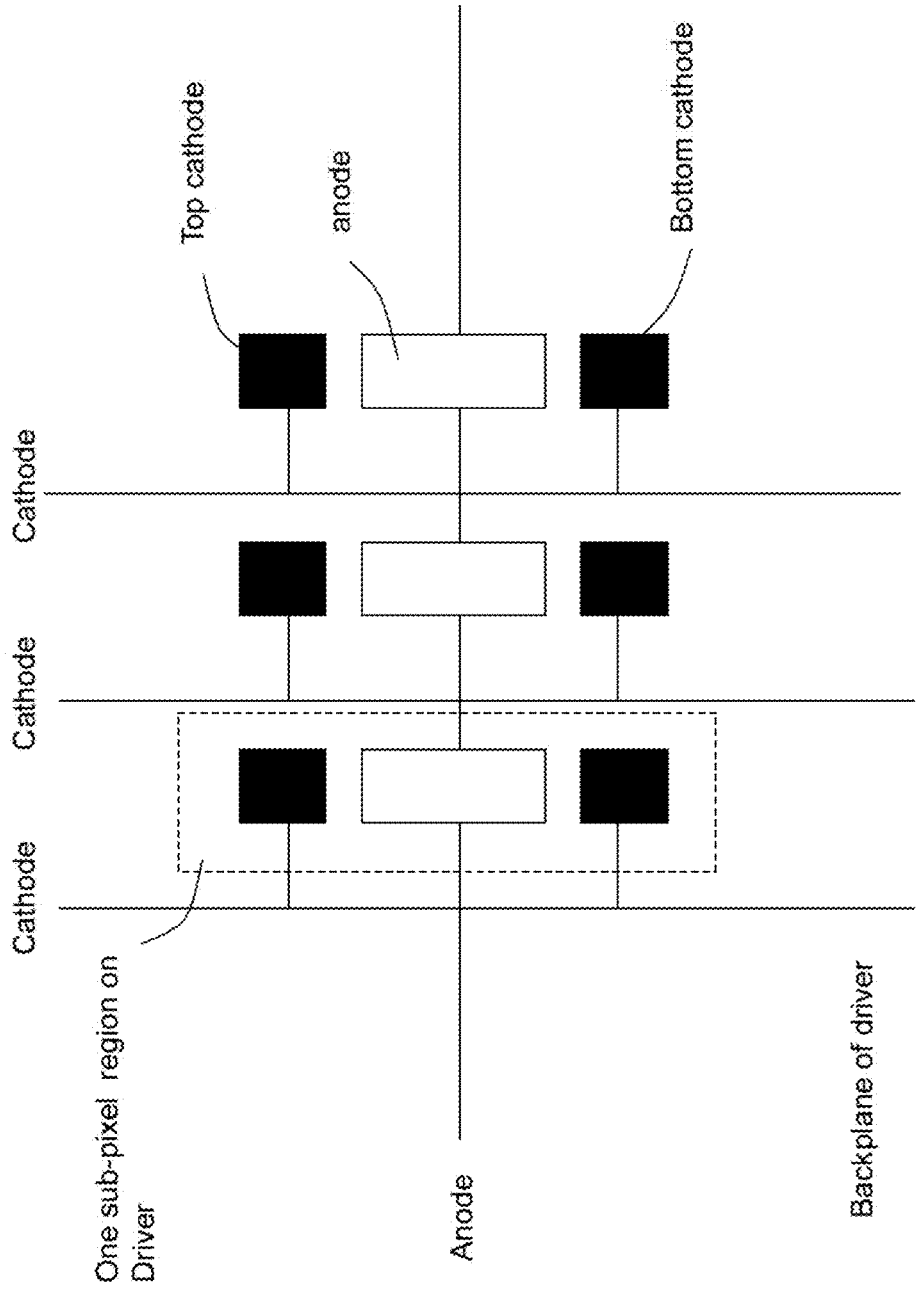
FIG. 14 is the backplane of the driver in one main pixel providing for the flip chip type redundancy micro LED structure of FIG. 13.

FIG. 14 illustrates the backplane of the driver in one main pixel providing for the redundancy flip chip type LED unit structure of FIG. 13. The backplane of driver in one main pixel has one anode line and three cathode lines. The one anode line connecting to three anodes positioned to each sub-pixel region. Please note that the anode in each sub-pixel region has larger area than that of the cathode. Each cathode line to every sub-pixel region is split into two lines and connecting to the top cathode and the bottom cathode.

Figure 15:
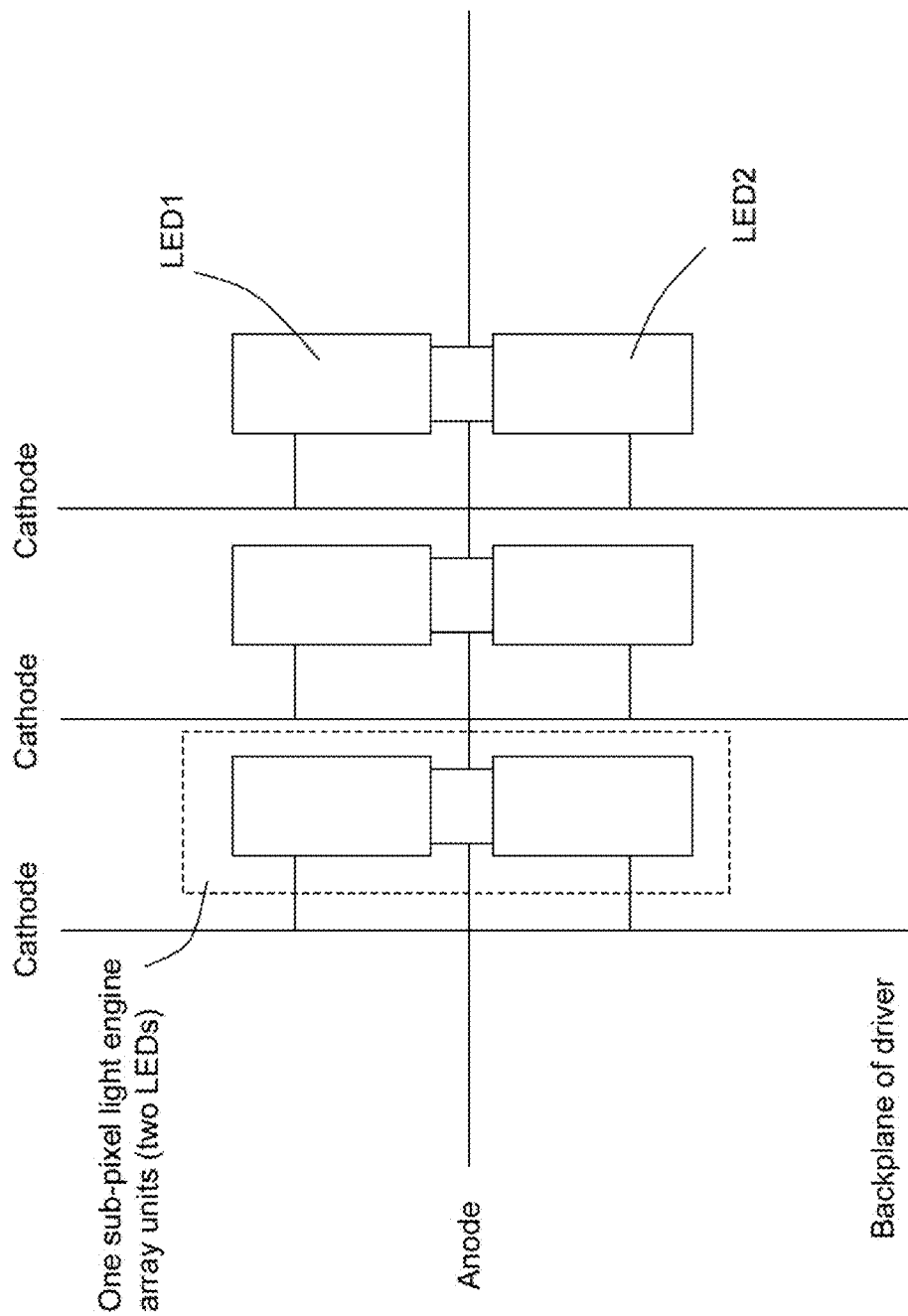
FIG. 15 is the micro LED of FIG. 13 is transferred and bonded to the backplane of driver of FIG. 14.
Figure 16:
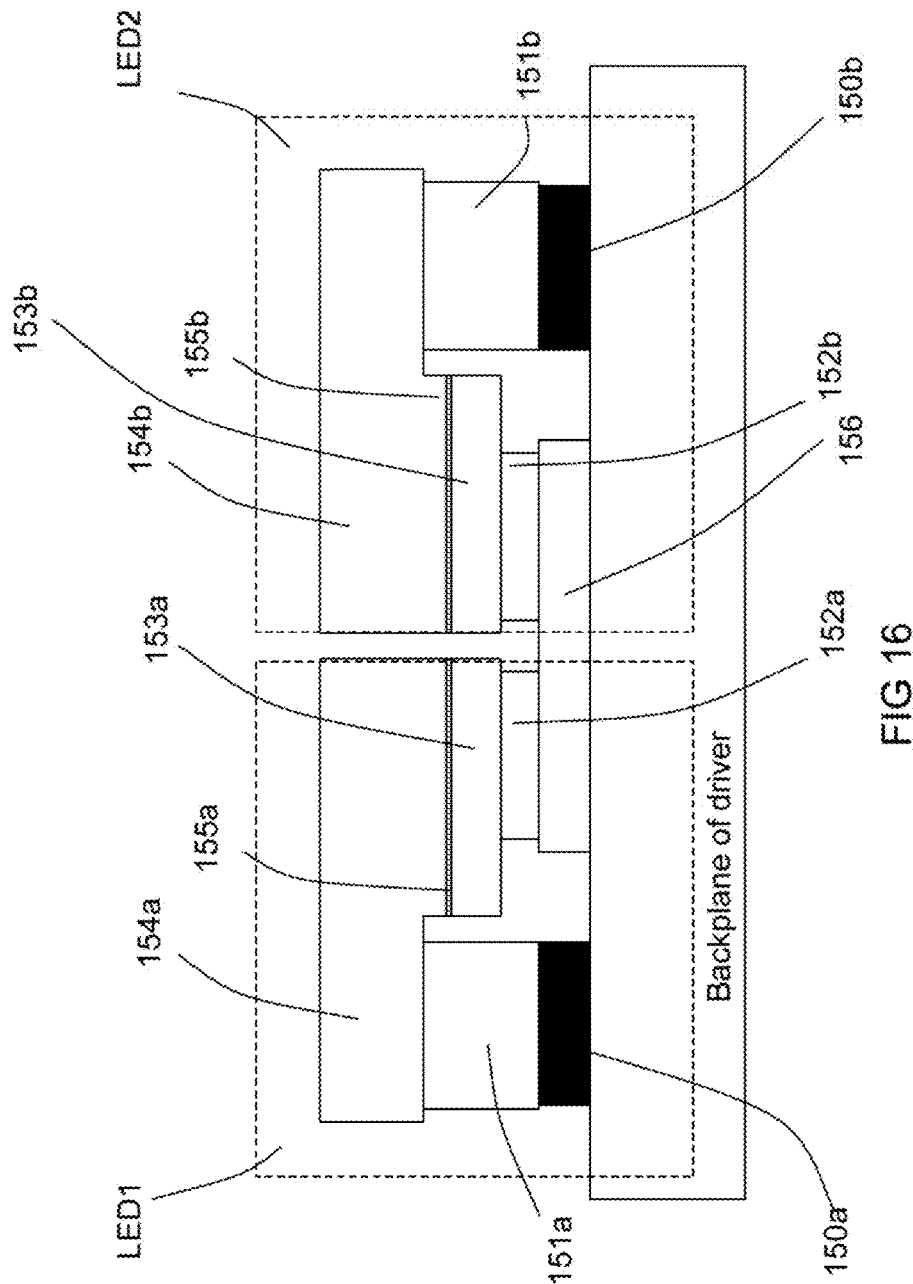
FIG. 16 is the cross sectional structure of FIG. 15.

FIG. 16 shows the LED unit of FIG. 13 is transferred and bonded to the backplane of driver. The epitaxial growth substrate is removed. FIG. 16 is the cross sectional structure of FIG. 15. In this embodiment of light engine array 1500, FIG. 16 shows one light engine of light engine array 1500. LED unit LED1 comprises: cathode 150a (top cathode of FIG. 14); n-electrode 151a located on the cathode 150a; p-electrode 152a located on the anode 150a; a p-type layer 153a located on the p-electrode 152a; n-type layer 154a located on the n-electrode 151a; and active layer 155a set between n-type layer 154a and p-type layer 153a.

Moreover, LED unit LED2 comprises: cathode 150b (bottom cathode of FIG. 14); n-electrode 151b located on the cathode 150b; p-electrode 152b located on the common used anode 156; p-type layer 153b located on the p-electrode 152b; n-type layer 154b located on the n-electrode 151b; and active layer 155b set between n-type layer 154b and p-type layer 153b. Wherein, the p-electrodes 152a and 152b connect to the common used anode 156.

The n-electrode 151a of the LED unit LED1 is connected to the top cathode, and the n-electrode 151b of the LED unit LED2 is connected to the bottom cathode. The p-electrode 152a and 152b of LED units LED1 and LED2 are connected to the anode 106.

Figure 17:
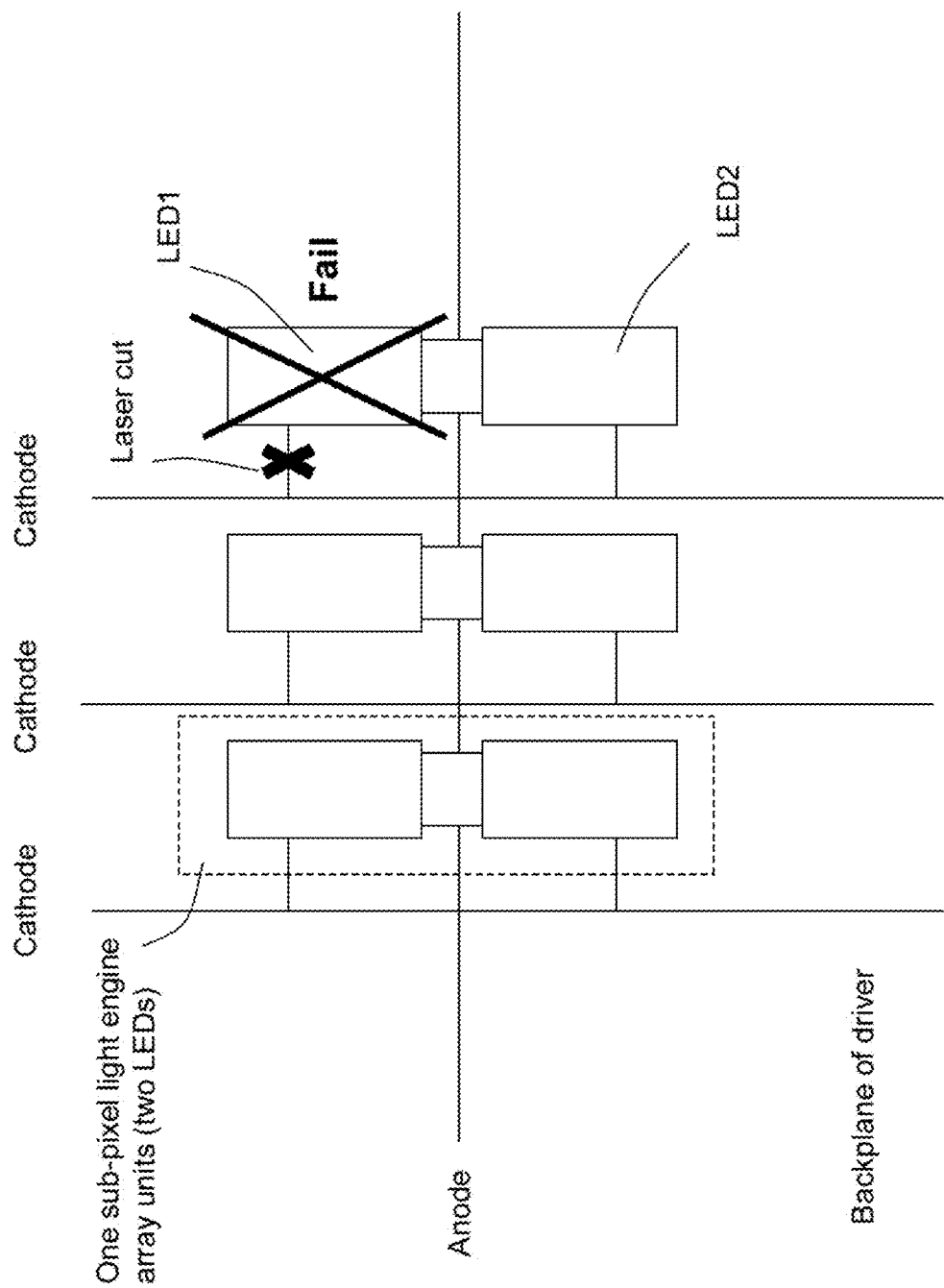
FIG. 17 is once one of the micro LED in one sub-pixel region is failure operation, for example LED1, the cathode line connecting to the top cathode of LED1 can be eliminated by a laser to be open circuitry.

FIG. 17 illustrates once one of the LED units in one sub-pixel region is failure operation, for example of LED unit LED1, the cathode line connecting to the top cathode 150a of LED unit LED1 can be eliminated by a laser to be open circuitry. That means only LED unit LED2 in one sub-pixel region can be lit up to emit the light.

Redundancy Circuitry Vertical Type LED

Figure 18:
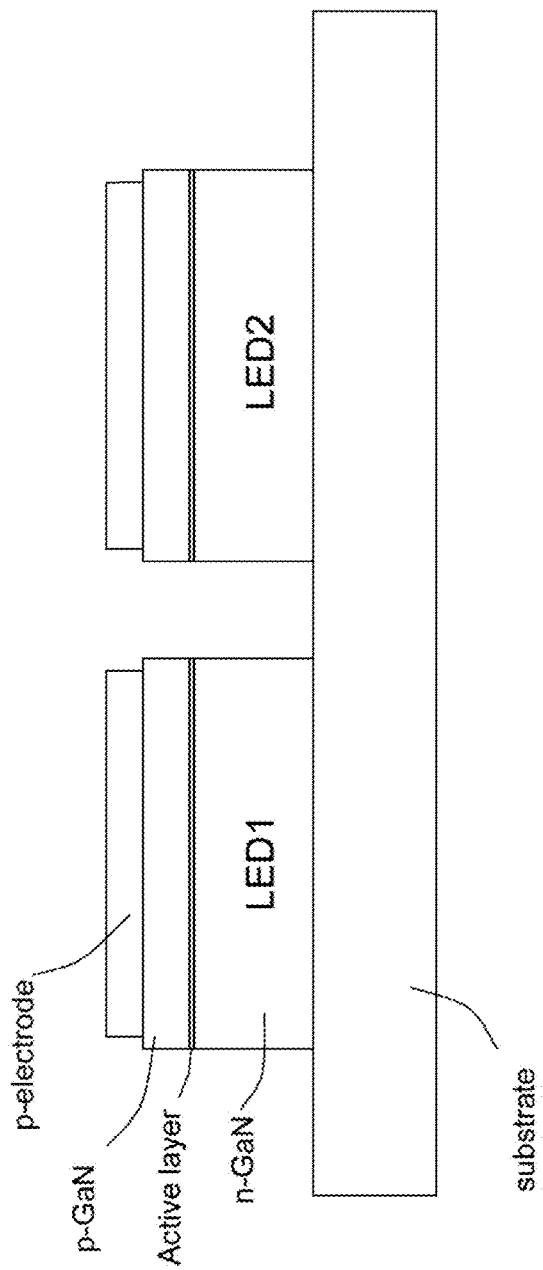
FIG. 18 is the vertical type micro LED structure for one sub-pixel light engine.

In another one embodiment of providing redundancy LED unit, FIG. 18 shows the redundancy vertical type LED unit structure for one sub-pixel light engine. A p-electrode with mirror and p-contact is formed on top of the p-type layer. An isolation dry etching is patterned to remove the entire the LED epitaxial structure to form a street region. In this example, two vertical type LED units is provided, however it is not limited to only two LED units. Multiple LED units can be formed in one sub-pixel region to provide the redundancy LED units for sub-pixel light engine purpose.

Figure 19:
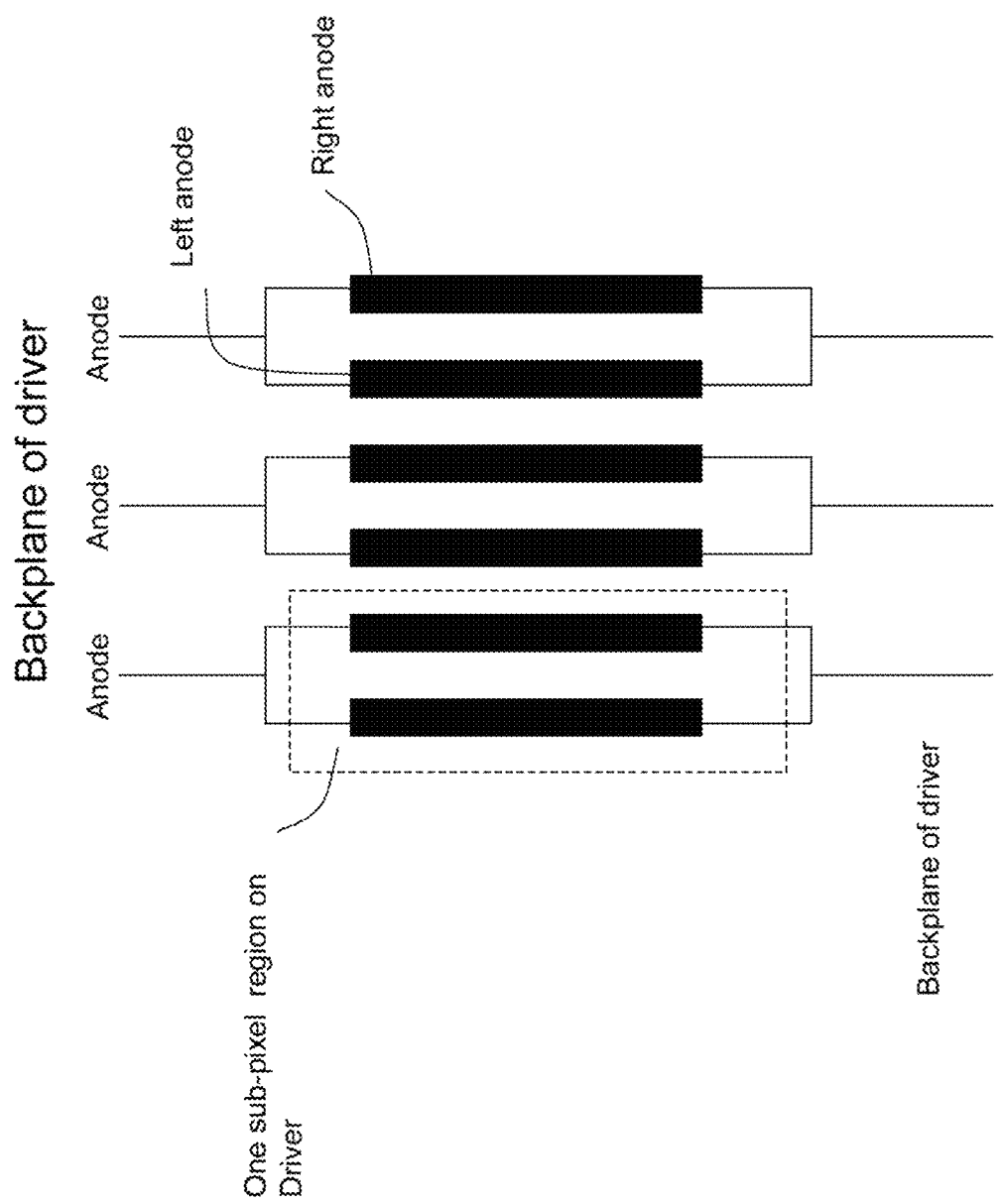
FIG. 19 is the backplane of the driver in one main pixel providing for the vertical type redundancy micro LED structure of FIG. 18.

FIG. 19 illustrates the backplane of the driver in one main pixel providing for the vertical type redundancy LED unit structure of FIG. 18. The backplane of driver in one main pixel has only anode lines. The anode line is spilt into two lines connected to left anode and right anode in one sub-pixel region.

Figure 20:
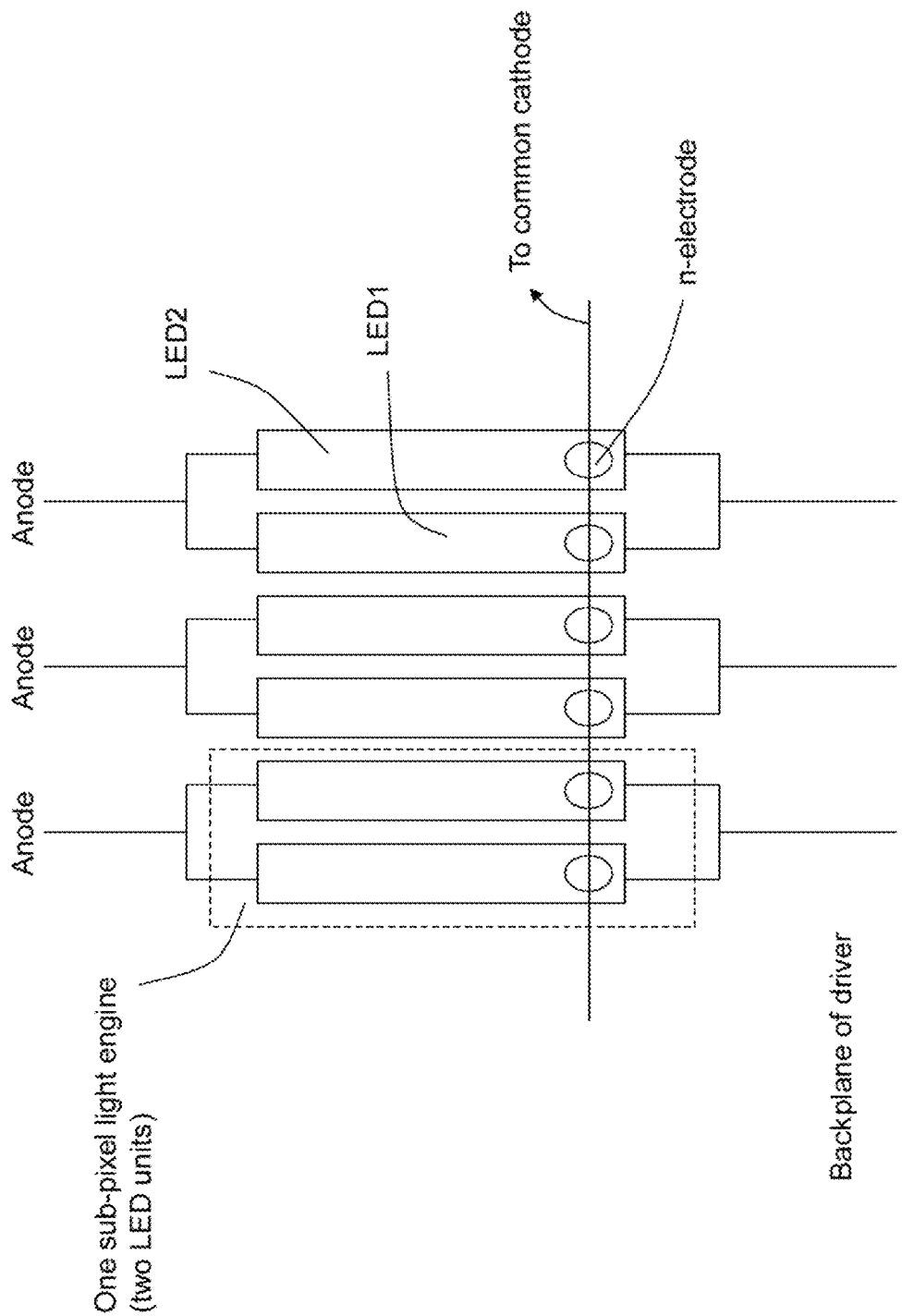
FIG. 20 is the micro LED of FIG. 18 is transferred and bonded to the backplane of driver of FIG. 19.

FIG. 20 shows the micro LED of FIG. 18 is transferred and bonded to the backplane of driver of FIG. 19. The epitaxial growth substrate is removed. After removing the epitaxial growth substrate, additional dry etching step may optionally processed to remove the un-doped semiconductor layer to expose the high conductivity n-type layer for good ohmic contact. An n-type electrode is then patterned and deposited to the top of the n-type layer. Finally, a transparent conductive layer or a metal conductive line can be formed on top of the entire n-type electrode of the same row of the vertical type LED unit and connecting to a common cathode region (or said common cathode bar).

Figure 21:
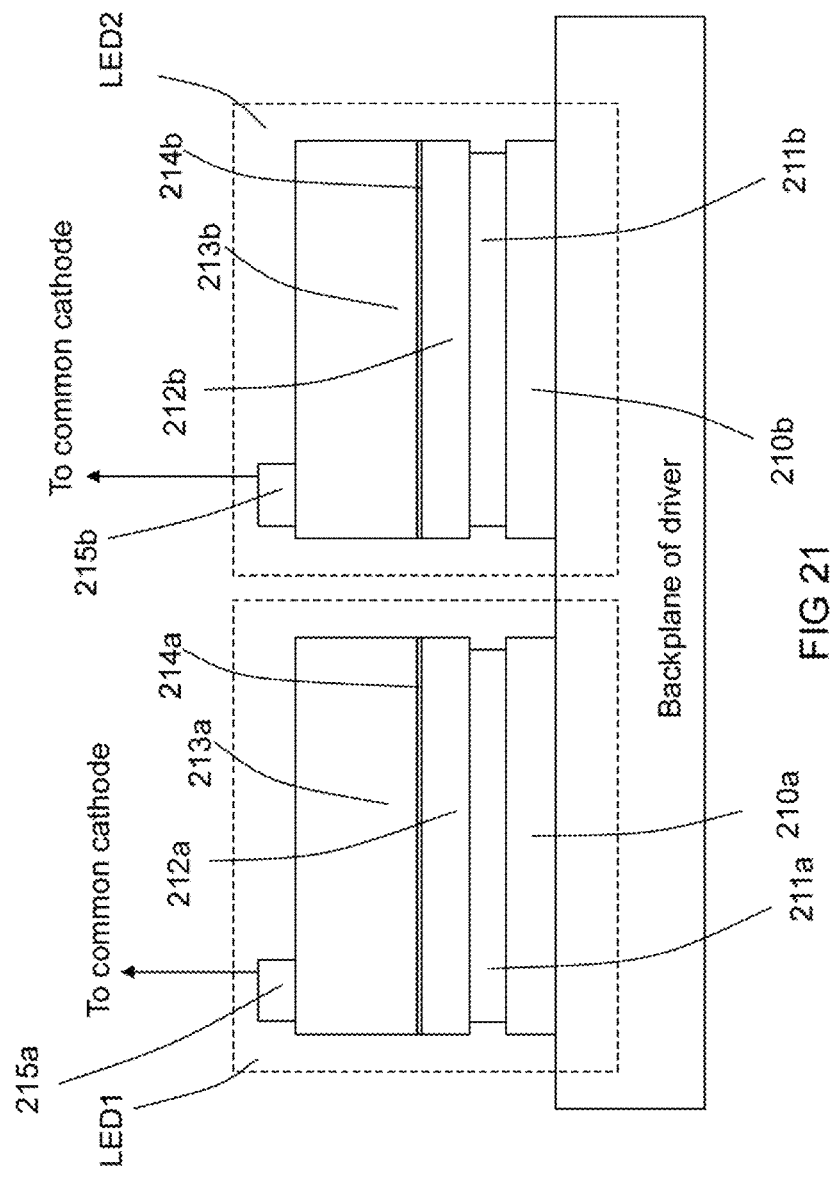
FIG. 21 is the cross sectional structure of FIG. 20. The p-electrode of the LED1 is connected to the left anode, and the p-electrode of the LED2 is connected to the right anode.
Figure 22:
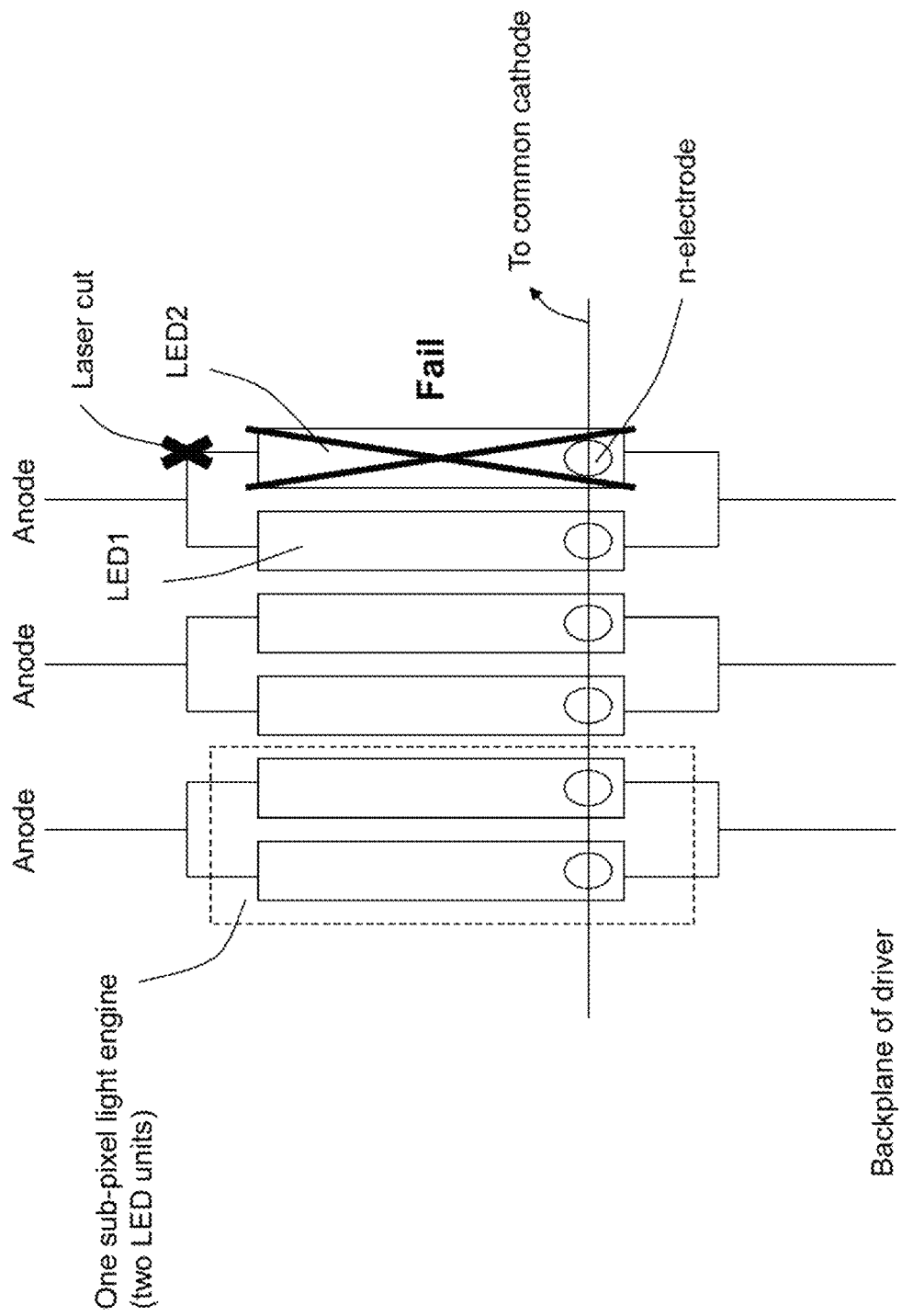
FIG. 22 is once one of the micro LED in one sub-pixel region is failure operation, for example LED2, the anode line connecting to the right anode of LED2 can be eliminated by a laser to be open circuitry.

FIG. 21 is the cross sectional structure of FIG. 20. In this embodiment, FIG. 21 shows one light engine of light engine array 2100. Light engine array 2100 comprises LED units LED1 and LED2. LED unit LED1 comprises: anode 210a (left anode of FIG. 19); p-electrode 211a located on the anode 210a; p-type layer 212a located on p-electrode 211a; n type layer 213a set on the p type layer 212a. Active layer 214a set between p type layer 212a and n type layer 213a; and n-electrode 215a located on n type layer 213a.

Moreover, LED unit LED2 comprises: anode 210b (right anode of FIG. 19); p-electrode 211b located on the anode 210b; p type layer 212b located on p-electrode 211b; n type layer 213b set on the p type layer 212b. Active layer 214b set between p type layer 212*b* and n type layer 213*b*; and n-electrode 215*a* located on n-GaN 213*b*.

The p-electrode 211*a* of the LED unit LED1 is connected to the left anode 210*a*, and the p-electrode 211*b* of the LED unit LED2 is connected to the right anode 210*b*. The n-electrode 215*a* and 215*b* are connected to the common cathode region through a transparent conductive layer or a metal conductive line.

FIG. 21 illustrates once one of the LED units in one sub-pixel region is failure operation, for example of LED unit LED2, the anode line connecting to the right hand side anode of LED2 can be eliminated by a laser to be open circuitry. That means only LED unit LED1 in one sub-pixel region can be lit up to emit the light.

The series connection circuitry structure is the key role to provide the redundancy LED units in one sub-pixel region to confirm that each sub-pixel unit region can be lit up. In another one particular embodiment, now referring to the structure of FIG. 13, FIG. 16, FIG. 18, and FIG. 21, in each sub-pixel region, the series connection circuitry of LED unit could be formed by using self-illuminating color LED such as red LED, green LED, and blue LED. The series circuitry connection of blue LED unit could be formed on the epitaxial growth substrate, and then transferred to the backplane of the driver in the blue sub-pixel region. A series circuitry connection of Green LED unit could be formed on the epitaxial growth substrate, and then transferred to the backplane of the driver in the green sub-pixel region. A series circuitry connection of Red LED unit could be formed on the epitaxial growth substrate, and then transferred to the backplane of the driver in the Red sub-pixel region. In one main pixel, three individual RGB sub-pixel has self-illuminating RGB LED unit to display full color. No need additional color conversion module on top of the sub-pixel light engine array unit to convert the light into the target color.

Light Intensity Modulation

Figure 23:
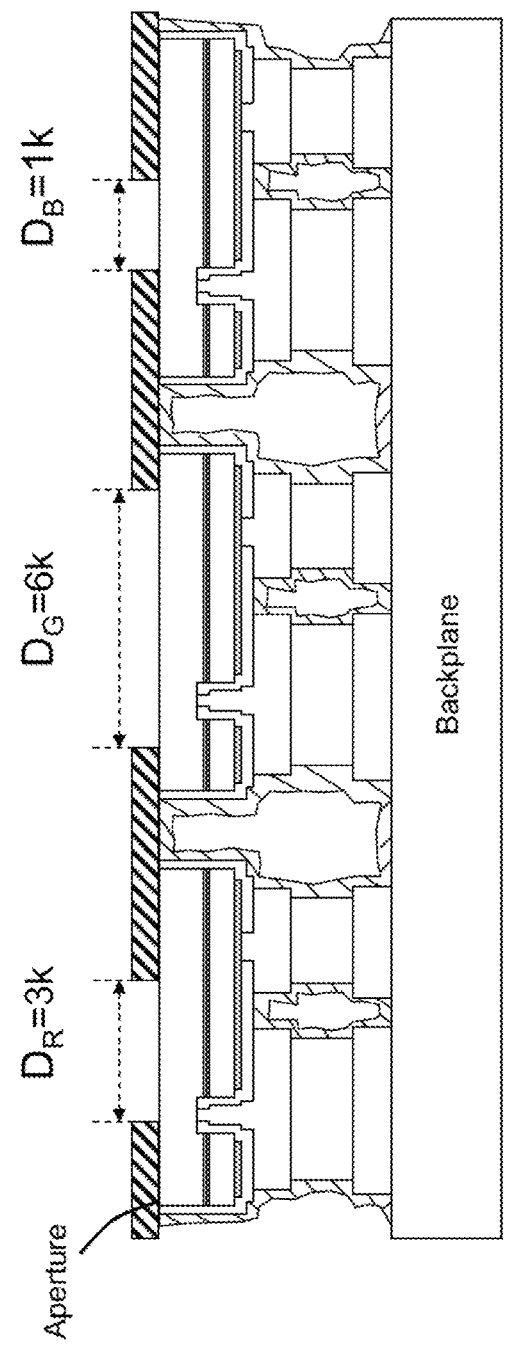
FIG. 23 is an aperture patterning on top of the flat surface of FIG. 2 structure. The aperture is patterned to open a certain area on top of the light engine array.

FIG. 23 shows an aperture could be patterned and formed on top of the flat surface of FIG. 2 structure. In similar, the aperture could be patterned and formed on top of FIG. 3, FIG. 5, FIG. 10, FIG. 12, and FIG. 16, FIG. 18, and FIG. 21 structure (not shown in here). The aperture is patterned to open a certain area on top of the semiconductor light emitting array unit. Before patterning the aperture, the light generated from each sub-pixel light engine could be escaping through the entire top semiconductor light emitting array unit surface (n-type layer). The aperture patterning on top of the semiconductor light emitting array unit could be a light output power modulator to control the light output power of each sub-pixel light engine.

In general, under the same driving current, each sub-pixel light engine could be lit up at the same output light power level. The light output power of each sub-pixel light engine could be modulated by using the variable aperture patterning. The semiconductor light emitting array unit having aperture on top could be connected to a color conversion array unit to perform different color. For example, three different sub-pixel light output power could be modulated by forming three different aperture opening area on top of the semiconductor light emitting array units. After modulating, the light of three sub-pixels could be connect to three primitive color conversion array units to perform three different primitive color having different color intensities.

In theory, three light primitive colors are red, green and blue. Any visible colors could be obtained by combining different intensity ratio from three primitive colors. For a full color display, a group (main) pixel unit contains multiple sub-pixel units such as Red sub-pixel unit, Green sub-pixel unit, and Blue sub-pixel unit. A group pixel color could be displayed to its target color in visible full color spectrum by mixing three primitive colors intensity.

For white purity or white balance purpose, the intensity ratio of R, G and B, has the certainly ratio to perform different white colors and white purity purpose. The white color could be defined by the correlated color temperature. Through the adjustment of aperture opening size, the color intensity of each pixel could be controlled. Normally in an example, for displaying a pure white color group (main) pixel, the primitive color intensity ratio could be 3 (Red):6 (green):1 (Blue). FIG. 23 shows the opening aperture size (area) could be designed to this ratio to display pure white in a group (main) pixel. Wherein, gap size of the neighboring dams is to control an aperture size of the corresponding light engine.

In another embodiment, to confine the sub-pixel light output power and light output area, the aperture opening area could be selected to be the same size (DG=DR=DB). A group (main) pixel color ratio could be modulated by adjusting the driving current or driving voltage in each sub-pixel light engine. The light generated from the sub-pixel light engine could be confine to a certain area within a sub-pixel region.

In other words, the aperture opening area could be selected to be the same size (DG=DR=DB). For different sub-pixels, the aperture opening size of each sub-pixel could be defined individually to perform the primitive colors such as Red (R) color, Green (G) color, Blue (B) color. For white purity or white balance purpose, the intensity ratio of R, G, B, has the certainly ratio to perform different white colors and white purity purpose. The white color could be defined by the correlated color temperature. Through the adjustment of aperture opening size (area), the color intensity of each sub-pixel could be controlled. Each target primitive color sub-pixel could be displayed after converting the original monochrome color sub-pixel light to the target primitive color. The light output power of each monochrome color sub-pixel light engine could be modulated by variable aperture opening area first and then converting to the target primitive color intensity by the color conversion array unit. Normally for white color display in a group pixel, the light intensity of Green sub-pixel has largest ratio, the light intensity of Red sub-pixel has middle ratio, and the light intensity of Blue sub-pixel has the smallest ratio.

The highest Green sub-pixel light intensity could be obtained by forming the largest aperture opening area to convert the light of sub-pixel light engine to the Green color sub-pixel. The Red sub-pixel light mid ratio intensity could be obtained by forming the mid ratio aperture opening area to convert the light of sub-pixel light engine to the Red color sub-pixel. The lowest Blue sub-pixel light intensity could be obtained by forming the smallest aperture opening area to convert the light of sub-pixel light engine to the Blue color sub-pixel. Thus, in a group pixel, highest Green sub-pixel color intensity, middle Red sub-pixel color intensity and smallest Blue sub-pixel color intensity could be obtained. Combining these three different sub-pixels color intensities, a white purity color group pixel could be formed.

In addition, the light output power of each color ratio could be adjusted by individually driving voltage or driving current to each sub-pixel light engine. For more detail color adjustment, a tiny adjustment of the sub-pixel light engine controller is required.

By using the same driving current and driving voltage to a sub-pixel light engine array unit, a white purity group pixel could be direct obtained by forming different aperture opening area for different sub-pixel light engine array units. Thus, the design IC of sub-pixel light engine array unit controller could be simplified. Both active matrix (AM) driving mode and passive matrix (PM) driving mode for the sub-pixel light engine array unit could be simplified. The image driving IC controller could also be simplified. The aperture could be any shape, such as circle, hexagonal, rectangular, ellipse, square or polygon. The aperture could be selected to deposit a patterning metallization layer such as Cr/Ni/Au or any other suitable metal layers. The aperture could be selected to form by patterning a non-transparent dyeing photoresister.

In another one embodiment, the method to form the aperture opening of (R, G, B) as described above could be replaced by using selective absorption layers coating to form layers on top flat surface of semiconductor light emitting unit. Different thickness of absorption layers could absorb different light intensity. The absorption layer could be patterned in each sub-pixel region to satisfy the (R, G. B) intensity ratio demand. For example, for blue sub pixel, a Ni: 10-20 Å metal layer could be patterned and deposited, for red sub-pixel, a metal layer Ni: 5-10 Å could be patterned and deposited and for green sub-pixel, a metal layer Ni: 0-5 Å could be patterned and deposited. For another example, the adjustment of the intensity ratio of R, G, B, could be formed by selecting different transparent polymers with different absorption coefficient, or selected from a series of photolithography photo-resist by varying their thickness.

In another one embodiment, the light output power of each sub-pixel light engine could be modulated by the reflector layers. For the Green sub-pixel light region, the reflector layer of the semiconductor light emitting array unit could be selected to deposit a highest reflectivity reflection metallization layers. For the Red sub-pixel light region, the reflector layer of the semiconductor light emitting array unit could be selected to deposit a middle reflectivity reflection metallization layers. For the blue sub-pixel light region, the reflector layer of the semiconductor light emitting array unit could be selected to deposit a lowest reflectivity reflection metallization layers.

In another one embodiment, the light output power of each sub-pixel light engine could be modulated by the adjusting the patterning size of reflector layers. For the Green sub-pixel light region, the reflector layer of the semiconductor light emitting array unit could be selected to pattern a largest reflection area of metallization layers. For the Red sub-pixel light region, the reflector layer of the semiconductor light emitting array unit could be selected to pattern a middle reflection area of metallization layers. For the Blue sub-pixel light region, the reflector layer of the semiconductor light emitting array unit could be selected to pattern a smallest reflection area of metallization layers.

Figure 24:
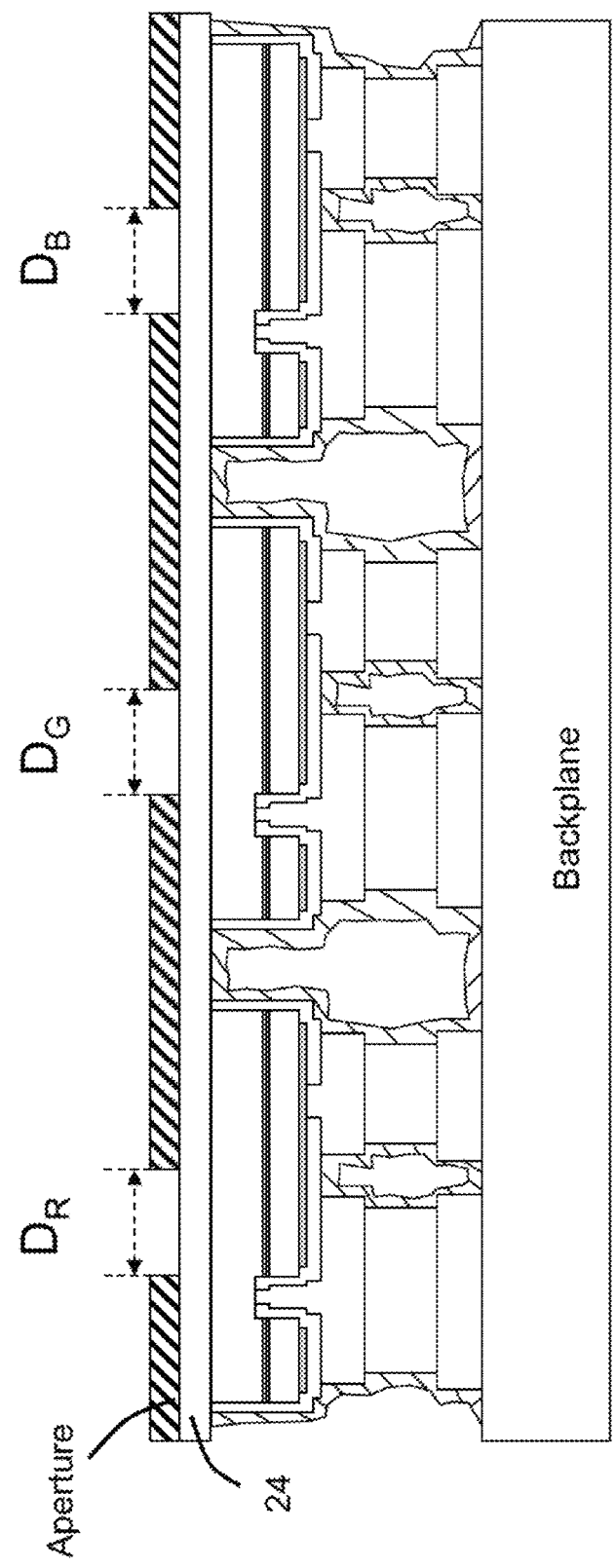
FIG. 24 is an isolation layer optionally coated on the top flat surface of the structure of FIG. 23. The thickness of isolation layer is less than 50 μm to prevent the waveguide effect of light scattering in the isolation layer.

Now, referring to FIG. 23, in option, additional isolation layer could be formed on top of FIG. 23 structure before forming the aperture. FIG. 24 shows the isolation layer 24a could be optionally formed between the aperture and the semiconductor light emitting array unit. The thickness of isolation layer 24a should be less than 50 μm to prevent the waveguide effect of light scattering in the isolation layer 24a. The isolator could be selected by the dielectric material such as $SiO_x$, $SiN_x$, $Al_2O_3$, $TiO_2$, or soft materials such as polymers. The polymer could be gels, glues, sol-gels, epoxy, silicone, polyimide, phenyl-silicone; photo-sensitive resister, UV cure able glues, and thermal cure able glues. In particular, the isolator could be fabricated by depositing the angle-selective filters to reduce the divergence angle of the light emitted from top surface of n-type layer. Generally, due to different refractive index of material, the divergence angle of light emitted from the top surface of n-type layer is wider than +/−60°, the wide divergence angle of light may emit the light to the neighbor/adjacent sub-pixel region which could cause a crosstalk effect. A multiple dielectric thin film layers of angle selective filter could be selected to deposit on the top of the semiconductor light emitting surface. The angle selective filter layers could be formed by dielectric thin film which could be also played as an isolator to protect the exposed n-type semiconductor layer. The angle selective filter layers could reduce the divergence angle of light from the top of semiconductor light emitting surface. The angle selective filter layers could be formed by using of the property that the effective optical thickness at different wavelength of light source/engine. An angle selective filter layers has multiple layers compositing with the high reflective index layer and low refractive index layer. The divergence angle could be reduced to +/−15° or even smaller dependent by the optical design. The other angle of the incident light could be reflected back to semiconductor light emitting array unit and could reflect back multiple times till the emitting light angle fit to the designed certain divergence angle to escape. Therefore a high compact and directional light can be obtained. The high compact and directional light could be also applied for coupling to a waveguide optical communication fibers or optical channel.

Color Conversion Module

Figure 25:
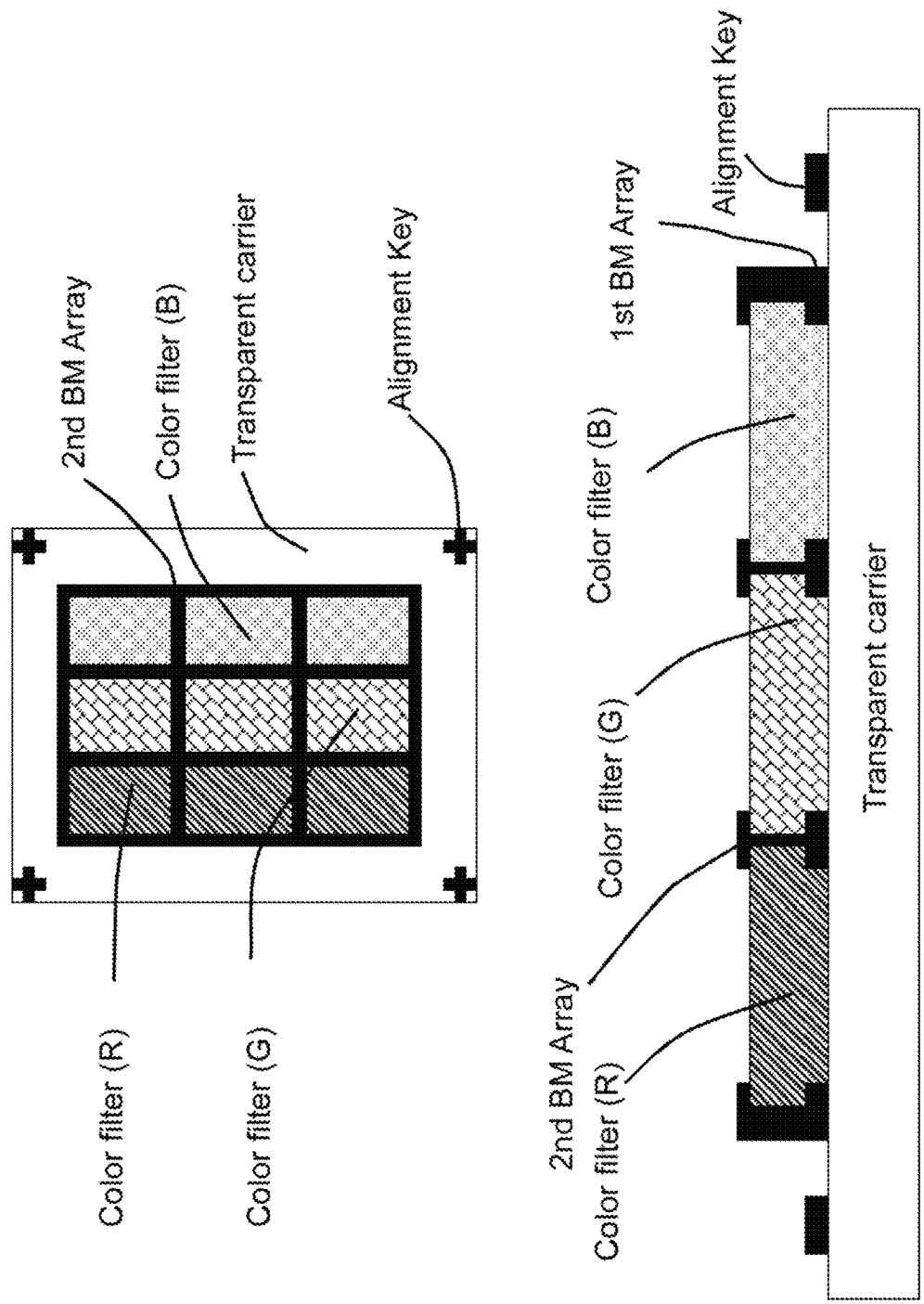
FIG. 25 is the black matrixes array and the red, green, blue color filters proportional patterning on the transparent carrier performing the primitive color in each sub-pixel region.

FIG. 25 show an example of 3×3 black matrixes (BM) array and color filter could be patterned and deposited on top of the transparent carrier. The BM array could be deposited by a metallization layer such as Cr/Au on the portion of the transparent carrier. The alignment key could be patterned and deposited together with the BM array metallization on the four corners of the transparent carrier. The purpose of the BM array is to distinguish the color light emitted from each sub-pixel. In some particular case, the BM array could be patterned by black photoresist (PR) or dyeing PR to absorb the light to prevent the crosstalk effect. After patterning and depositing the BM array, the red (R), green (G), blue (B) color filters could be sequential proportionally patterning on the transparent carrier to form the primitive color in each sub-pixel region. The color filter is a kind of color spectrum selection material to select the required transmitting color spectrum. For the color filter, for example, the red color filter only allows the red color spectrum passing through the red color filter. Thus, for a full color spectrum light emitting through the red color filter, only the red color could be obtained after the red color filter. In one embodiment, the color filter could be formed by using the color photoresist as color filter. The red (R) color photoresist, green (G) color photoresist and blue (B) color photoresist could be patterned and cured sequence forming in each sub-pixel column. The color photoresists filters could be patterned and cover the BM array to fill up completely in the color filter region to prevent other color light leakage issue. After curing the R, G, B color photoresists filter, the R, G, B color filters could be formed on the transparent carrier and on the BM array. The second black matrix array could be patterned and deposited by metallization layers or through black color photoresist patterning. The color filter structure could be enhanced by depositing the second black matrix. The first black matrix array and the second black matrix array could be as a clip structure at the BM array region to connect the edge of each color filter. In some particular case, the color filters could be multiple overlap patterning on the first BM array. The second BM array could be aligned and deposited on the overlapping BM array region. Due to the color filter on overlapping region is a relative weak structure, the color filter structure could also be enhanced by depositing the second BM array on top of the overlapping color filters. The second BM array could also be function as an adhesive promotion layer for further connecting steps. The first BM array and second BM array could be performed as a sub-pixel light stop matrix array to protect the sub-pixel light not penetrating into the neighbor sub-pixels.

Figure 26:
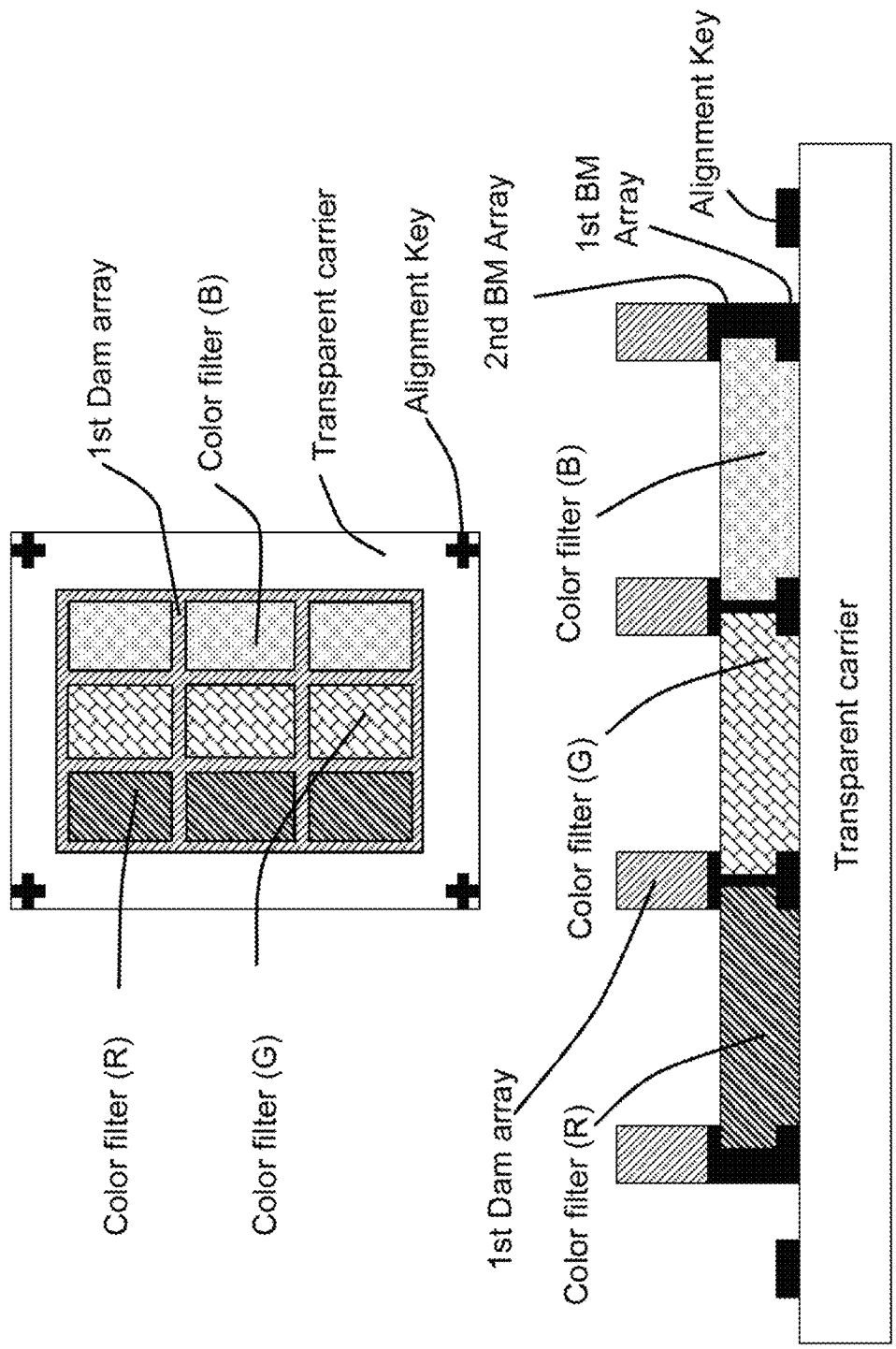
FIG. 26 is a first dam array forming on the second black matrix array.

The transparent carrier could be hard material, such as glass, sapphire. The transparent carrier could be soft and flexible, such as transparent polyimide, polyimide, plastic, thin glass. Normally, the width of the BM array could be less than 50 µm depended on the design of pixel size and display resolution. In another embodiment, the color filter could be formed by depositing multiple dielectric films individually to perform the band pass filter of Red, Green, Blue wavelength as color filters. FIG. 26 shows the first dam array could be formed on top of the second BM array. The first dam array is a matrix array and could be formed by electro plating or electro-less plating to grow thick metal layers. The thickness of the first dam array could be greater than 1 µm. In other optional, the first dam array could be formed by patterning hard and thick non-transparent photoresist. The first dam array could be provided as a frame to fill with a full spectrum color converter (white color converter).

Figure 27:
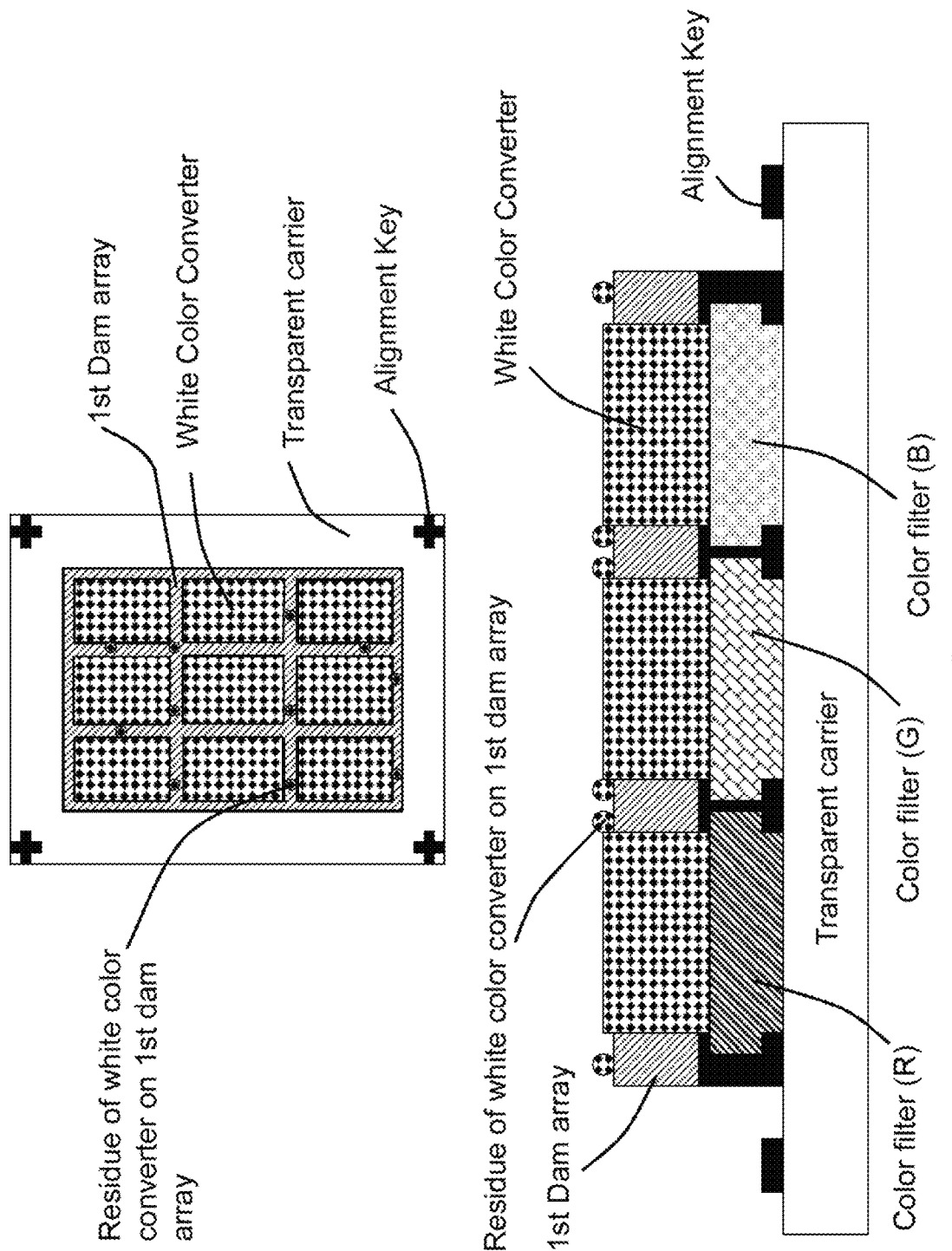
FIG. 27 is the full spectrum color conversion layer (white color converter) filling into the first dam array and forming the white color converter residue on the first dam array.

FIG. 27 shows a white color converter filling into the first dam array. The white color converter is a full spectrum color conversion layer which could convert the light to a fill color spectrum. The white color converter could be selected from color phosphors, quantum dots, or other color converter. The white color converter could be selected by mixing phosphors with photo-sensitive polymers for photolithography patterning. The photo-sensitive polymer could be photo-sensitive silicone, photo-sensitive PMMA, photo-sensitive polyimide, photo-sensitive epoxy, photo-sensitive gels, photo-sensitive glue.

The white color converter could be selected by mixing the Blue, Green, and Red phosphor together with polymer. The white color converter could be selected by mixing the Green, and Red phosphor together with polymer. The white color converter could be selected mixing the yellow phosphor and red phosphors together with polymer. The white color converter could be fabricated by size selective quantum dots (QDs) in polylaurylmethacrylate (PLMA), or PMMA. For example, the QDs can be selected to from the material such as CdSe/ZnS. For the blue emission light emitting diode, the CdSe/ZnS/CdSZnS QDs is for green color conversion, and the CdSe/CdS/ZnS/CdSZnS is for red color conversion to demonstrate the full color spectrum (white color). The fill in process of the white color converter could be fabricated by photolithography, micro screen printing, micro printing, micro jetting, micro inkjet printing, micro contacting printing, micro dispensing, nano-imprinting, self-assembly, or other lithographic and photolithographic technologies. After filling, the particles of polymer and white color converter could also be formed on the top of the first dam array. As shown in the top of FIG. 27, the top of the first dam array has random residues of white color converter particles and polymer.

Figure 28:
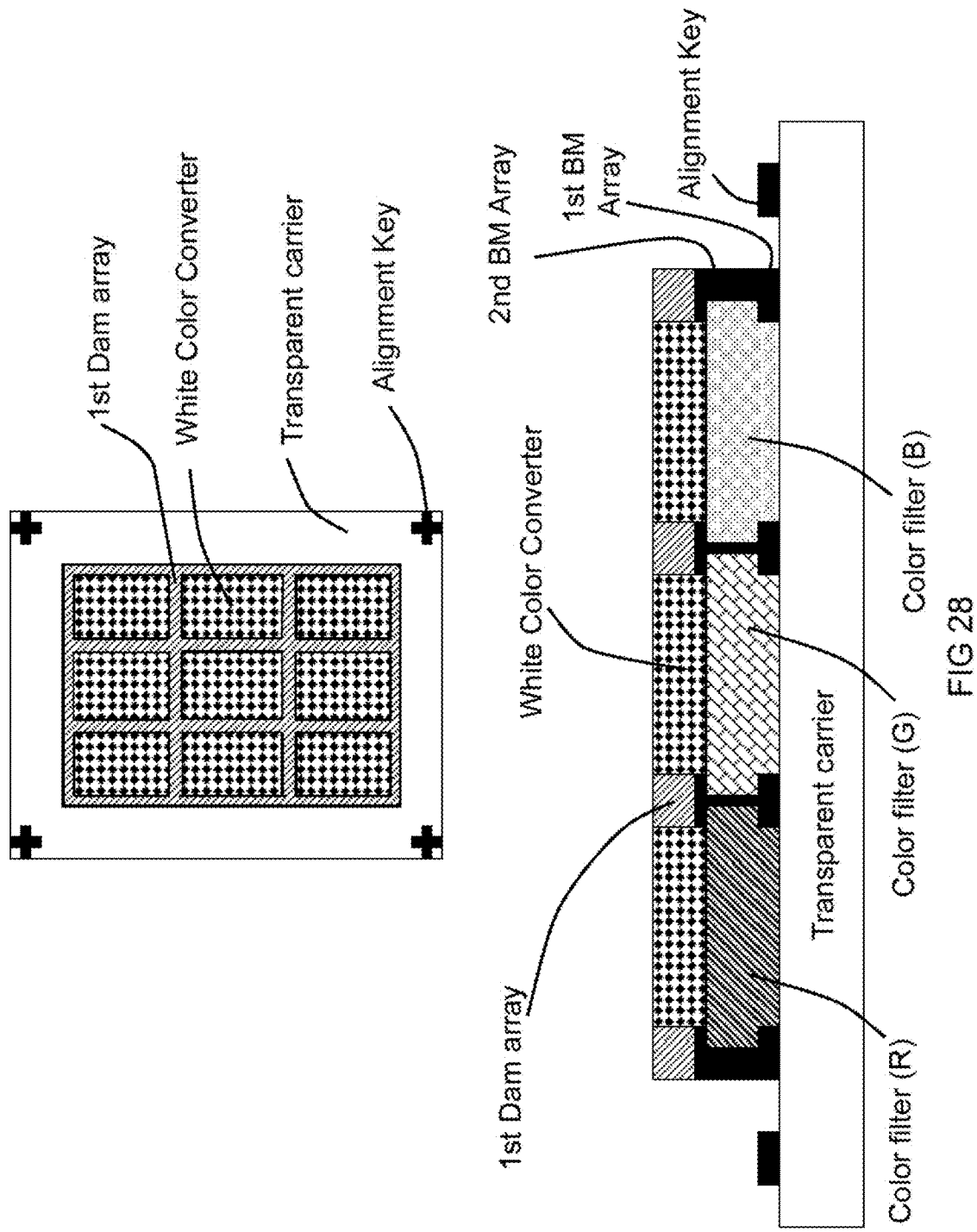
FIG. 28 is a color spectrum conversion module, showing the first dam array thickness and the white color converter thickness thinning in a same level.

In one embodiment, referring to FIG. 27, the top surface of the first dam array might not be flat. FIG. 27 shows the residues of white color converter particles, and polymer might be random formed on top of the first dam array. FIG. 28 shows the top surface of the first dam array and the residues of the white color converter on the top of the first dam array could be flatten and removed together in one step. The uneven top surface of the first dam array could be leveled by using grinding and polishing, and the residues could be removed at the same time. The uneven top surface of the first dam array could be leveled by planer, and the residues could be sheared at the same time. The thickness of the first dam array and the thickness of the fill in white color converter are thinned together in the same level. FIG. 28 is a color conversion module structure and could be applied for UV emissive semiconductor light emitting array unit module or BLUE emissive semiconductor light emitting array unit module to display full color images.

Figure 29:
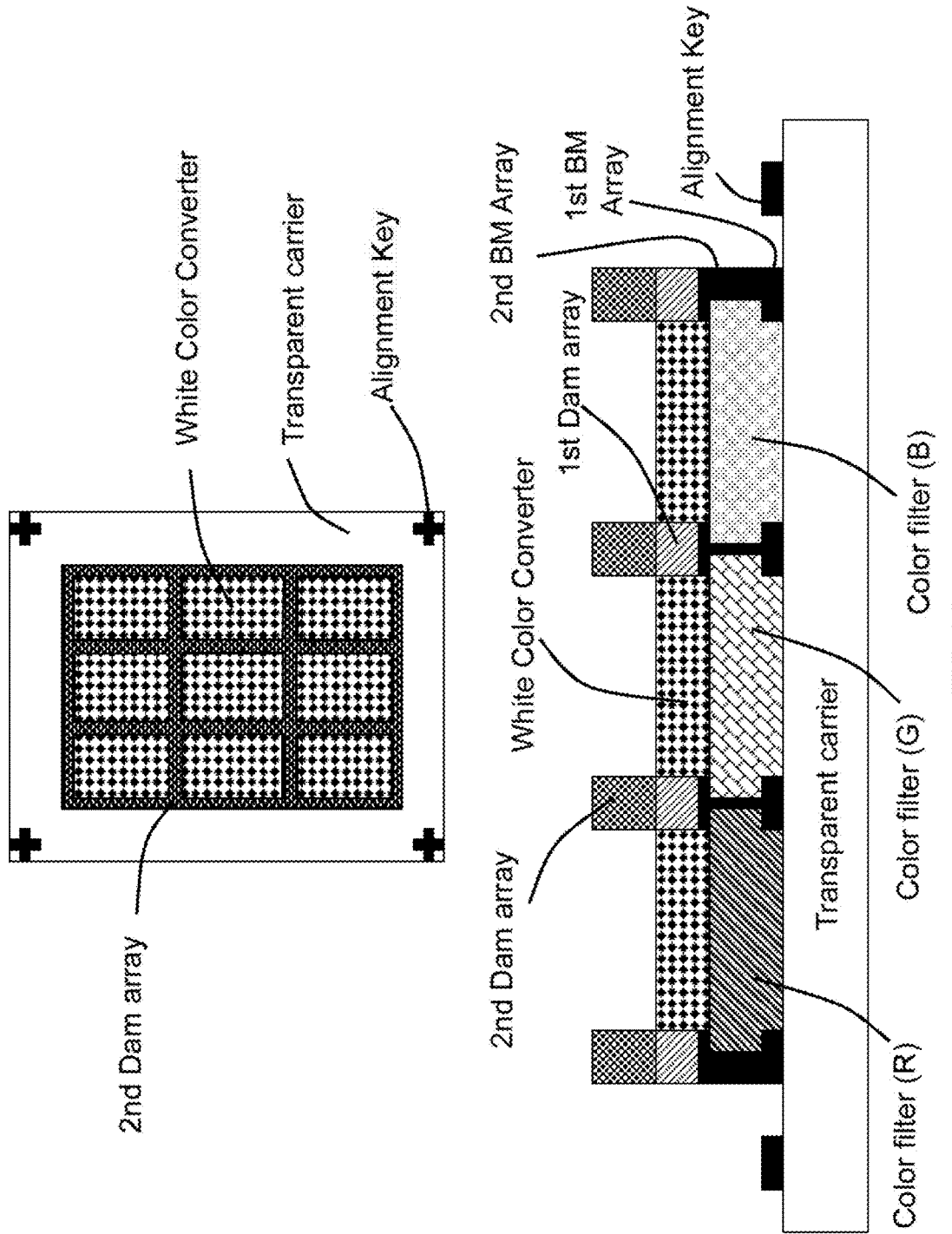
FIG. 29 is a color spectrum conversion module, showing the second dam array forming on the first dam array of FIG. 30 structure.

In another one embodiment, the second dam array could be optionally selected to form on top of the first dam array. The second dam array could be formed by electro plating or electro-less plating to grow thick metal layers. The second dam array could be purposed as a light guiding space to confine each sub-pixel emissive light propagating in a sub-pixel region for color converting. The thickness of the second dam array could be greater than 1µm. In other option, the second dam array could be formed by patterning hard and thick non-transparent photoresist. FIG. 29 shows the second dam array forming on the first dam array. FIG. 29 is a color conversion module structure and could be applied for UV emissive semiconductor light emitting array unit module or BLUE emissive semiconductor light emitting array unit module to display full color images.

Figure 30:
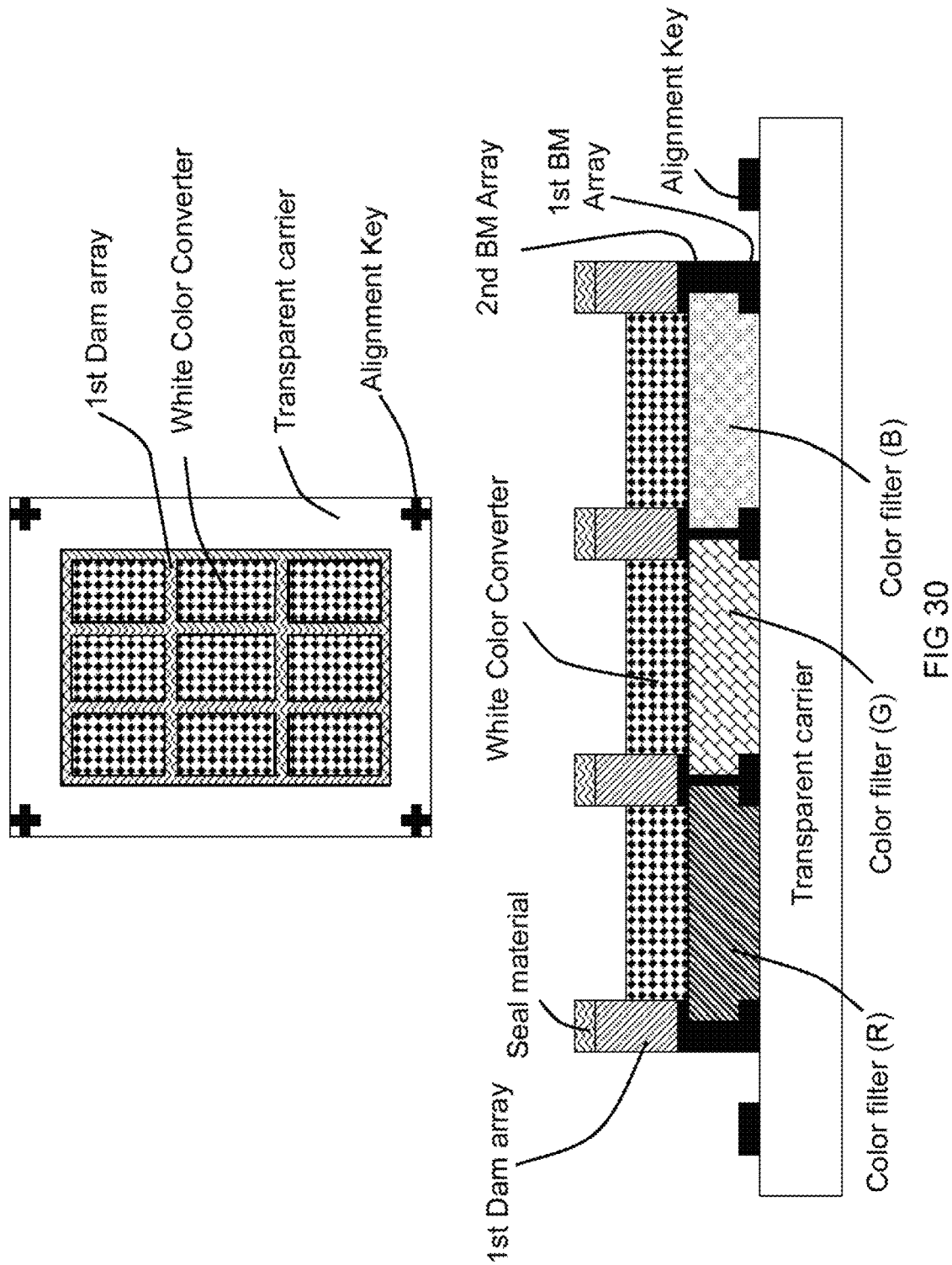
FIG. 30 is a color spectrum conversion module, showing the cross section structure after filling the white color converter into the dam showing array and a seal material forming on top of the dam array.

In another one embodiment, an additional seal material could be optionally selected to pattern and form on a top of dam array. The seal material could be selected to provide a buffer layer to align and seal the double dam array. FIG. 30 shows a seal material is formed on top of the dam array in FIG. 29 structure. FIG. 30 is a color spectrum conversion module structure and could be applied for UV emissive semiconductor light emitting array unit module or BLUE emissive semiconductor light emitting array unit module to display full color images.

The seal material could be selected from patterning the dyeing photosensitive polymer such as photo-sensitive silicone, photo-sensitive PMMA, photo-sensitive polyimide, photo-sensitive epoxy, photo-sensitive gels, photo-sensitive glue. The seal material could be selected from soft metal layers such as Cu, Au, Pb, Sn, In, Al, or its alloyed. The soft metal could be as a buffer layer to provide sealing purpose or for dam array bonding. In some particular bonding purpose, low melting temperature (less than 300 degree C) metal such as In (Indium) and its alloy. Sn (Tin) and its alloy could be selected to bonding with another dam array at certain melting temperature in process.

In another embodiment, now referring to FIG. 26, the color filter position could be replaced to be a wavelength conversion layer. The wavelength conversion layer could be patterned and forming on a transparent carrier. The original light wavelength of sub-pixel light engine array unit could be direct converted into different light wavelength after passing through the wavelength conversion layer. The wavelength conversion layer could be formed by mixing the color converters with polymers. The color converter could be selected from phosphors, quantum dots, or other color converting material. The wavelength conversion layer could be patterned by mixing the color converter into photo-sensitive polymers for photolithography. The photo-sensitive polymer could be photo-sensitive silicone, photo-sensitive PMMA, photo-sensitive polyimide, photo-sensitive epoxy, photo-sensitive gels, photo-sensitive glue, photo-sensitive color filter.

Figure 32:
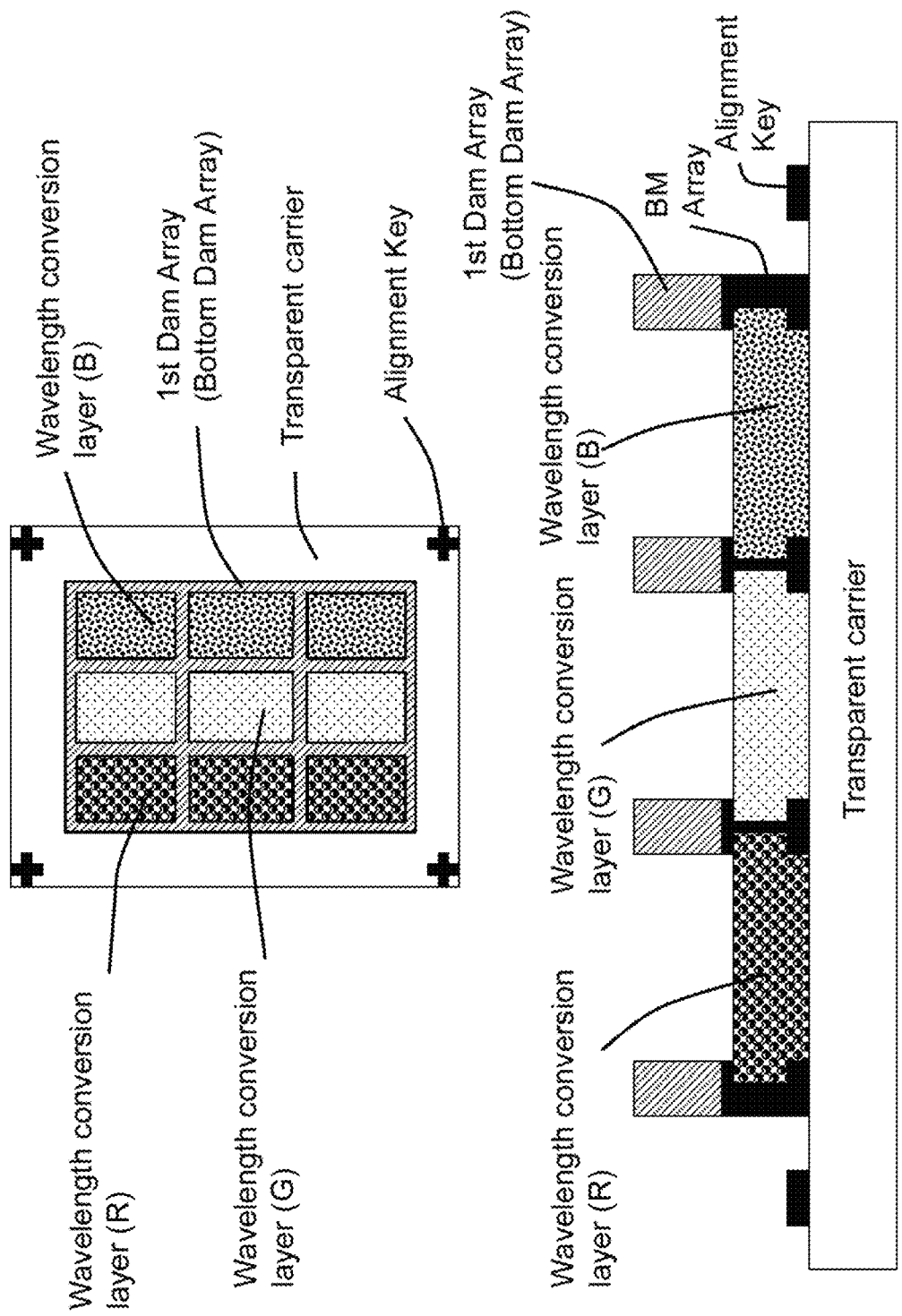
FIG. 32 is the black matrix array and the red (R) wavelength conversion layer, green (G) wavelength conversion layer, blue (B) wavelength conversion layer, patterning proportionally forming on the transparent carrier.

For the case of the UV emission light of the semiconductor light emitting array unit module, the wavelength conversion layer could be selected by mixing the blue wavelength converter with polymer and then patterning on specific column to perform blue light sub-pixel column. The wavelength conversion layer could be selected by mixing the green wavelength converter with polymer and then patterning on specific column to perform green light sub-pixel column. The wavelength conversion layer could be selected by mixing the red wavelength converter with polymer and then patterning on specific column to perform red light sub-pixel column. FIG. 32 shows the red (R) wavelength conversion layer, green (G) wavelength conversion layer, and blue (B) wavelength conversion layer could be proportionally patterned forming on the transparent carrier and on the first BM array. Each primitive color of red, blue, green could be formed individually in each sub-pixel. An additional second BM array could be patterned and aligned with the first BM array to form a BM array. In addition, the first dam array could be formed on top of the BM array. The BM array could also be patterned by patterning the black non-transparent color photoresist. The wavelength conversion layer structure could be enhanced by the BM array. The BM array could be formed as a clip structure to connect the edge of each color conversion layer. The wavelength conversion layer structure could be enhanced by the BM array. The BM array could be performed as a sub-pixel light stop matrix array to protect the sub-pixel light not penetrating into the neighbor sub-pixels. Please note that FIG. 32 is a color conversion module structure and could be only applied for UV emissive semiconductor light emitting array unit module to display full color images.

To convert the UV emission semiconductor light emitting array unit module for full color application, the color wavelength converter could be a color phosphor. The color phosphor could be selected to be sub-micro size mixing with polymer for better color uniformity. The color phosphor for example could be selected from the material such as $Ca_2PO_4Cl:Et^{2+}$, $RbBaPO^4:Eu^{2+}$ (RBP) phosphor for blue color conversion. The color phosphor for example could be selected from the material such as $(Ca, Sr, Ba,)_2(Mg, Zu)Si_2O_7:Eu$, $(Ba,Sr)_2SiO_4:Eu^{2+}$ phosphor for green color conversion. The color phosphor for example could be selected from the material such as $Sr_2Si_5N_8$, $CaAlSiN_3:Eu$ phosphor for red color conversion. The red (R) phosphor, green (G) phosphor, blue (B) phosphor could be proportionally patterning on the transparent carrier and on the first BM array to perform each primitive color in each sub-pixel.

Figure 33:
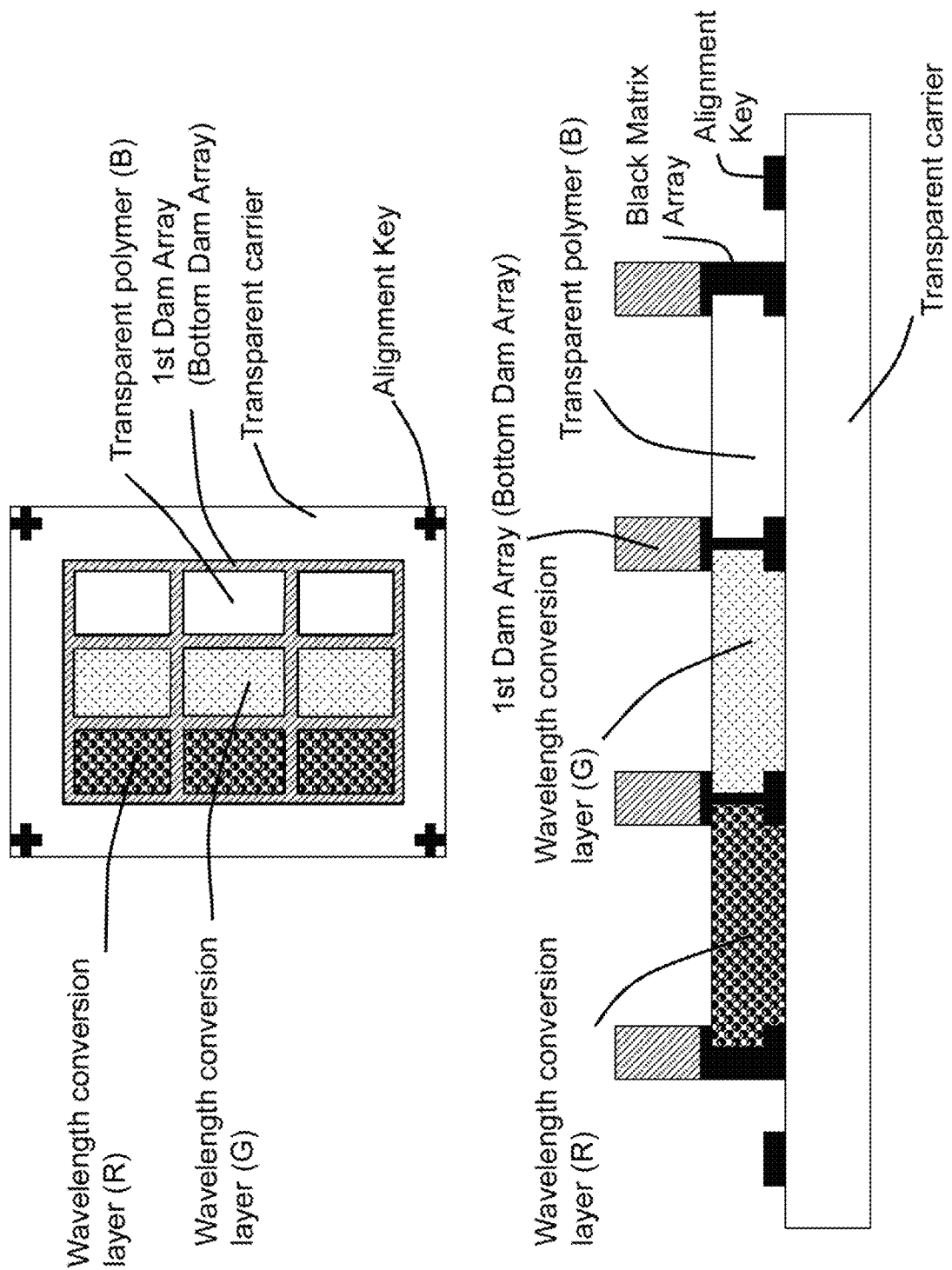
FIG. 33 is the black matrix array and the red (R) wavelength conversion layer, and green (G) wavelength conversion layer, the transparent polymer layer, patterning proportionally forming on the transparent carrier and on the first black matrix.

To convert the UV emission semiconductor light emitting array unit module for full color application, the color wavelength converter could be a quantum dots (QDs). The color converter could be fabricated by size selective quantum dots (QDs) in polylaurylmethacrylate (PLMA). The QDs can be selected from the material such as $Zn_xCd_{1-x}S_{1-y}Se_y/ZnS$ QDs for blue color conversion, CdSe/ZnS/CdSZnS QDs for green color conversion, CdSe/CdS/ZnS/CdSZnS for red color conversion. The red (R) QDs, green (G) QDs, blue (B) QDs could be proportionally patterning on the transparent carrier and on the first BM array to perform each primitive color in each sub-pixel. For the case of the BLUE emission light of the semiconductor light emitting array unit module, the wavelength conversion layer could be selected to mix the green wavelength converter with polymer and then patterning on specific column to perform green light sub-pixel column. The wavelength conversion layer could be selected to mix the red wavelength converter with polymer and then patterning on specific column to perform red light sub-pixel column. Due to the sub-pixel light engine is blue emissive color; the blue light sub-pixel column could be directly obtained without patterning any wavelength conversion layer. After forming the red wavelength conversion layer, and the green wavelength conversion layer, the blue sub-pixel column could be formed as gap columns. The gap columns might cause the complicated issue for further process steps. An additional transparent polymer layer could be selected to form on the specific blue light sub-pixel column to simplify the further process steps. FIG. 33 shows the red (R) wavelength conversion layer, green (G) wavelength conversion layer could be proportionally patterned forming on the transparent carrier. Additional transparent polymer layer could be proportionally coating on blue sub-pixel column on the transparent carrier and on the first BM array. In another option, the transparent particles could be selected to mix into the transparent polymer to enhance the transparent polymer structure stability. The transparent polymer layer could be more robust after curing. Each primitive color of red, blue, green could be formed individually in each sub-pixel column. An additional second BM array could be patterned and aligned with the first BM array to form a BM array. In addition, the first dam array could be formed on top of the BM array. The BM array could be patterned and deposited by metallization layers. The BM array could also be patterned by patterning the black color non-transparent photoresist. The wavelength conversion layer structure could be enhanced after forming the BM array. The BM array could be formed as a clip structure to connect the edge of each color conversion layer. The BM array could also be function as an adhesive promotion layer for the first dam array patterning in further process step. The BM array could be performed as a sub-pixel light stop matrix array to protect the sub-pixel light not penetrating into the neighbor sub-pixels. Please note that FIG. 33 is a color spectrum conversion module structure and could be only applied for BLUE emissive semiconductor light emitting array unit to display full color images.

To convert the BLUE emission semiconductor light emitting array unit module for full color application, the wavelength conversion layer could be a color phosphor. The color phosphor could be selected to be sub-micro size mixing with polymer for better color uniformity. The color phosphor for example could be selected from the material such as $(Sr, Ga, Ba)S:Eu$, $SrSiON:Eu$ phosphor for green color conversion. The color phosphor for example could be selected from the material such as $(SrCa)AlSiN_3:Eu$, $(Ca, Sr, Ba)S:Eu$ phosphor for red color conversion. The red (R) phosphor, and green (G) phosphor, as wavelength conversion layers could be proportionally patterned forming on the transparent carrier and on the first BM array.

To convert the BLUE emission semiconductor light emitting array unit module for full color application, the wavelength converter could be fabricated by size selective quantum dots (QDs) in polylauylmethacrylate (PLMA). The QDs can be selected from the material such as CdSe/ZnS/CdSZnS QDs for green color conversion. CdSe/CdS/ZnS/CdSZnS for red color conversion. The red (R) QDs, and green (G) QDs, as wavelength conversion layers could be proportionally patterned forming on the transparent carrier and on the first BM array.

Full Color Display

Figure 34:
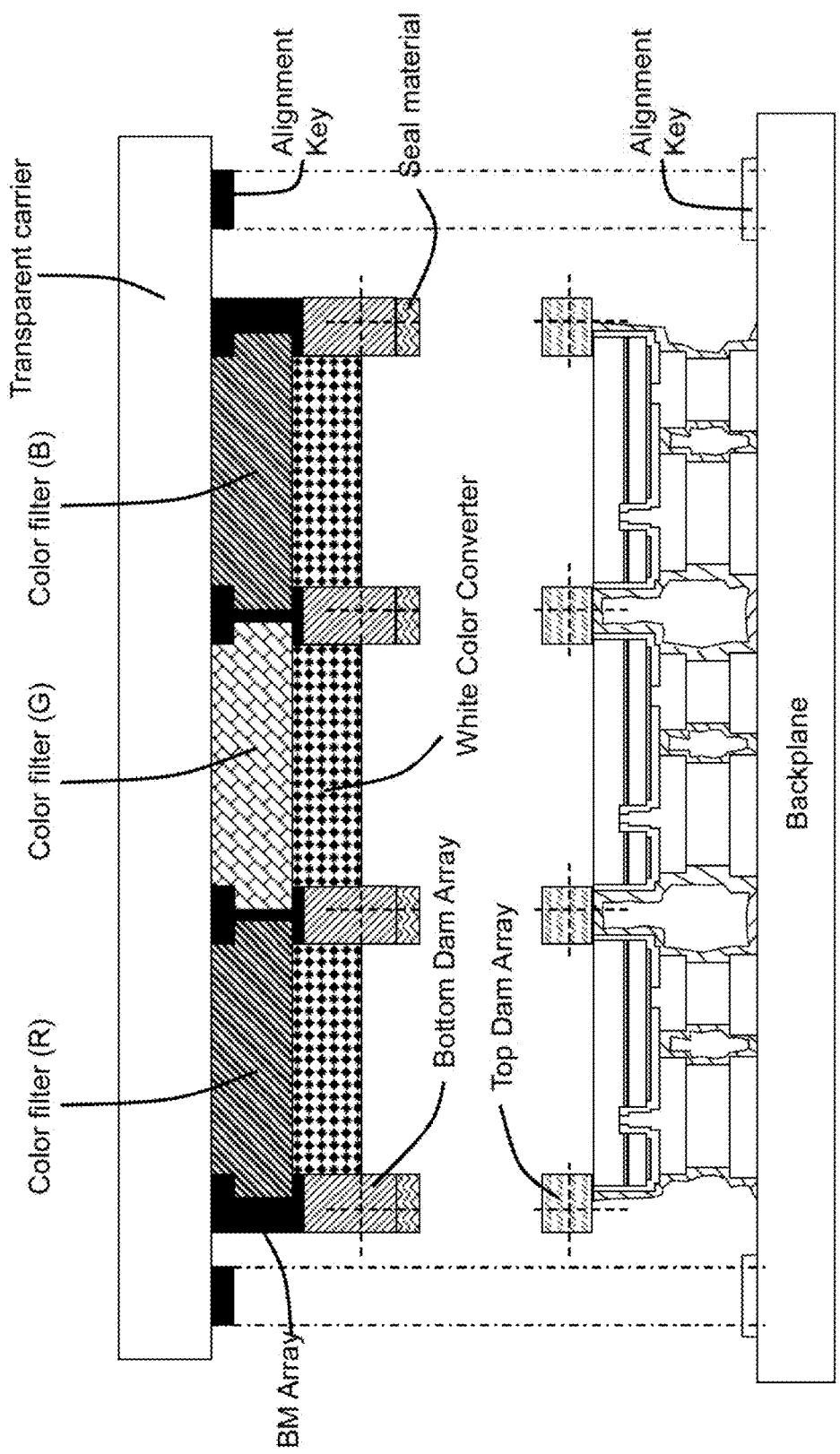
FIG. 34 is alignment process, showing the top alignment-key (of color spectrum conversion module) aligning with the bottom alignment-key (of the light engine array).

The color spectrum conversion modules could be selected to connect with the semiconductor light emitting array unit module. Now referring to FIG. 2, the semiconductor light emitting array unit (light engine array) module, for double dam array alignment purpose, FIG. 34 shows that the alignment-key of the color spectrum conversion module could be aligned with the alignment keys of the semiconductor light emitting array unit module. In some particular cases, without using the corner alignment-keys, the alignment could also be finished by double side CCD cameras to capture top side images, and bottom side images. The bottom dam array (first bottom dam array) images of the color spectrum conversion module could be captured by top side CCD camera. The top dam array (second top dam array) images of the semiconductor light emitting array unit module could be captured by bottom side CCD camera. These two images could be sync transfer into the software to recognize the patterns and assign action to finish the alignment purpose. For example, FIG. 34 shows the bottom dam array of the color spectrum conversion module (as the structure of FIG. 30) could be aligned and mounted to the top dam array of the semiconductor light emitting array unit module (as the structure of FIG. 2).

Figure 35:
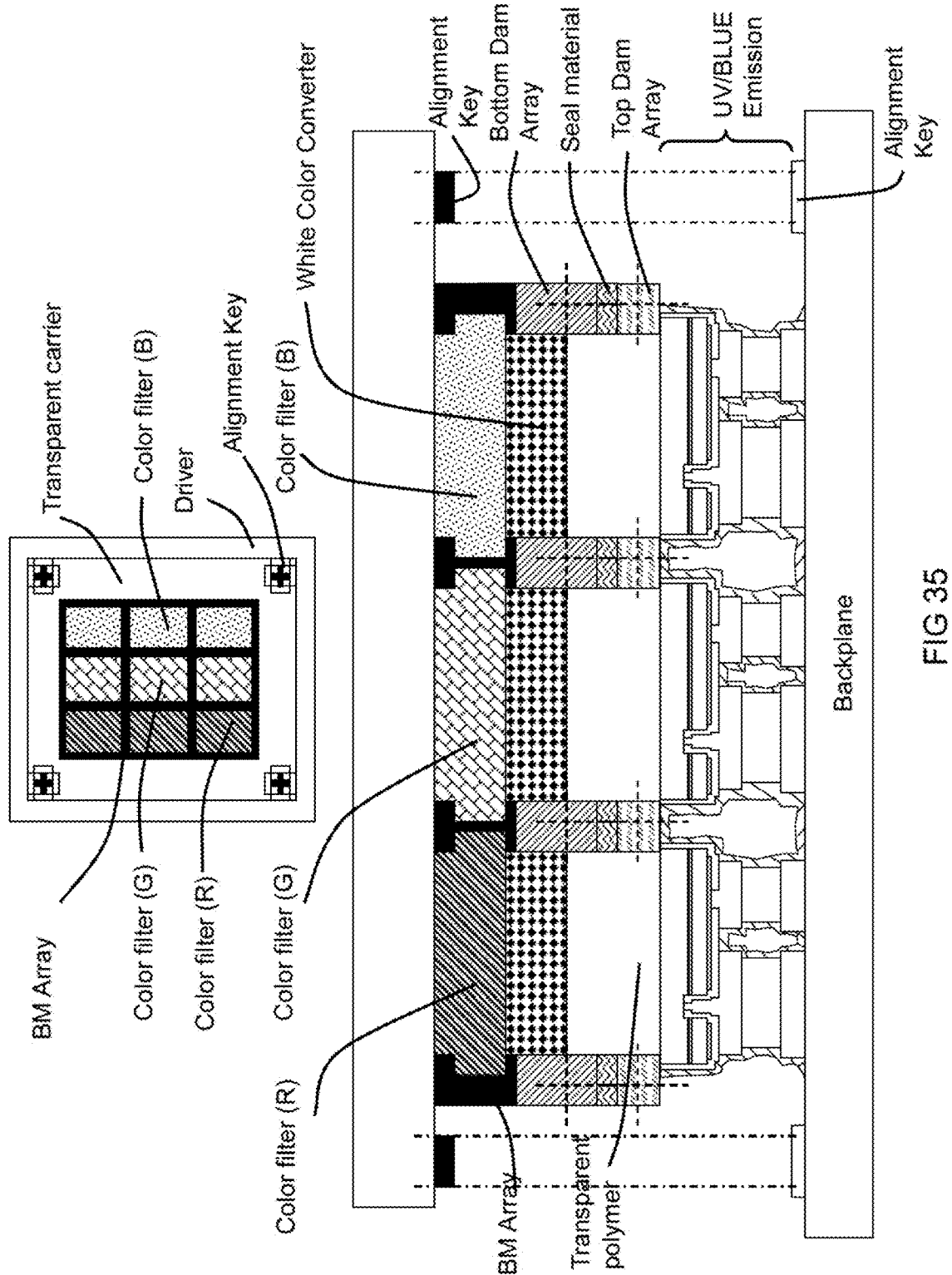
FIG. 35 is an example of a full color display module, showing the light engine array as sub-pixel light engine array forming the emissive light spectrum converting to target light spectrum.

FIG. 35 gives an example of structure to perform a full color display by using the semiconductor light emitting array unit as sub-pixel light engine array unit. The bottom dam array of the color spectrum conversion module could be alignment connected together with the top dam array of the semiconductor light emitting array unit module by using a transparent polymer. The transparent polymers could be UV cure or thermal cure material such as silicones, epoxy, Acrylic, PMMA. To prevent the bubbles might be potential formed during the curing polymer processing; a bubble-removing method or other compressive adhesive methods could be performed. The region between the semiconductor light emitting array unit and the white color converter could be filled with transparent polymer, or could be forming a transparent polymer with air gap.

In some particular case, the seal material could be low melting temperature metal layers. The bottom dam array of the color spectrum conversion module could be alignment and heating bonded together with the top dam array of the semiconductor light emitting array unit module.

Figure 31:
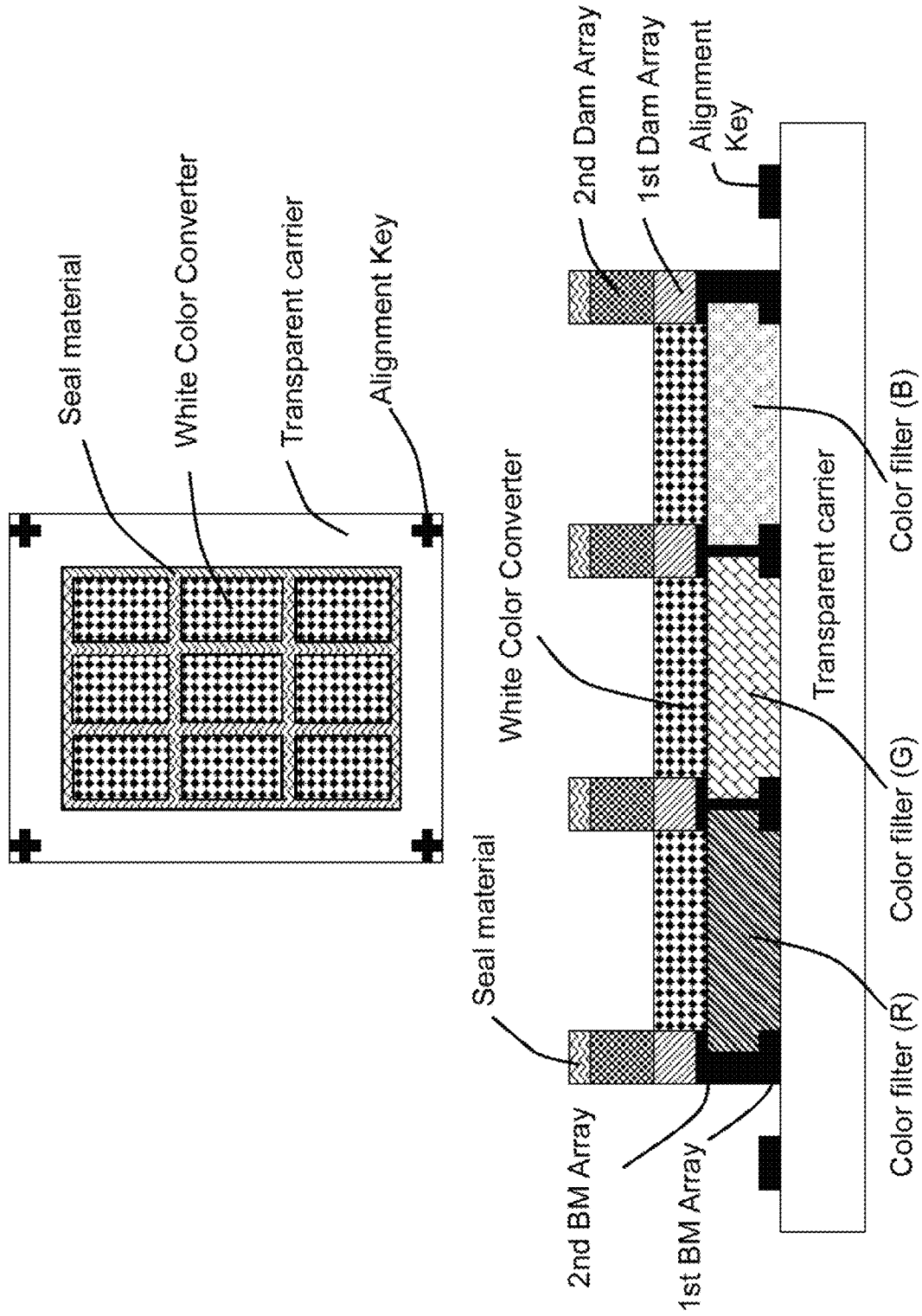
FIG. 31 is a color spectrum conversion module, showing a seal material forming on top of the second dam array in FIG. 31 structure.

To display the full color images, please note that the color spectrum conversion module could be selected from one embodiment structures as described above. These embodiment structures includes FIG. 28 structure, FIG. 29 structure, FIG. 30 structure, FIG. 31 structure, FIG. 32 structure, FIG. 33 structure. Please note that one of the FIG. 28 structure, the FIG. 29 structure, the FIG. 30 structure, the FIG. 31 structure could be applied to connect with both of the UV emissive or BLUE emissive semiconductor light emitting array unit module. The self-emissive light from the semiconductor light emitting array unit could be guided in the double dam array channel, the white color converter in the double dam array channel could be excited by short wavelength spectrum (UV or blue) emitting light. In the double dam array channel, the emissive light could be converted into a full color wavelength spectrum light. In the double dam array channel, the full color wavelength spectrum light could be selected and filtered by the color filter to emit the target color wavelength spectrum. Each double dam array channel is only for each sub-pixel light engine to guide the light. Thus, each sub-pixel could perform each target color wavelength spectrum individually.

Figure 36:
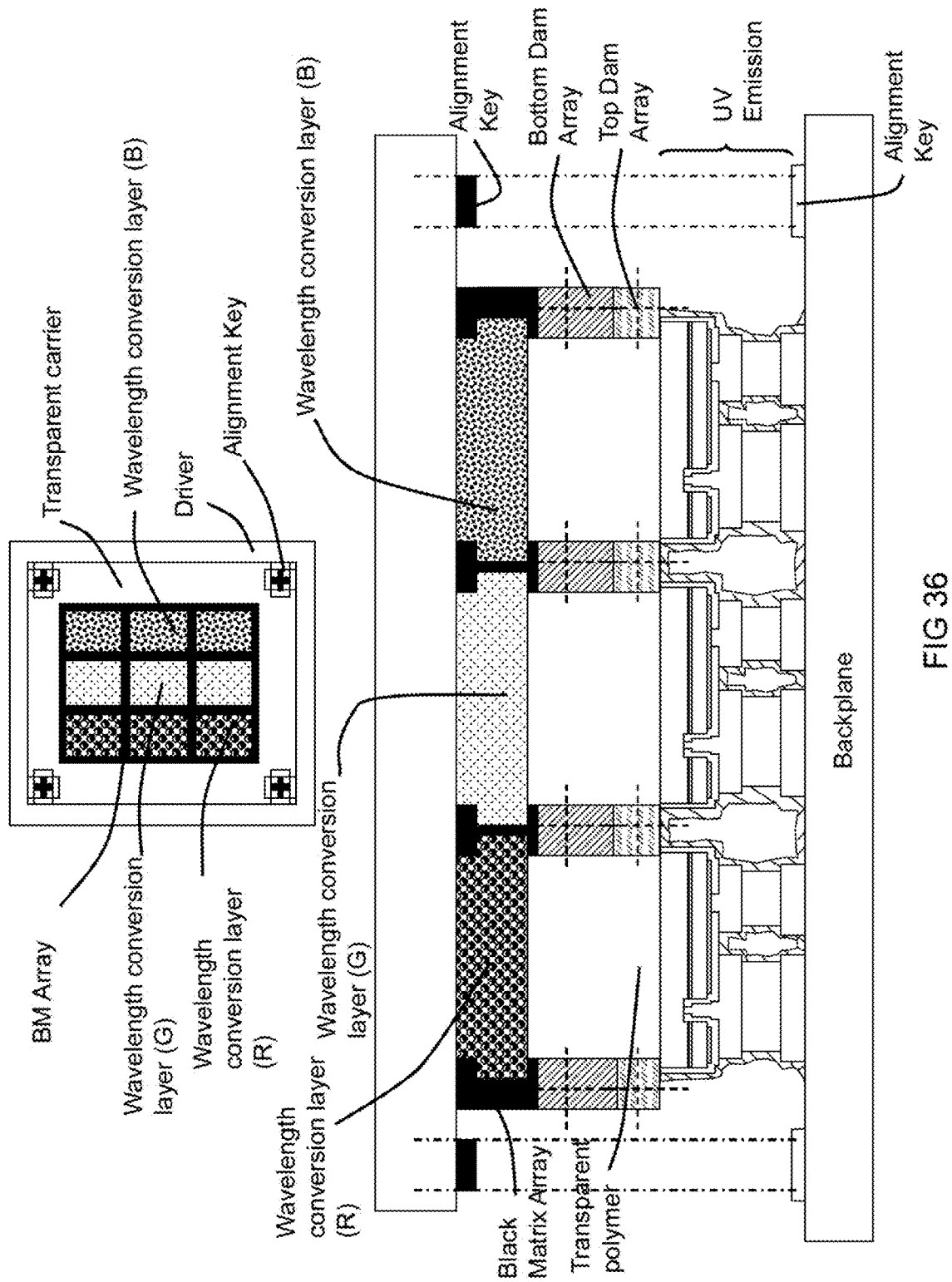
FIG. 36 is another example of a full color display module, showing the UV emissive light engine array as sub-pixels light engine array in connecting with the color spectrum conversion module of FIG. 32.

Please note that FIG. 32 structure could only be applied to connect with UV emissive semiconductor light emitting array unit module. FIG. 36 illustrates another example of structure to perform a full color display by using the UV emissive semiconductor light emitting array unit as sub-pixel light engine array. The color spectrum conversion module is FIG. 32 structure. The bottom dam array of the color spectrum conversion module could be alignment connected together with the top dam array of the semiconductor light emitting array unit module by using a transparent polymer.

The self-emissive light from the semiconductor light emitting array unit could be guided in the double dam array channel. The blue wavelength conversion layer in the double dam array channel could be excited by short wavelength spectrum UV emitting light and converting to blue wavelength spectrum. The green wavelength conversion layer in the double dam array channel could be excited by short wavelength spectrum UV emitting light and converting to emit green wavelength spectrum. The red wavelength conversion layer in the double dam array channel could be excited by short wavelength spectrum UV emitting light and converting to emit red wavelength spectrum. The region between the semiconductor light emitting array unit and the wavelength conversion layer could be filled with transparent polymer, or could be forming a transparent polymer with air gap. Each double dam array channel is only for each sub-pixel light engine to guide the light. Thus, each sub-pixel could perform each target color wavelength spectrum individually.

Figure 37:
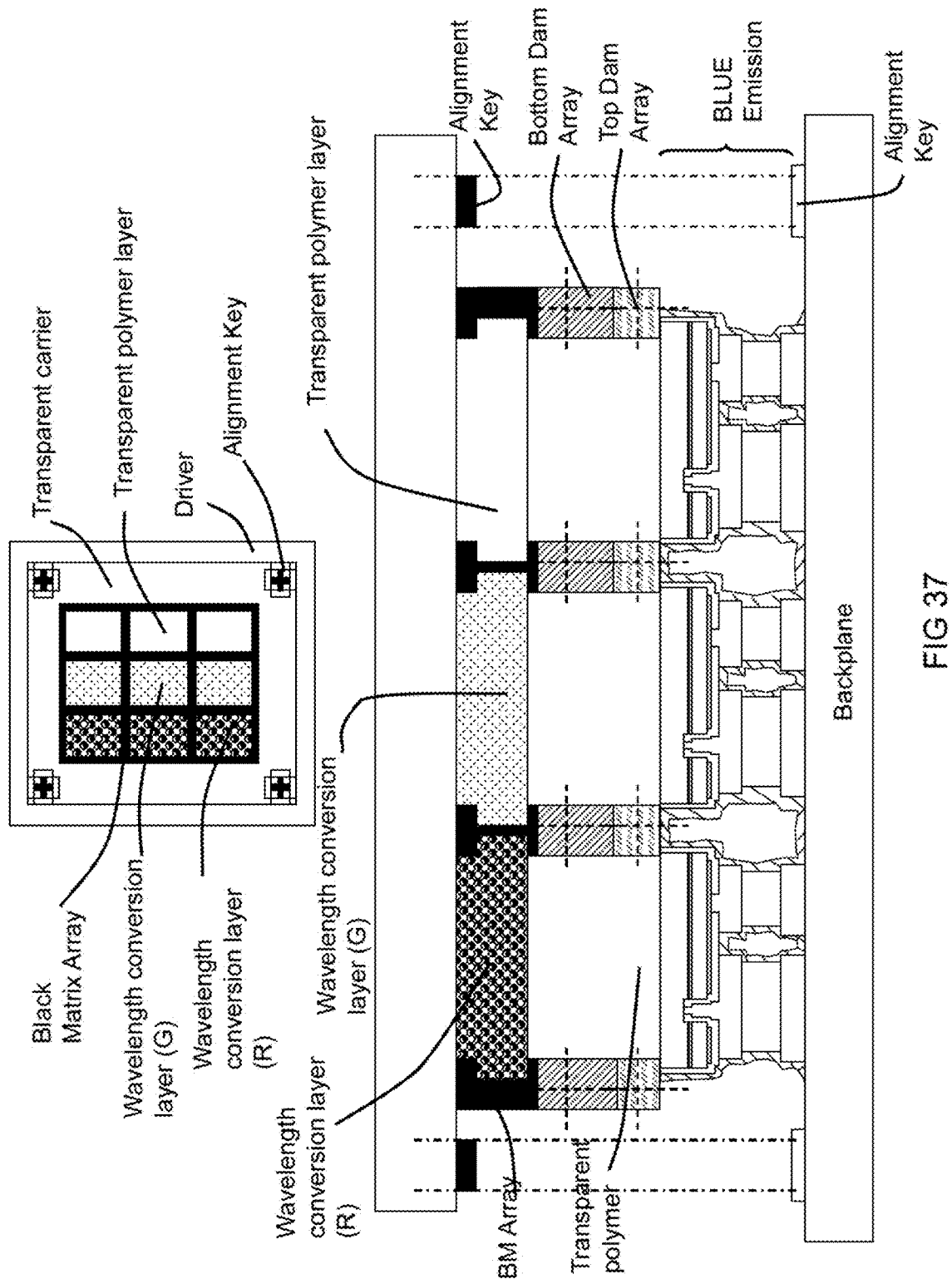
FIG. 37 is another example of a full color display module, showing the BLUE emissive light engine array as sub-pixels light engine array in connecting with the color spectrum conversion module of FIG. 33.

Please note that FIG. 33 structure could only be applied to connect with BLUE emissive semiconductor light emitting array unit module. FIG. 37 illustrates another example of structure to perform a full color display by using the BLUE emissive semiconductor light emitting array unit as sub-pixel light engine array. The color spectrum conversion module is FIG. 38 structure. The bottom dam array of the color spectrum conversion module could be alignment connected together with the top dam array of the semiconductor light emitting array unit module by using a transparent polymer.

The sub-pixel BLUE emissive light could be guided in the double dam array channel. In the double dam array channel, the green wavelength conversion layer in the double dam array channel could be excited by short wavelength spectrum BLUE emitting light and converting to emit green wavelength spectrum. The red wavelength conversion layer in the double dam array channel could be excited by short wavelength spectrum BLUE emitting light and converting to emit red wavelength spectrum. The blue emissive sub-pixel light could be direct guided through the double dam array channel and then emitting the blue light. The region between the semiconductor light emitting array unit and the wavelength conversion layer could be filled with transparent polymer, or could be forming a transparent polymer with air gap. Each double dam array channel is only for each sub-pixel light engine to guide the light. Thus, each sub-pixel could perform each target color wavelength spectrum individually.

Figure 38:
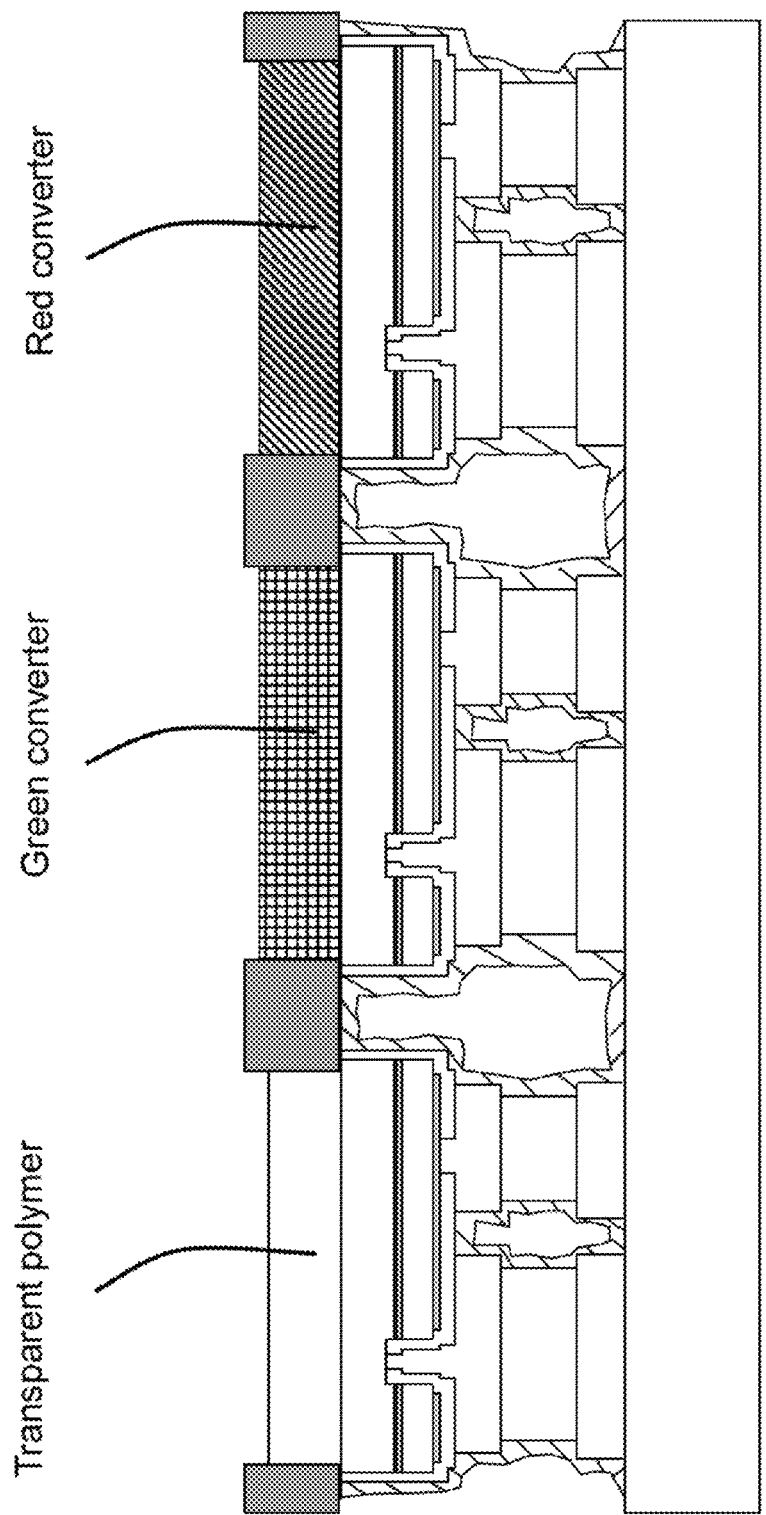
FIG. 38 is the color converters forming inside the dam array unit in the case of blue emission semiconductor light emitting array unit.

FIG. 38 shows a various color spectrum converter (wavelength conversion) layers could be formed inside the dam directly on top of the FIG. 2 structure. A green converter could be proportion patterning inside the dam on top of the blue semiconductor light emitting array unit, and a red converter could be proportion patterning inside the dam on top of the blue semiconductor light emitting array unit. Due to the light source is emitted at blue spectrum, the color of the blue sub-pixel units could be direct obtained from the blue semiconductor light emitting unit. Transparent materials such as dielectric layers or polymer layers could be proportion patterning, filling, dispensing inside the dam on top of the blue semiconductor light emitting array units. For the blue sub-pixel units, the transparent polymer filling in is purposed to keep the color converting layers has similar level to simplify the further fabricating process.

Optionally, the transparent patterning polymer could be mixed with micron or submicron transparent insulators, such as $TiO_2$, $Al_2O_3$, $SiO_2$, sol-gel to enhance the structure of polymers. Another option is no additional material on top of the blue-sub-pixel. The patterning of the color converters could be formed by mixing phosphors or QDs with photo-sensitive polymers for photolithography selective patterning. The photo-sensitive polymer could be photo-sensitive silicone, photo-sensitive PMMA, photo-sensitive epoxy, photo-sensitive gels, photo-sensitive color filters, gules. The patterning of the color converters (R, and G) could be fabricated by photolithography, micro screen printing, micro jetting, micro inkjet printing, micro dispensing, self-assembly technologies. For the blue sub-pixel, the patterning of transparent polymers could be selected from photolithography, micro jetting, micro dispensing, and micro printing. In some particular case, between the color converters, a BM could be fabricated before or after the color converter made. The BM could be patterned through black dyeing photoresist, or could be patterned by metal deposition.

In some particular application of curved and flexible display, the mixing material with phosphors or QDs of color converters could be optionally selected by using polymers with stretch and extending properties such as silicone gel cohesive gels, epoxy, silicone, PMMA.

Figure 39:
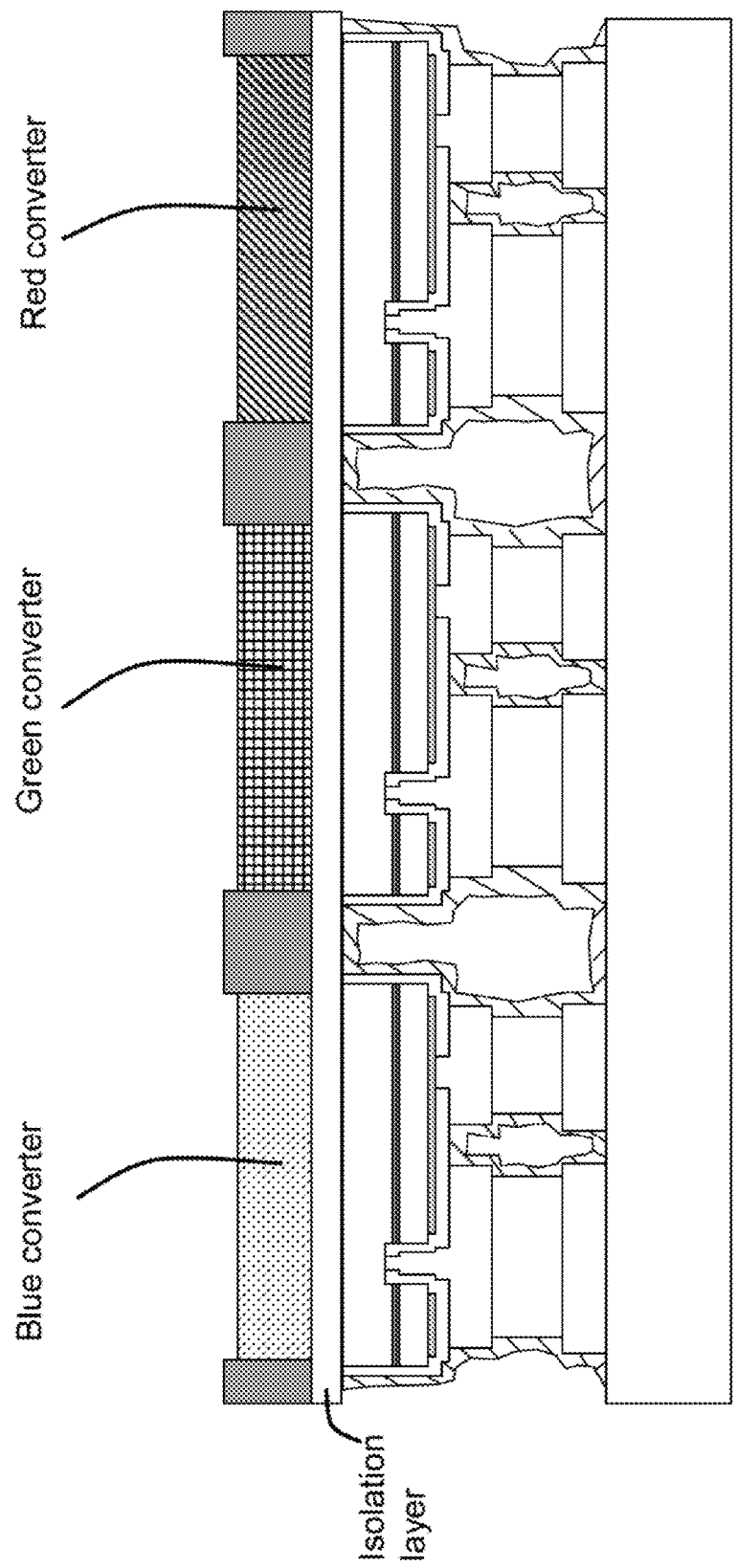
FIG. 39 is the color converters forming inside the dam array unit in the case of UV emission semiconductor light emitting array unit.

FIG. 39 illustrates the color converters could be formed inside the dam array unit in the case of UV emission semiconductor light emitting array unit.

A single group (main) pixel contains the R sub-pixel, the G sub-pixel, and the B sub-pixel to provide a full color group pixel. For other embodiments, the single group pixel could be divided into RGGB, or RGBW sub-pixels (W is the white color) to obtain high saturated color performance or save the power consumption.

Figure 40:
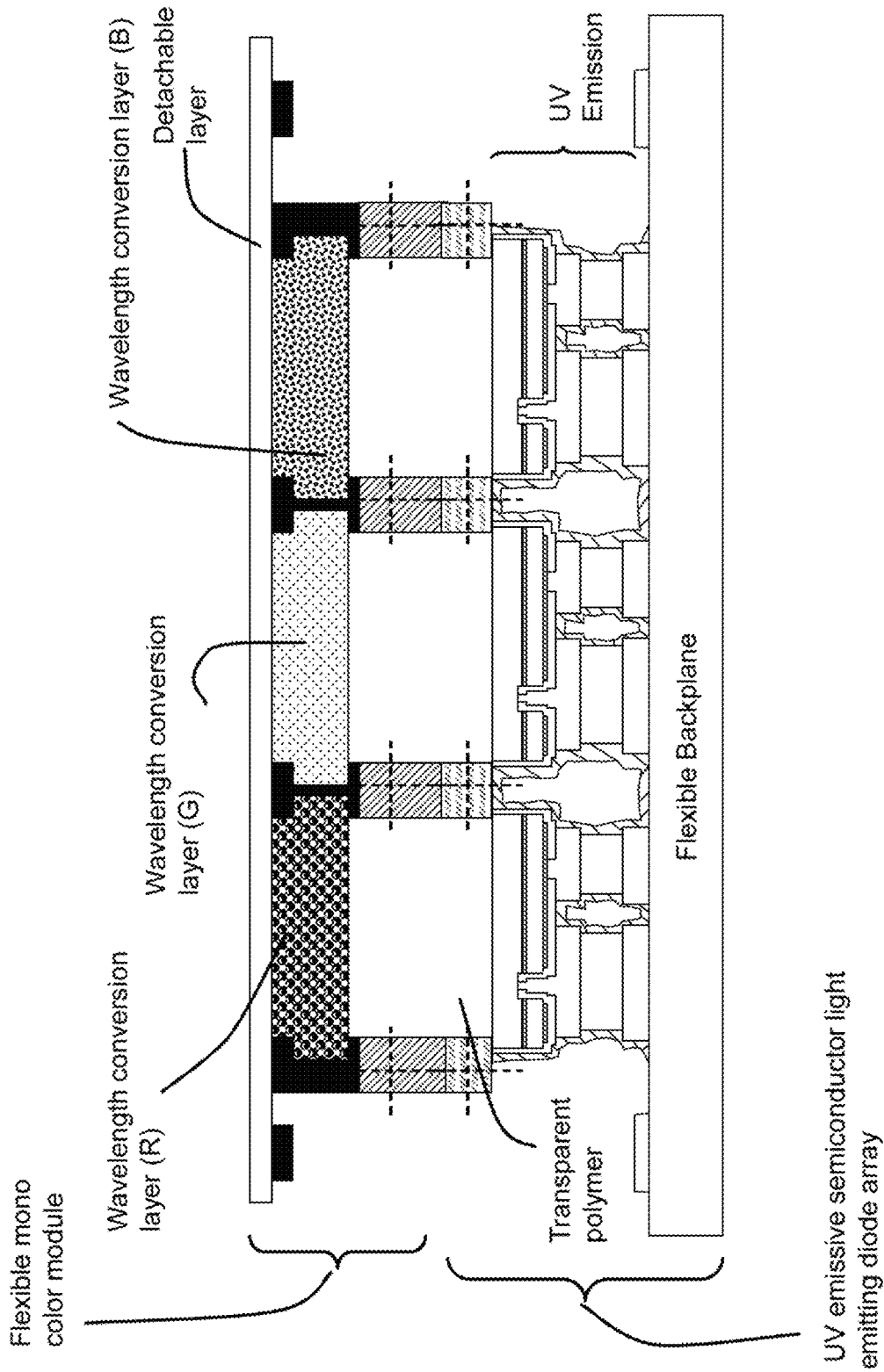
FIG. 40 is an example of flexible full color display module by selecting a UV spectrum emissive semiconductor light emitting diode array module.

In another one embodiment, the transparent carrier of the color conversion module could be formed by a detachable flexible transparent material first. For the flexible full color display purpose, the transparent carrier could be removed after aligning and connecting the color conversion module to the semiconductor light emitting array unit module. Please note that the backplane of driver in this embodiment is flexible. FIG. 40 shows an example of the flexible full color display module by selecting a UV spectrum emissive semiconductor light emitting diode array module. The flexible color conversion module as shown in FIG. 40 is after removing the hard transparent carrier. The bottom dam array of the detachable flexible color conversion module could be aligned and connected together with the top dam array of the semiconductor light emitting diode array module by using a transparent polymer.

The self-emissive UV light from the semiconductor light emitting array unit could be guided in the double dam array channel. The blue wavelength conversion layer in the double dam array channel could be excited by the UV spectrum emitting light to emit blue wavelength spectrum. The green wavelength conversion layer in the double dam array channel could be excited by the UV spectrum emitting light to emit green wavelength spectrum. The red wavelength conversion layer in the double dam array channel could be excited by the UV spectrum emitting light to emit red wavelength spectrum. The region between the semiconductor light emitting diode array and the wavelength conversion layer could be filled with transparent polymer, or could be forming a transparent polymer with air gap. Each double dam array channel is only for each sub-pixel light engine to guide the light. Thus, each sub-pixel could perform each target color wavelength spectrum individually.

In another embodiment, (not shown in here), additional submicron lens could be fabricated on top of the full color display modules. The submicron lens could be also fabricated on top of the full color display module after removing the transparent carrier. The submicron lens could be fabricated to one group of sub-pixels or multiple groups of full color pixels. The submicron lens could be simulated designing to fabricate the Integral 3D Image displays [3] due to the semiconductor light emitting array unit has a very fast nano second (ten to the minus nine second) response time. Normally, for 3D display, the major consideration is four optimized domains including 2D plane (X-axis, Y-axis), Distance (Z-axis), and time (T-axis). Due to a very fast response time of semiconductor light emitting diode, the operation frequency of display could be much faster to enhance a lot of room for the dimension of distance (Z-axis) of display for obtaining the reality 3D images. In addition, due to the fast scanning frequency performance, another option is to synchronal two separated small display in front of the eyes to perform the 3D displays such as head mounted display application.

In this invention, a full color display could be formed by combining a semiconductor light emitting array unit module and a color conversion module. The full color display component could be applied for the panel display, micro display, micro projection displays, wearable displays, head up displays, head mounted display, curved, and flexible displays by using optical design lens.

Thus the disclosure describes the method for fabricating a wavelength conversion layer on the color spectrum conversion modules, and a dam matrix array on different color spectrum conversion modules, and the method for fabricating the dam matrix array aligning and mounting to another dam matrix array module formed on the semiconductor light emitting array units for full color display. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:
1. A light engine array comprising:
multiple light engines arranged into an array;
multiple dams located on street regions and in contact with the light engines; and
the dams together form a dam array.
2. The light engine array according to claim 1, wherein:
each light engine comprises:
a conductive metal layer located on a same height level.
3. A light engine array comprising:
multiple light engines arranged into an array;
multiple dams located on street regions and in contact with the light engines;
the dams together form a dam array;
wherein, each light engine comprises:
a first LED unit; and
a second LED unit;
wherein, the first LED unit and the second LED unit use a same anode.
4. The light engine array according to claim 1, wherein:
the dam array is provided as a frame to fill with a color converter or a color filter.
5. The light engine array according to claim 1, wherein:
gap size of the neighboring dams is to control an aperture size of the corresponding light engine.
6. The light engine array according to claim 1, wherein:
each light engine is a self-emissive color LED.

7. The light engine array according to claim 1 further comprising:
   a bottom dam array of a color conversion module is aligned with the dam array to form a dam array channel by utilizing a seal material; and
   an original emissive color of the light engine is guided in one of the dam array channels and converted to a target light color.

8. The light engine array according to claim 7, wherein the color conversion module comprises:
   multiple color filters formed inside a black matrix array;
   a first dam array formed on the black matrix array;
   a color converter filled in the first dam array and coplanar with a first dam array; and
   a second dam array formed on the first dam array to form the bottom dam array.

9. A light engine array comprising:
   multiple light engines arranged into an array;
   multiple dams located on street regions and in contact with the light engines;
   the dams together form a dam array; and
   a street region set between neighboring light engines
   wherein each light engine comprises:
   an anode located on a backplane;
   an bonding layer located on the anode;
   a p-type layer located on the conductive metal layer;
   an active layer located on the p-type layer;
   a n-type layer located on the active layer;
   an isolation layer set on a the street region to cover on the sidewall of the p-type layer, the active layer and the n-type layer; and
   a polymer set in the street region;
   wherein, the conductive metal layer located on the bonding layer; and multiple anodes combines an anode array.

10. The light engine array according to claim 9, wherein:
    a common cathode located on one or more sides of the light engine array;
    the common cathode coupled to the light engine array; and
    the light engine array uses the same common cathode.

11. The light engine array according to claim 10, wherein:
    the light engine array uses the same n-type layer.

12. The light engine array according to claim 11, wherein:
    each dam located on the n-type layer.

13. The light engine array according to claim 10, further comprising:
    a TCL layer located on the n-type layer and the street polymer;
    wherein, each dam located on the TCL layer.

14. A light engine array comprising:
    multiple light engines arranged into an array;
    multiple dams located on street regions and in contact with the light engines;
    the dams together form a dam array; wherein,
    each light engine comprises:
    a first LED unit; and
    a second LED unit;
    wherein, the first LED unit connects the second LED unit; and
    the light engine array further comprising:
    an anode;
    a p-electrode located on the anode;
    a first p-contact located on the p-electrode and contacted the p-electrode;
    the first LED unit located on a first n-contact and the first p-contact;
    a cathode;
    a n-electrode located on the cathode;
    a second n-contact located on the n-electrode and contacted the n-electrode;
    the second LED unit located on the second n-contact and second p-contact; and
    a connecting layer connected the first n-contact and the second p-contact.

15. The light engine array according to claim 14, wherein:
    each light engine is a self-emissive color LED.

16. A light engine array comprising:
    multiple light engines arranged into an array;
    multiple dams located on street regions and in contact with the light engines;
    the dams together form a dam array; wherein,
    each light engine comprises:
    a first LED unit; and
    a second LED unit;
    wherein, the first LED unit connects the second LED unit; and
    the light engine array further comprising:
    an anode;
    a p-electrode located on the anode;
    a first p-contact located on the p-electrode and contacted the p-electrode;
    the first LED unit located on a n-contact and the first p-contact;
    a cathode;
    a n-electrode connected to the cathode and located on the second LED unit;
    the second LED unit located on the second p-contact; and
    a connecting layer connected the n-contact and the second p-contact;
    wherein, the light engine array uses the common cathode.

17. The light engine array according to claim 16, wherein:
    each light engine is a self-emissive color LED.

18. The light engine array according to claim 3, wherein:
    the first LED unit comprises:
    a first anode;
    a first p-electrode located on the first anode;
    a first p type layer located on a first p-electrode;
    a first n type layer set on the the first p type layer;
    an first active layer set between the first p type layer and the first n type layer; and
    a first n-electrode located on the first n type layer; and
    the second LED unit comprises:
    a second anode;
    a second p-electrode located on the second anode;
    a second p type layer located on a second p-electrode;
    a second n type layer set on the second p type layer;
    a second active layer set between the second p type layer and the second n type layer; and
    a second n-electrode located on the second n type layer;
    wherein, the first n-electrode and the second n-electrode connected to a common cathode.

19. The light engine array according to claim 3, wherein:
    structure of the second LED unit is mirrored to structure of the first LED unit.

20. The light engine array according to claim 3, wherein:
    each light engine is a self-emissive color LED.

21. The light engine array according to claim 3, wherein:
    the first LED unit comprises:
    a first cathode;
    a first n-electrode located on the first cathode;
    a first p-electrode located on the anode;
    a first p-type layer located on the p-electrode;
    a first n-type layer located on the first n-electrode; and a first active layer set between the first p-type layer and the first n-type layer;

the second LED unit comprises:
  a second cathode;
  a second n-electrode located on the first cathode;
  a second p-electrode located on the anode;
  a second p-type layer located on the p-electrode;
  a second n-type layer located on the first n-electrode; and
  a second active layer set between the second p-type layer and the second n-type layer;
  wherein, the first p-electrode and the second p-electrode connect to the same anode.

* * * * *